United States Patent
Ogawa et al.

(10) Patent No.: US 11,155,703 B2
(45) Date of Patent: Oct. 26, 2021

(54) CURABLE COMPOSITION, MANUFACTURING METHOD OF CURABLE COMPOSITION, CURED FILM, MANUFACTURING METHOD OF CURED FILM, COLOR FILTER, SOLID-STATE IMAGING ELEMENT, SOLID-STATE IMAGING DEVICE, AND INFRARED SENSOR

(71) Applicant: FUJIFILM Corporation, Tokyo (JP)

(72) Inventors: Michihiro Ogawa, Shizuoka (JP); Yutaro Fukami, Shizuoka (JP); Junichi Ito, Shizuoka (JP); Yushi Kaneko, Shizuoka (JP); Hiroaki Idei, Shizuoka (JP); Daisuke Hamada, Shizuoka (JP); Tatsuo Ishikawa, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 16/283,107

(22) Filed: Feb. 22, 2019

(65) Prior Publication Data

US 2019/0185656 A1    Jun. 20, 2019

Related U.S. Application Data

(63) Continuation of application No. PCT/JP2017/026746, filed on Jul. 25, 2017.

(30) Foreign Application Priority Data

Aug. 25, 2016 (JP) .............................. JP2016-164656
Jan. 18, 2017 (JP) .............................. JP2017-006665
Jul. 10, 2017 (JP) .............................. JP2017-134486

(51) Int. Cl.

| | |
|---|---|
| *C08L 33/10* | (2006.01) |
| *G03F 7/004* | (2006.01) |
| *H04N 5/225* | (2006.01) |
| *G03F 7/038* | (2006.01) |
| *H04N 5/369* | (2011.01) |
| *C08F 290/06* | (2006.01) |
| *G02B 5/20* | (2006.01) |
| *H01L 27/146* | (2006.01) |
| *H04N 9/07* | (2006.01) |
| *G03F 7/033* | (2006.01) |
| *C08K 3/013* | (2018.01) |

(Continued)

(52) U.S. Cl.
CPC ............ *C08L 33/10* (2013.01); *C08F 290/06* (2013.01); *C08J 3/28* (2013.01); *C08J 5/18* (2013.01); *C08K 3/013* (2018.01); *C08K 3/28* (2013.01); *C08L 29/12* (2013.01); *C08L 33/14* (2013.01); *C08L 33/26* (2013.01); *G02B 5/20* (2013.01); *G03F 7/004* (2013.01); *G03F 7/033* (2013.01); *G03F 7/038* (2013.01); *G03F 7/0388* (2013.01); *H01L 27/146* (2013.01); *H04N 5/225* (2013.01); *H04N 5/369* (2013.01); *H04N 9/07* (2013.01); *C08K 5/3725* (2013.01); *C08L 2203/16* (2013.01); *C08L 2203/206* (2013.01)

(58) Field of Classification Search
CPC .......... C08F 20/28; C08F 20/36; C08F 20/58; C08F 261/10; C08F 265/06; C08F 265/10; C08F 290/06; C08F 3/013; C08F 3/28; C08J 3/28; C08J 5/18; C08K 5/3725; C08L 29/12; C08L 33/10; C08L 33/14; C08L 33/26; C08L 2203/16; C08L 2203/206; G02B 5/20; G03F 7/004; G03F 7/033; G03F 7/038; G03F 7/0388; G03F 7/168; H01L 27/146; H04N 5/225; H04N 5/369; H04N 9/07
See application file for complete search history.

(56) References Cited

U.S. PATENT DOCUMENTS

| | | | | |
|---|---|---|---|---|
| 6,864,337 B2 * | 3/2005 | Yuasa | ................. | C04B 24/2658 526/310 |
| 8,362,140 B2 * | 1/2013 | Fujimaki | ............... | C08F 290/00 524/559 |

(Continued)

FOREIGN PATENT DOCUMENTS

| | | |
|---|---|---|
| EP | 2112182 A1 | 10/2009 |
| JP | 8-337643 A | 12/1996 |

(Continued)

OTHER PUBLICATIONS

Communication dated Feb. 12, 2020, from the Japanese Patent Office in Application No. 2018-535544.

(Continued)

*Primary Examiner* — Sanza L. McClendon
(74) *Attorney, Agent, or Firm* — Sughrue Mion, PLLC

(57) ABSTRACT

A curable composition contains a resin containing a curable group, a colorant, a polymerization inhibitor, and a polymerization initiator. A manufacturing method of the curable composition includes a colorant dispersing step of mixing together the resin containing a curable group, the colorant, and the polymerization inhibitor and a mixing step of mixing together the colorant dispersion and the polymerization initiator so as to obtain the curable composition. A cured film is obtained by curing the curable composition. A color filter, a solid-state imaging element, and an infrared sensor have the cured film. A manufacturing method of the cured film includes a curable composition layer-forming step, an exposure step, and a development step.

24 Claims, 3 Drawing Sheets

(51) Int. Cl.
*C08J 3/28* (2006.01)
*C08J 5/18* (2006.01)
*C08K 3/28* (2006.01)
*C08L 29/12* (2006.01)
*C08L 33/14* (2006.01)
*C08L 33/26* (2006.01)
*C08K 5/372* (2006.01)

(56) References Cited

U.S. PATENT DOCUMENTS

| | | | |
|---|---|---|---|
| 2007/0101903 A1 | 5/2007 | Lee et al. | |
| 2009/0030139 A1 | 1/2009 | Roy et al. | |
| 2009/0128767 A1 | 5/2009 | Suezaki et al. | |
| 2009/0182079 A1 | 7/2009 | Lee et al. | |
| 2011/0070407 A1 | 3/2011 | Kato et al. | |
| 2012/0142876 A1* | 6/2012 | Kawakami | C04B 24/267 |
| | | | 526/240 |
| 2012/0250166 A1 | 10/2012 | Idei et al. | |
| 2013/0230701 A1 | 9/2013 | Mochizuki | |
| 2015/0205203 A1 | 7/2015 | Fujiwara et al. | |
| 2017/0269270 A1* | 9/2017 | Taguchi | G03F 7/0007 |
| 2018/0355088 A1* | 12/2018 | Ogawa | C08L 33/04 |

FOREIGN PATENT DOCUMENTS

| | | |
|---|---|---|
| JP | 2004-133090 A | 4/2004 |
| JP | 2007-063252 A | 3/2007 |
| JP | 2007-079128 A | 3/2007 |
| JP | 2007-131831 A | 5/2007 |
| JP | 2007-171246 A | 7/2007 |
| JP | 2007-277512 A | 10/2007 |
| JP | 2008-189747 A | 8/2008 |
| JP | 2008-248144 A | 10/2008 |
| JP | 2009-510246 A | 3/2009 |
| JP | 2009-256572 A | 11/2009 |
| JP | 2009-265372 A | 11/2009 |
| JP | 2010-168475 A | 8/2010 |
| JP | 2011-145663 A | 7/2011 |
| JP | 2013-114184 A | 6/2013 |
| JP | 2013-181163 A | 9/2013 |
| JP | 2013-249417 A | 12/2013 |
| JP | 2014-182253 A | 9/2014 |
| JP | 2015-084086 A | 4/2015 |
| WO | 2008/081996 A2 | 7/2008 |
| WO | 2011/090217 A1 | 7/2011 |
| WO | 2014-010345 A | 1/2014 |

OTHER PUBLICATIONS

Office Action dated May 26, 2020 in Japanese Application No. 2018-535544.
Communication dated Jul. 30, 2019, from the European Patent Office in counterpart European Application No. 17843298.5.
International Search Report, issued by International Searching Authority in corresponding International Application No. PCT/JP2017/026746, dated Oct. 24, 2017.
International Preliminary Report on Patentability issued from the International Bureau in counterpart International Application No. PCT/JP2017/026746, dated Feb. 26, 2019.
Written Opinion issued by the International Bureau in corresponding International Application No. PCT/JP2017/026746 dated Oct. 24, 2017.
Communication dated Feb. 25, 2020, from the Korean Intellectual Property Office in application No. 10-2019-7004847.
Communication dated Aug. 31, 2020, from the European Patent Office in European Application No. 17 843 298.5.
Office Action dated Oct. 5, 2020, from the Korean Intellectual Property Office in Korean application No. 10-2019-7004847.
Office Action dated Dec. 11, 2020, from the Taiwanese Patent Office in TW Application No. 106125185.
Office Action dated Dec. 15, 2020 by the Japanese Patent Office in Japanese application No. 2018-535544.
Office Action dated Aug. 10, 2021, from the Taiwanese Intellectual Property Office in TW application No. 106125185.

* cited by examiner

CURABLE COMPOSITION, MANUFACTURING METHOD OF CURABLE COMPOSITION, CURED FILM, MANUFACTURING METHOD OF CURED FILM, COLOR FILTER, SOLID-STATE IMAGING ELEMENT, SOLID-STATE IMAGING DEVICE, AND INFRARED SENSOR

CROSS-REFERENCE TO RELATED APPLICATIONS

This application is a Continuation of PCT International Application No. PCT/JP2017/026746 filed on Jul. 25, 2017, which claims priority under 35 U.S.C. § 119(a) to Japanese Patent Application No. 2016-164656 filed on Aug. 25, 2016, Japanese Patent Application No. 2017-006665 filed on Jan. 18, 2017 and Japanese Patent Application No. 2017-134486 filed on Jul. 10, 2017. Each of the above application(s) is hereby expressly incorporated by reference, in its entirety, into the present application.

BACKGROUND OF THE INVENTION

1. Field of the Invention

The present invention relates to a curable composition, a manufacturing method of the curable composition, a cured film, a manufacturing method of the cured film, a color filter, a solid-state imaging element, a solid-state imaging device, and an infrared sensor.

2. Description of the Related Art

In the related art, a curable composition containing a colorant has been used for various uses. For example, the curable composition has been used for manufacturing a liquid crystal display device, a solid-state imaging element, and the like.

Specifically, typical color filters used in a liquid crystal display device, a solid-state imaging element, and the like have pixel regions of red, green, and blue on a substrate and a black matrix separating the pixel regions. In all of those color filters, a pattern-like cured film formed of a curable composition containing a colorant is used.

Furthermore, in a solid-state imaging element, for the purpose of preventing the occurrence of noise, improving image quality, and the like, the pattern-like cured film is used as a light blocking film. Currently, mobile terminals as electronics such as a mobile phone and a personal digital assistant (PDA) are equipped with a compact and thin solid-state imaging device. Generally, the solid-state imaging device comprises a solid-state imaging element such as a charge coupled device (CCD) image sensor and a complementary metal-oxide semiconductor (CMOS) image sensor and a lens for forming an image of a subject on the solid-state imaging element.

As the curable composition described above, JP2015-084086A describes a photosensitive resin composition containing an alkali-soluble resin having an ethylenically unsaturated group, a photopolymerizable monomer, a photopolymerization initiator, a coloring material, and a dispersant, in which the photopolymerization initiator includes a photopolymerization initiator having a predetermined structure.

SUMMARY OF THE INVENTION

The inventors of the present invention examined the photosensitive resin composition described in JP2015-084086A. As a result, unfortunately, it was revealed that the pattern shape of the obtained cured film does not reach the currently required level.

Therefore, an object of the present invention is to provide a curable composition which makes it possible to prepare a cured film having an excellent pattern shape (hereinafter, simply described as "having patterning properties" as well).

Another object of the present invention is to provide a manufacturing method of the curable composition, a cured film, a manufacturing method of the cured film, a color filter, a solid-state imaging element, a solid-state imaging device, and an infrared sensor.

In order to achieve the above objects, the inventors of the present invention carried out an intensive examination. As a result, the inventors have found that the objects can be achieved by the following constitution.

[1] A curable composition comprising a resin containing a curable group, a colorant, a polymerization inhibitor, and a polymerization initiator.

[2] The curable composition described in [1], in which the resin contains an ethylenically unsaturated group, and a content of the ethylenically unsaturated group in the resin is 0.1 to 3.0 mmol/g.

[3] The curable composition described in [2], in which the ethylenically unsaturated group is a (meth)acryloyl group or a styryl group.

[4] The curable composition described in any one of [1] to [3], in which the resin contains a structural unit A containing a polymer chain and a structural unit B containing an acidic group, the polymer chain contains a structural unit GF, and the structural unit GF is selected from the group consisting of a structural unit formed of an oxyalkylene carbonyl group and a structural unit formed of an oxyalkylene group.

[5] The curable composition described in [4], in which the polymer chain contains two or more kinds of the structural units GF.

[6] The curable composition described in [4] or [5], in which the resin contains at least one kind of structural unit selected from the group consisting of Formula A1 which will be described later and Formula B1 which will be described later.

[7] The curable composition described in any one of [4] to [6], in which the resin contains at least one kind of structural unit selected from the group consisting of Formula A1 which will be described later and Formula B2 which will be described later.

[8] The curable composition described in any one of [4] to [7], in which the structural unit GF is a structural unit obtained by performing ring-opening polymerization of a cyclic compound.

[9] The curable composition described in [4], in which the structural unit A is represented by Formula A0 which will be described later.

[10] The curable composition described in any one of [4] to [19], in which a mass ratio of an amount of the resin contained in the curable composition to an amount of the colorant contained in the curable composition is 0.1 to 0.5.

[11] The curable composition described in any one of [1] to [10], further comprising a solvent.

[12] The curable composition described in any one of [1] to [11], further comprising another resin.

[13] The curable composition described in any one of [1] to [12], in which the colorant contains a black pigment, and a content of the black pigment with respect to a total solid content of the curable composition is equal to or greater than 50% by mass.

[14] The curable composition described in [13], in which the black pigment contains at least one kind of compound selected from the group consisting of titanium oxynitride, titanium nitride, niobium oxynitride, niobium nitride, zirconium oxynitride, and zirconium nitride.

[15] The curable composition described in any one of [1] to [14], in which the polymerization initiator contains a photopolymerization initiator, and a mass ratio of an amount of the photopolymerization initiator contained in the curable composition to an amount of the resin contained in the curable composition is 0.1 to 2.0.

[16] The curable composition described in any one of [1] to [15], in which the polymerization inhibitor is at least one kind of polymerization inhibitor selected from the group consisting of a phenol-based polymerization inhibitor and a free radical-based polymerization inhibitor.

[17] The curable composition described in any one of [1] to [16], in which the polymerization inhibitor is a free radical-based polymerization inhibitor.

[18] The curable composition described in [17], in which the free radical-based polymerization inhibitor is a hindered amine compound.

[19] The curable composition described in any one of [1] to [15], comprising two or more kinds of the polymerization inhibitors.

[20] The curable composition described in [19], in which the two or more kinds of the polymerization inhibitors are selected from the group consisting of a phenol-based polymerization inhibitor and a free radical-based polymerization inhibitor.

[21] The curable composition described in [20], comprising a phenol-based polymerization inhibitor and a free radical-based polymerization inhibitor.

[22] The curable composition described in [20] or [21], in which the free radical-based polymerization inhibitor is a hindered amine compound.

[23] The curable composition described in any one of [1] to [22], in which a total content of the polymerization inhibitors in the curable composition is 0.05% to 0.5% by mass.

[24] The curable composition described in any one of [1] to [23], in which in a cured film obtained by curing the curable composition, an optical density per film thickness of 1.0 µm is equal to or higher than 3.0 in a wavelength range of 400 to 1,100 nm.

[25] The curable composition described in any one of [1] to [24], further comprising a polymerizable compound containing a cardo-skeleton.

[26] A manufacturing method of the curable composition described in any one of [I] to [25], comprising a colorant dispersing step of mixing together the resin containing a curable group, the colorant, and the polymerization inhibitor so as to obtain a colorant dispersion, and a mixing step of mixing together the colorant dispersion and the polymerization initiator so as to obtain the curable composition.

[27] The manufacturing method of a curable composition described in [26], in which in the colorant dispersing step, a liquid temperature of the colorant dispersion is kept at a temperature equal to or higher than 5° C. and lower than 60° C.

[28] The manufacturing method of a curable composition described in [26] or [27], in which in the colorant dispersing step, the colorant dispersion is mixed using a beads mill.

[29] A cured film obtained by curing the curable composition described in any one of [1] to [25].

[30] A color filter comprising the cured film described in [29].

[31] A solid-state imaging element comprising the cured film described in [29].

[32] A solid-state imaging device comprising the solid-state imaging element described in [31].

[33] An infrared sensor comprising the cured film described in [29].

[34] A manufacturing method of a cured film, comprising a curable composition layer-forming step of forming a curable composition layer by using the curable composition described in any one of [1] to [25], an exposure step of performing exposure by irradiating the curable composition layer with actinic rays or radiation, and a development step of developing the curable composition layer having undergone exposure so as to form a cured film.

[35] The manufacturing method of a cured film described in [34], further comprising a heating step of heating the curable composition layer having undergone exposure between the exposure step and the development step.

According to the present invention, it is possible to provide a curable composition having excellent patterning properties (hereinafter, described as "having the effects of the present invention" as well). Furthermore, according to the present invention, it is possible to provide a cured film, a manufacturing method of the cured film, a color filter, a solid-state imaging element, a solid-state imaging device, and an infrared sensor.

DESCRIPTION OF THE PREFERRED EMBODIMENTS

Figure 1:
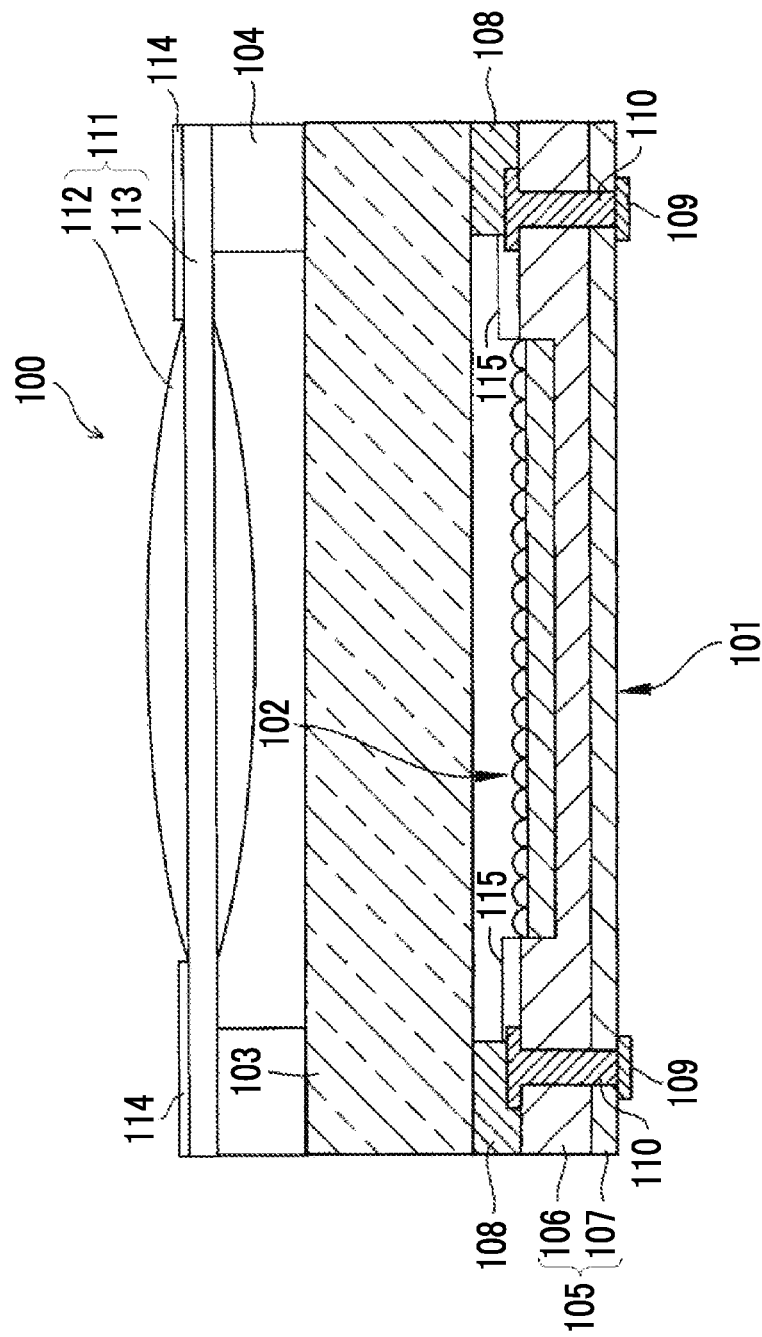
FIG. 1 is a schematic cross-sectional view showing an example of the constitution of a solid-state imaging device.

Hereinafter, the present invention will be specifically described.

In the following section, constituents will be described based on typical embodiments of the present invention in some cases, but the present invention is not limited to the embodiments.

In the present specification, a range of numerical values described using "to" is a range including numerical values listed before and after "to" as a lower limit and an upper limit respectively.

In the present specification, regarding the description of a group (atomic group), in a case where whether the group is substituted or unsubstituted is not described, the group includes a group which does not contain a substituent and a group which contains a substituent. For example, "alkyl group" includes not only an alkyl group which does not contain a substituent (unsubstituted alkyl group) but also an alkyl group which contains a substituent (substituted alkyl group).

Furthermore, in the present specification, "actinic rays" or "radiation" means, for example, a bright line spectrum of a mercury lamp, far ultraviolet rays represented by an excimer laser, extreme ultraviolet radiation (EUV: extreme ultraviolet lithography light), X-rays, electron beams, and the like. In addition, in the present specification, light means actinic rays and radiation. In the present specification, unless otherwise specified, "exposure" includes not only exposure by a bright line spectrum of a mercury lamp, far ultraviolet rays represented by an excimer laser. X-rays, and EUV light, but also lithography by particle beams such as electron beams and ion beams.

In the present specification, "(meth)acrylate" represents acrylate and methacrylate, "(meth)acryl" represents acryl and methacryl, "(meth)acryloyl" represents acryloyl and methacryloyl, and "(meth)acrylamide" represents acrylamide and methacrylamide. Furthermore, in the present specification, "tanryotai" in Japanese and "monomer" have the same definition. The monomer is classified into an oligomer and a polymer, and refers to a compound having a weight-average molecular weight equal to or smaller than 2,000. In the present specification, a polymerizable compound refers to a compound containing a polymerizable group, and may be a monomer or a polymer. The polymerizable group refers to a group which takes part in a polymerization reaction.

[Curable Composition]

The curable composition according to the embodiment of the present invention contains a resin containing a curable group, a colorant, a polymerization inhibitor, and a polymerization initiator. Hereinafter, each of the components will be described.

One of the characteristics of the curable composition is that the composition contains a resin containing a curable group and a polymerization inhibitor. The mechanism through which the curable composition brings about the effects of the present invention is unclear. Hereinafter, the operation and mechanism assumed by the inventors of the present invention will be described. Note that the present invention is not limited to the following description, and a case where the effects of the present invention are obtained by a mechanism different from the following operation and mechanism is also included in the scope of the present invention.

Generally, a method for obtaining a pattern-like cured film by using a composition having curing properties is as below.

That is, energy such as heat and/or light is applied to a portion of a coating film formed of a composition having curing properties so as to cause a polymerization reaction in the coating film and to cure the coating film, thereby obtaining a pattern-like cured film.

According to the examination performed by the inventors of the present invention, it has been found that in a case where the content of a colorant contained in the composition having curing properties is large, even though energy such as heat, particularly, light is applied to the composition having curing properties, unfortunately, in a portion to which the energy is applied, the composition having curing properties is not uniformly cured in some cases. In a case where the composition having curing properties is not uniformly cured, after a pattern-like cured film is obtained by developing a layer of the composition having curing properties having undergone the application of energy, variation easily occurs in the pattern shape. That is, line width roughness (LWR) easily increases.

In recent years, in the technical field of the composition having curing properties described above, a further increase in the content of a colorant has been required. Presumably, in a case where the composition having curing properties contains a large amount of colorant, energy propagation in the composition may be easily hindered by the colorant, and hence the variation in the pattern shape described above may easily occur.

The curable composition according to the embodiment of the present invention contains the resin containing a curable group. This resin also functions as a dispersant of a colorant.

Presumably, for this reason, the colorant may be dispersed in the curable composition by being enclosed in the resin containing a curable group.

Presumably, in a case where energy is applied to the curable composition described above, the propagation of energy may be easily hindered by the colorant, but due to the resin containing a curable group around the colorant, a polymerization reaction may continue. Presumably, for this reason, even in a case where the content of the colorant in the curable composition is large, a pattern shape with small variation may be obtained.

Furthermore, according to the intensive examination performed by the inventors of the present invention, it has been found that the curable composition containing the polymerization inhibitor has excellent patterning properties. The reason is unclear, but presumably, this is because the polymerization inhibitor may inhibit the resin containing a curable group from being unintentionally polymerized before the application of energy.

Hereinafter, each of the components contained in the curable composition will be specifically described.

[Resin Containing Curable Group]

As the resin containing a curable group, known resins containing a curable group can be used without particular limitation.

The content of the resin containing a curable group in the curable composition is not particularly limited. In view of making it easier for the colorant to be dispersed in the curable composition and in view of the balance between the content of the resin and the content of other components in the curable composition, the content of the resin with respect to the total solid content of the curable composition is preferably 5.0% to 35% by mass, more preferably 9.0% to 25.0% by mass, and even more preferably 13.0% to 22.0% by mass.

One kind of resin containing a curable group may be used singly, or two or more kinds of resins containing a curable group may be used in combination. In a case where two or more kinds of resins containing a curable group are used in combination, it is preferable that the total content thereof is within the above range.

The weight-average molecular weight of the resin containing a curable group is not particularly limited. However, in view of maintaining an excellent dispersion performance and in view of maintaining appropriate viscosity of a resist liquid, the weight-average molecular weight of the resin is preferably 5,000 to 100,000, and more preferably 10,000 to 60,000.

In the present specification, in a case where a weight-average molecular weight of a substance which does not have a molecular weight distribution is mentioned, that is, in a case where weight-average molecular weight/number-average molecular weight of the substance is 1, the weight-average molecular weight means a molecular weight which can be calculated from the structural formula of the compound. In contrast, in a case where a weight-average molecular weight of a substance which has a molecular weight distribution is mentioned, the weight-average molecular weight means a weight-average molecular weight which can be measured by a gel permeation chromatography (GPC) method described below.

Device: HLC-8220GPC [manufactured by Tosoh Corporation]

Detector: differential refractometer (RI detector, RI is abbreviation of Refractive Index)

Precolumn: TSKGUARD COLUMN MP (XL) 6 mm×40 mm [manufactured by Tosoh Corporation]

Sample column: the following four columns connected to each other in series [manufactured by Tosoh Corporation]
TSK-GEL Multipore-HXL-M 7.8 mm×300 mm
Reference column: same as sample column
Temperature of constant-temperature tank: 40° C.
Mobile phase: tetrahydrofuran
Flow rate of mobile phase for sample: 1.0 mL/min
Flow rate of mobile phase for reference: 0.3 mL/min
Sample concentration: 0.1% by mass
Sample injection amount: 100 µL
Data collection time: 16 minutes to 46 minutes after injection of sample
Sampling pitch: 300 msec The acid value of the resin containing a curable group is not particularly limited. However, the acid value of the resin is preferably 20 to 200 mgKOH/g, because then the occurrence of residues is further inhibited at the time of development, and a light blocking film obtained after development has further improved patterning properties. In a case where the acid value of the resin containing a curable group is within the above range, a curable composition having further improved patterning properties is obtained.

Furthermore, the interaction between the resin containing a curable group and a colorant (for example, titanium black which will be described later) is further improved. Accordingly, in a colorant dispersion prepared using the resin containing a curable group by using a method which will be described later, the aggregation and/or the precipitation of the colorant can be inhibited, and hence further improved temporal stability is obtained.

In the present specification, the acid value of the resin containing a curable group can be calculated, for example, from the average content of acidic groups in the resin containing a curable group.

Furthermore, the acid value can be determined by neutralizing titration using an aqueous sodium hydroxide solution. Specifically, by using potentiometry, an aqueous sodium hydroxide solution is titrated to a solution obtained by dissolving the resin in a solvent, and the amount of an acid contained in 1 g of solid contents of the resin is calculated. Then, by converting the amount into a KOH equivalent, the acid value can be determined. The acid value of the resin containing a curable group is preferably 20 to 200 mgKOH/g, more preferably 30 to 150 mgKOH/g, and even more preferably 40 to 110 mgKOH/g.

The resin containing a curable group may contain one or more curable groups in one molecule or a plurality of curable groups in one molecule. In a case where the resin containing a curable group contains a plurality of curable groups in one molecule, the curable groups may be of the same type or different types.

Examples of the curable group include an ethylenically unsaturated group (for example, a (meth)acryloyl group, a vinyl group, a styryl group, or the like), a cyclic ether group (for example, an epoxy group, an oxetanyl group, or the like), and the like, but the curable group is not limited to these.

Among these, as the curable group, an ethylenically unsaturated group is preferable because this group can control polymerization by a radical reaction. The ethylenically unsaturated group is not particularly limited, but is preferably a (meth)acryloyl group or a styryl group. As the (meth)acryloyl group, a (meth)acryloyloxy group ($CH_2$=CHOO—) or a (meth)acrylamide group is preferable. Among these, an acryloyloxy group, an acrylamide group, and a styryl group are more preferable.

In a case where the resin contains an ethylenically unsaturated group as a curable group, the content of the ethylenically unsaturated group in the resin containing a curable group is not particularly limited, but is preferably 0.001 to 5.0 mmol/g, more preferably 0.1 to 3.0 mmol/g, and even more preferably 0.26 to 2.5 mmol/g. In a case where the content of the ethylenically unsaturated group is within a range of 0.1 to 3.0 mmol/g, the patterning properties of the curable composition are further improved.

In the present specification, the content of the ethylenically unsaturated group is described as "C=C value" in some cases.

In the present specification, the content (C=C value) of the ethylenically unsaturated group refers to a value measured by the following method. In a case where the resin containing a curable group is synthesized, the content of the ethylenically unsaturated group can be calculated from the amount of raw materials used, instead of being measured. A specific method for calculating the content of the ethylenically unsaturated group is described in Examples.

In a case where the ethylenically unsaturated group is a (meth)acryloyl group, the content of the ethylenically unsaturated group in the resin is measured by the following method.

First, 0.25 mg of a resin as a measurement target is dissolved in 50 mL of tetrahydrofuran (THF), and 15 mL of methanol is added thereto, thereby preparing a solution.

A 4N aqueous sodium hydroxide solution (10 mL) is added to the prepared solution, thereby obtaining a mixed solution. Then, the mixed solution is stirred for 2 hours at a liquid temperature of 40° C. Furthermore, 10.2 mL of a 4N aqueous methanesulfonic acid solution is added to the mixed solution, and the mixed solution is stirred. In addition, 5 mL of demineralized water is added to the mixed solution, and then 2 mL of methanol is added thereto, thereby preparing a measurement solution.

The content of (meth)acrylic acid in the measurement solution is measured by a high performance liquid chromatography (HPLC) method (absolute calibration curve method), and the content of the ethylenically unsaturated group is calculated.

Measurement condition for HPLC
Column: Synergi 4µ Polar-RP 80A (4.6 mm×250 mm) manufactured by Phenomenex
Column temperature: 40° C.
Flow rate: 1.0 mL/min
Detector wavelength: 210 nm
Eluent: tetrahydrofuran (THF, for HPLC) 55/buffer-water 45*buffer-water . . . 0.2%-phosphoric acid, 0.2%-aqueous triethylamine solution
Injection amount: 5 µL In a case where the ethylenically unsaturated group is a group other than a (meth)acryloyl group or in a case where a (meth)acryloyl group and a group other than a (meth)acryloyl group are used in combination, the content of the ethylenically unsaturated group in the resin is measured by the following method (measurement of bromine number).

The bromine number is measured based on JIS K2605: 1996.

The content of the ethylenically unsaturated group is a value obtained by converting grams (g$Br_2$/100 g), obtained by the bromine number, of bromine ($Br_2$) added to 100 g of the resin to be measured into the number of moles of bromine ($Br_2$) added per 1 g of the resin.

It is preferable that the resin containing a curable group contains at least one kind of structure selected from the group consisting of a polyester structure and a polyether structure. In this case, the resin may contain a polyester structure and/or a polyether structure in a main chain. Alternatively, as will be described later, in a case where the resin contains a structural unit containing a polymer chain, the polymer chain may contain a polyether structure and/or a polyester structure.

For the resin, it is more preferable that the polymer chain contains a polyester structure.

The curable group may be contained in a structural unit containing a polymer chain or in a structural unit other than the structural unit containing a polymer chain.

The manufacturing method of the resin containing a curable group is not particularly limited, and examples of such a resin include (1) resin obtained by a method in which a compound containing an epoxy group and a curable group is allowed to cause an addition reaction with a polymer containing a carboxy group (in Examples which will be described later, a resin PA-1 to a resin PA-38 correspond to this resin), (2) resin obtained by a method in which a compound containing an epoxy group and a curable group is allowed to cause an addition reaction with a polymer containing a carboxy group and a compound containing an isocyanate group and a curable group is allowed to cause an addition reaction with the generated alcohol moiety (in Examples which will be described later, a resin PH-1 corresponds to this resin), (3) resin obtained by a method in which a compound containing an oxetane group and a curable group is allowed to cause an addition reaction with a polymer containing a carboxy group (in Examples which will be described later, a resin PA-39 corresponds to this resin). (5) resin obtained by a method in which a compound containing a dissociable group (for example, a halogenated alkyl group) and a curable group is allowed to cause a substitution reaction with a polymer containing a carboxy group (in Examples which will be described later, resins PI-1 to PI-9 correspond to this resin), (6) resin obtained by a method in which a compound containing a hydroxyalkyl group and a curable group is allowed to cause a condensation reaction with a polymer containing a carboxy group (in Examples which will be described later, resins PJ-1 to PJ-4 correspond to this resin), (7) resin obtained by a method in which a compound containing an isocyanate group and a curable group is allowed to cause an addition reaction with a polymer containing a hydroxy group (in Examples which will be described later, resins PB-1 to PB-10 and a resin PP-1 correspond to this resin), (8) resin obtained by a method in which a carboxylic acid chloride is allowed to cause a substitution reaction with a polymer containing a hydroxy group (in Examples which will be described later, a resin PM-1 corresponds to this resin), and the like.

The compound containing an epoxy group and a curable group in the same molecule is not particularly limited, and examples thereof include epoxyalkyl (meth)acrylate. More specifically, examples thereof include glycidyl (meth)acrylate, 3,4-epoxybutyl (meth)acrylate, 4,5-epoxypentyl (meth) acrylate, 5,6-epoxyhexyl (meth)acrylate, 6,7-epoxyheptyl acrylate, 6,7-epoxyheptyl (meth)acrylate, 10,11-epoxyundecyl (meth)acrylate, 4-glycidylcyclohexyl (meth)acrylate, and the like.

As the compound containing an epoxy group and a curable group in the same molecule, monoglycidylether mono(meth)acrylate of a diol can also be used. Examples of the diol include bisphenol A, ethylene glycol, propylene glycol, tetramethylene glycol, diethylene glycol, dipropylene glycol, ditetramethylene glycol, and the like.

Furthermore, as the compound containing an epoxy group and a curable group in the same molecule, a product of a reaction between glycidol and (meth)acrylate-containing isocyanate can also be used. Examples of the (meth)acrylate-containing isocyanate include 2-methacryloyloxyethyl isocyanate, 2-acryloyloxyethyl isocyanate, 1,1-(bisacryloyloxymethyl)ethyl isocyanate, (isocyanatoethyloxy)ethyl methacrylate, and the like.

In addition, as the compound containing an epoxy group and a curable group in the same molecule, vinylbenzyl glycidyl ethers described in JP1997-227540A (JP-H09-227540A); and epoxy group-containing (meth)acrylamides described in JP2015-229633A can also be used.

As the compound containing an epoxy group and a curable group in the same molecule, it is also possible to use a product of a 1:1 addition reaction between a diglycidyl ether compound and (meth)acrylic acid. Examples of the diglycidyl ether compound include bisphenol A diglycidyl ether, ethylene glycol diglycidyl ether, propylene glycol diglycidyl ether, tetramethylene glycol diglycidyl ether, diethylene glycol diglycidyl ether, and the like.

As the compound containing an epoxy group and a curable group in the same molecule, monoglycidyl ester mono(meth)acryloxyethyl ester of dicarboxylic acid can also be used. Examples of the dicarboxylic acid include phthalic acid, cyclohexene dicarboxylic acid, cyclohexane dicarboxylic acid, maleic acid, malonic acid, succinic acid, and the like.

As the compound containing an epoxy group and a curable group in the same molecule, it is also possible to use 1-chloro-2,3-epoxypropyl acrylate, 1-chloro-2,3-epoxypropyl methacrylate, 2-bromo-3,4-epoxybutyl acrylate, 2-bromo-3,4-epoxy butyl methacrylate, 2-(epoxyethyloxy)-ethyl acrylate, 2-(epoxyethyloxy)-ethyl methacrylate, 2-(3, 4-epoxybutyloxy)-ethyl acrylate, 2-(3,4-epoxybutyloxy)-ethyl methacrylate, and the like.

Among these, glycidyl (meth)acrylate, 4-hydroxybutyl acrylate glycidyl ether, or 3,4-epoxycyclohexyl methyl (meth)acrylate is particularly preferable, and 4-hydroxybutyl acrylate glycidyl ether is most preferable.

The compound containing an isocyanate group and a curable group in the same molecule is not particularly limited. Examples thereof include acrylic acid derivatives such as 2-acryloyloxyethyl isocyanate, 3-acryloyloxypropyl isocyanate, 4-acryloyloxybutyl isocyanate, 6-acryloyloxyhexyl isocyanate, 8-acryloyloxyoctyl isocyanate, and 10-acryloyloxydecyl isocyanate; methacrylic acid derivatives such as 2-methacryloyloxyethyl isocyanate, 3-methacryloyloxypropyl isocyanate, 4-methacryloyloxybutyl isocyanate, 6-methacryloyloxyhexyl isocyanate, 8-methacryloyloxyoctyl isocyanate, and 10-methacryloyloxydecyl isocyanate; 1,1-(bisacryloyloxymethyl)ethyl isocyanate, (isocyanatoethyloxy)ethyl methacrylate, and the like.

The compound containing an oxetane group and a curable group in the same molecule is not particularly limited, and examples thereof include (3-ethyloxetan-3-yl)methyl acrylate and the like.

The compound containing a dissociable group and a curable group in the same molecule is not particularly limited, and examples thereof include an alkyl halogen compound containing a curable group, an alkyl tosylate compound containing a curable group, and the like. More specifically, examples thereof include 2-iodoethyl (meth) acrylate, 2-bromoethyl (meth)acrylate, 2-chloroethyl (meth) acrylate, 2-tosylethyl (meth)acrylate, 4-iodobutyl (meth) acrylate, 4-bromobutyl (meth)acrylate, 4-chlorobutyl (meth) acrylate, 4-tosylbutyl (meth)acrylate, and the like.

The compound containing a hydroxyl group and a curable group in the same molecule is not particularly limited, and the hydroxyl group may be primary or secondary.

Examples of the compound containing a primary hydroxyl group include mono(meth)acrylate of a diol. Examples of the diol include bisphenol A, ethylene glycol, propylene glycol, tetramethylene glycol, diethylene glycol, dipropylene glycol, ditetramethylene glycol, polyethylene glycol, and the like.

As the compound containing a primary hydroxyl group, ε-caprolactones modified with unsaturated fatty acid hydroxyalkyl ester can also be used. Examples of commercial products of the compound include PLACCEL FA1, PLACCEL FM1, PLACCEL FA2D, PLACCEL FM2D, PLACCEL FA5, PLACCEL FM5, and PLACCEL FAIOL (manufactured by Daicel Corporation), and the like.

Examples of the compound containing a secondary hydroxyl group include 2-hydroxypropyl (meth)acrylate, 2-hydroxybutyl (meth)acrylate, 2-hydroxy-3-phenoxypropyl acrylate, and the like.

As the manufacturing method of the resin containing a curable group, a method described in the following scheme may be used in which polymerization is performed using a monomer represented by Formula (i) such that a polymer containing a structural unit (I') represented by Formula (1') is synthesized, and the polymer is subjected to a dehydrohalogenation reaction in the presence of a base such as triethylamine such that an ethylenically unsaturated group is generated and a structural unit (I) represented by Formula (1) is formed (in Examples which will be described later, resins PK-1 to PK-5 and PL-1 to PL-5 correspond to the resin manufactured by the above method).

obtained by a method in which a compound containing an isocyanate group and a curable group is allowed to cause an addition reaction with a polymer containing a hydroxy group are preferable.

<Specific Resin>

As a preferable aspect of the resin containing a curable group (hereinafter, described as "specific resin" as well), a resin containing the following structural units A and B can be exemplified. In the present specification, a structural unit has the same definition as a repeating unit.

Structural unit A: containing polymer chain
Structural unit B: containing acidic group Furthermore, the polymer chain contains at least one kind of structural unit GF selected from the group consisting of the following structural units.

Structural unit formed of oxyalkylene group
Structural unit formed of oxyalkylene carbonyl group It is more preferable that the polymer chain contains two or more kinds of structural units GF.

The specific resin contains the structural unit A having a polymer chain and the structural unit B having an acidic group. Furthermore, the polymer chain contains at least one kind of structural unit GF, and the structural unit GF is selected from the group consisting of a structural unit formed of an oxyalkylene group and a structural unit formed of an oxyalkylene carbonyl group.

As long as the specific resin contains a curable group, a predetermined structural unit A, and a predetermined structural unit B, other structures of the specific resin are not particularly limited. The specific resin may have any of a linear, branched, or cyclic structure, or may have a structure

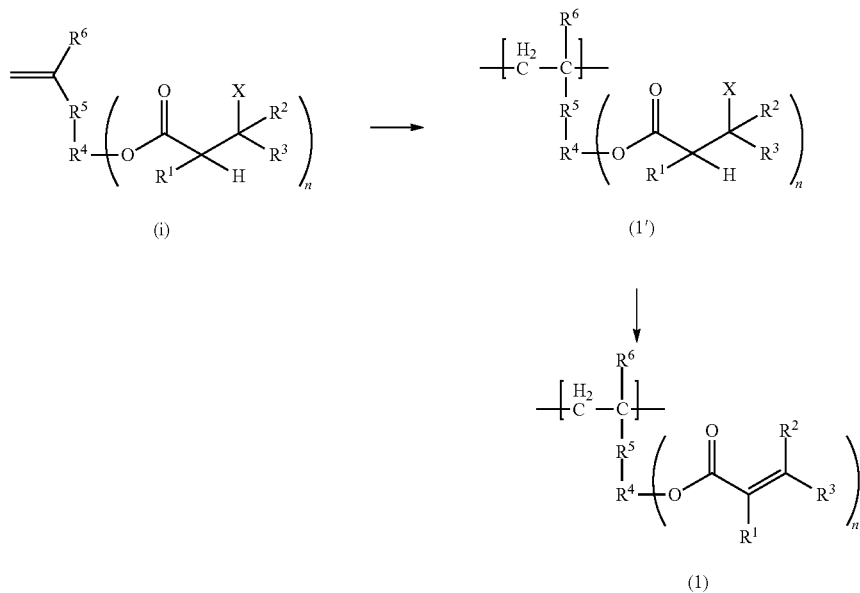

Particularly, in view of obtaining a curable composition having further improved effects of the present invention, as the resin containing a curable group, (1) resin obtained by a method in which a compound containing an epoxy group and a curable group is allowed to cause an addition reaction with a polymer containing a carboxy group and (7) resin which is a combination of linear, branched, and cyclic structures. In addition, the arrangement of the structural unit A and the structural unit B in the specific resin is not particularly limited. The structural unit A and the structural unit B may be arranged randomly or alternately or arranged in the form of a block.

The aspect in which the specific resin contains a curable group is not particularly limited, but any of the following resins is preferable.

Resin containing structural unit A, which contains curable group, and structural unit B Resin containing structural unit A which does not contain curable group, structural unit B, and structural unit X (structural unit different from structural unit A and structural unit B) containing curable group (Structural Unit A)

The structural unit A is a structural unit of the specific resin and contains a polymer chain in the structure thereof. It is preferable that the structural unit A contains the polymer chain in a side chain.

The polymer chain contains at least one kind of structural unit GF, and preferably contains two or more kinds of structural units GF. In a case where the polymer chain contains two or more kinds of structural units GF, the two or more kinds of structural units GF contained in the polymer chain have different structures.

In the present specification, an oxyalkylene group means a group represented by Formula (OA). Furthermore, in the present specification, an oxyalkylene carbonyl group means a group represented by Formula (OAC).

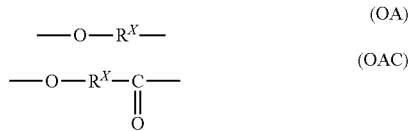

In Formula (OA) and Formula (OAC), $R^X$ represents an alkylene group. The alkylene group represented by $R^X$ is not particularly limited, but is preferably a linear or branched alkylene group having 1 to 20 carbon atoms, more preferably a linear or branched alkylene group having 2 to 16 carbon atoms, and even more preferably a linear or branched alkylene group having 3 to 12 carbon atoms.

Herein, the two or more kinds of structural units GF mean two or more kinds of structural units having different structures. More specifically, examples of aspects of the two or more kinds of structural units GF include a case where different kinds of structural units, such as a combination of a structural unit formed of an oxyalkylene group and a structural unit formed of an oxyalkylene carbonyl group, are incorporated into the polymer chain. The examples also include an aspect in which two or more kinds of oxyalkylene groups having different numbers of carbon atoms in the alkylene group are incorporated in the polymer chain. Furthermore, the examples include an aspect in which two or more kinds of oxyalkylene carbonyl groups having different numbers of carbon atoms in the alkylene group are incorporated into the polymer chain. In the above aspects, the difference in the number of carbon atoms in the alkylene groups between structural units is described. However, in a case where the number of carbon atoms in the alkylene groups in the two kinds of structural units is the same, but the structural units have different structures (linear and branched), the structural units are regarded as different structural units. For example, although —(OCH$_2$CH$_2$CH$_2$)— and —(OCH$_2$CH(CH$_3$))— correspond to a structural unit represented by Formula (OA) in which $R^X$ has three carbon atoms, they are regarded as different structural units. Furthermore, in a case where the position of a branch varies between the structural units, the structural units are regarded as different structural units. For example, —(OCH$_2$CH(CH$_3$)CH$_2$)— and (OCH$_2$CH$_2$CH(CH$_3$))— are regarded as different structural units.

The structure of the polymer chain is not particularly limited as long as the polymer chain is formed of a polymer. Examples of the polymer forming the polymer chain include a polymer selected from the group consisting of a random copolymer, an alternate copolymer, and a block copolymer.

Furthermore, in order to further improve the dispersibility of the colorant in the curable composition, a terminal of a molecular chain of each polymer may be modified using a known denaturant.

In view of making it easier to manufacture the structural unit A having a polymer chain and in view of further stabilizing the quality of the colorant dispersion which will be described later, the structural unit GF is preferably a structural unit obtained by subjecting a cyclic compound to a ring-opening polymerization.

As the cyclic compound, known compounds can be used. As the cyclic compound, compounds whose ring can be opened by hydrolysis are preferable, and examples thereof include a cyclic amide compound such as ε-caprolactam; a cyclic urea derivative such as N,N'-dimethylpropylene urea or 1,3-dimethyl-2-imidazolidinone; a cyclic ester (lactone compound) such as β-propiolactone, β-butyrolactone, β-valerolactone, γ-butyrolactone. γ-valerolactone, γ-caprylolactone, δ-valerolactone, β-methyl-δ-valerolactone, δ-stearolactone, ε-caprolactone, γ-octanoic lactone, 2-methyl-ε-caprolactone, 4-methyl-ε-caprolactone, ε-caprylolactone, ε-palmitolactone, α-hydroxy-γ-butyrolactone, or α-methyl-γ-butyrolactone; and the like. Among these, in view of improving the reactivity of ring-opening polymerization, as the cyclic compound, a lactone compound is preferable, and at least one kind of compound selected from the group consisting of β-propiolactone, β-butyrolactone. β-valerolactone, γ-butyrolactone, γ-valerolactone, γ-caprylolactone, δ-valerolactone, β-methyl-δ-valerolactone, δ-stearolactone, ε-caprolactone, 2-methyl-ε-caprolactone, 4-methyl-ε-caprolactone, ε-caprylolactone, and ε-palmitolactone is more preferable.

The method for causing ring-opening polymerization of the cyclic compound is not particularly limited, and examples thereof include a method using a ring-opening polymerization initiator. As the ring-opening polymerization initiator, known ring-opening polymerization initiators can be used without particular limitation. Examples thereof include an aliphatic alcohol and the like.

The aliphatic alcohol is not particularly limited, and specific examples thereof include methanol, ethanol, propanol, butanol, pentanol, hexanol, and 2-ethyl-1-hexanol; ethylene glycol, 1,2-propanediol, 1,3-propanediol, 1,3-butanediol, and polyethylene glycol; glycerol, sorbitol, xylitol, ribitol, erythritol, and triethanolamine; 2-hydroxyethyl methacrylate, and the like.

The specific resin has an action of improving the dispersibility of the colorant which will be described later. As the specific resin, particularly, a so-called graft copolymer is preferable because this substance further improves the dispersibility of the colorant. That is, it is preferable that the specific resin has the polymer chain contained in the structural unit A in a side chain, because then the polymer chain in the specific resin is adsorbed onto the surface of a substance to be dispersed and prevents the reaggregation of the substance to be dispersed. Furthermore, in a case where the specific resin has the polymer chain contained in the structural unit A in a side chain, in the colorant dispersion (described later) containing a solvent, the affinity between the specific resin and the solvent is easily improved, and it is easy to maintain an excellent dispersion state of the colorant in the colorant dispersion for a long period of time (hereinafter, this effect will be described as "having excellent temporal stability" as well). In addition, provided that the specific resin has the polymer chain contained in the structural unit A in a side chain, the affinity with other resins is easily improved, and in a case where a curable composition layer is prepared using the curable composition containing the colorant dispersion, subjected to exposure, and then developed, a residue hardly occurs in an unexposed portion.

The length of the polymer chain is not particularly limited. The longer the polymer chain, the stronger the steric repulsion effect, and hence the dispersibility of the colorant is improved. In contrast, in a case where the polymer chain is too long, the adsorptivity of the specific resin with respect to the colorant (for example, a black pigment or the like) is reduced, and hence the function of dispersing the colorant tends to deteriorate. Therefore, the number of atoms, except for hydrogen atoms, constituting the polymer chain is preferably 40 to 10,000, more preferably 50 to 2,000, and even more preferably 60 to 500.

The specific resin having a polymer chain can be prepared by, for example, polymerizing and/or copolymerizing a macromonomer which has a predetermined polymer chain and has a reactive double bond group. Examples of the macromonomer include modified poly(meth)acrylate having the aforementioned polymer chain on a terminal, and the like.

The structural unit A is preferably a structural unit based on a macromonomer represented by Formula (a3).

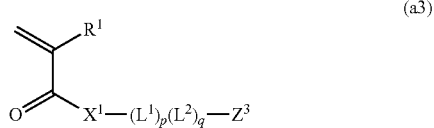

(a3)

In Formula (a3), $R^1$ represents a hydrogen atom, a halogen atom, or an alkyl group. Among these, a hydrogen atom, a halogen atom, or an alkyl group having 1 to 6 carbon atoms (for example, a methyl group, an ethyl group, a propyl group, or the like) is preferable.

In Formula (a3), $X^1$ represents a single bond or a divalent linking group. Examples of the divalent linking group include a divalent aliphatic group (for example, an alkylene group, a substituted alkylene group, an alkenylene group, a substituted alkenylene group, an alkynylene group, a substituted alkynylene group, or the like), a divalent aromatic group (for example, an arylene group and a substituted arylene group), a divalent heterocyclic group, an oxygen atom (—O—), a sulfur atom (—S—), an imino group (—NH—), a substituted imino bond (—$NR^{41'}$—, $R^{41'}$ is an aliphatic group, an aromatic group, or a heterocyclic group), a carbonyl bond (—CO—), a combination of these, and the like.

The divalent aliphatic group may have a cyclic structure or a branched structure. The number of carbon atoms in the aliphatic group is preferably 1 to 20, more preferably 1 to 15, and even more preferably 1 to 10. As the aliphatic group, a saturated aliphatic group is more preferable than an unsaturated aliphatic group. Furthermore, the aliphatic group may have a substituent. Examples of the substituent include a halogen atom, a hydroxyl group, an aromatic group, and a heterocyclic group.

The number of carbon atoms in the divalent aromatic group is preferably 6 to 20, more preferably 6 to 15, and even more preferably 6 to 10. Furthermore, the aromatic group may have a substituent. Examples of the substituent include a halogen atom, a hydroxyl group, an aliphatic group, an aromatic group, and a heterocyclic group.

The divalent heterocyclic group preferably has a 5-membered ring or a 6-membered ring as a heterocyclic ring. The heterocyclic ring may be fused with one or more rings among other heterocyclic rings, aliphatic rings, and aromatic rings. Furthermore, the heterocyclic group may have a substituent. Examples of the substituent include a halogen atom, a hydroxyl group, an oxo group (=O), a thioxo group (=S), an imino group (=NH), a substituted imino group (=N—$R^{42}$, $R^{42}$ is an aliphatic group, an aromatic group, or a heterocyclic group), an aliphatic group, an aromatic group, and a heterocyclic group.

As $X^1$, —O—$X^{1b}$— or —NH—$X^{1b}$— is more preferable. Herein, $X^{1b}$ represents a single bond or a divalent linking group. The aspect of the divalent linking group is the same as that described above.

In Formula (a3), $L^1$ and $L^2$ represent structural units GF which may be the same as or different from each other. $(L^1)_p(L^2)_q$ in Formula (a3) does not represent the arrangement order of a structural unit $L^1$ and a structural unit $L^2$. As long as p pieces of structural units $L^1$ and q pieces of structural units $L^2$ repeat, the arrangement order is not limited. That is, the arrangement order of the structural unit $L^1$ and the structural unit $L^2$ may be any of random arrangement, alternate arrangement, or block arrangement. Furthermore, the structural unit $L^2$ may be bonded to a group on the left terminal in Formula (a3), and the structural unit $L^1$ may be bonded to a group on the right terminal in Formula (a3). In view of further improving the effects of the present invention that the curable composition has, it is preferable that the arrangement order of the structural unit $L^1$ and the structural unit $L^2$ is random arrangement or alternate arrangement. Presumably, in a case where the arrangement order of the structural unit $L^1$ and the structural unit $L^2$ is random arrangement or alternate arrangement, the stereoregularity of the molecular chain of the specific resin may be further reduced, and the crystallinity of the specific resin may be further reduced.

Among these, as $L^1$ and $L^2$, oxyalkylene carbonyl groups different from each other or oxyalkylene groups which may be the same as or different from each other are preferable. Particularly, in view of obtaining a curable composition having further improved effects of the present invention, oxyalkylene groups which may be the same as or different from each other are more preferable. Presumably, in a case where $L^1$ and $L^2$ are oxyalkylene groups, a cured film obtained by curing the curable composition may have further improved hydrophilicity, and consequently, the curable composition has further improved developability.

p and q each represent an integer equal to or greater than 1. The range of p is preferably 1 to 120, and more preferably 2 to 60. The range of q is preferably 1 to 120, and more preferably 2 to 60.

In Formula (a3), $Z^3$ represents a monovalent organic group. The type of the organic group is not particularly limited. Specifically, examples thereof include an alkyl group, a hydroxyl group, an alkoxy group, an aryloxy group, a heteroaryloxy group, an alkyl thioether group, an aryl thioether group, a heteroaryl thioether group, an amino group, and the like. Among these, as the organic group represented by $Z^3$, particularly, from the viewpoint of improving the dispersibility of the colorant, an organic group having a steric repulsion effect such as an alkyl group or an alkoxy group having 5 to 24 carbon atoms is preferable. Among these, a branched alkyl group having 5 to 24 carbon atoms, a cyclic alkyl group having 5 to 24 carbon atoms, or an alkoxy group having 5 to 24 carbon atoms is particularly preferable. The alkyl group contained in the alkoxy group may be any of a linear, branched, or cyclic alkyl group.

Furthermore, $Z^3$ may be a group which contains or does not contain a curable group.

The structural unit A is preferably a structural unit represented by Formula A3.

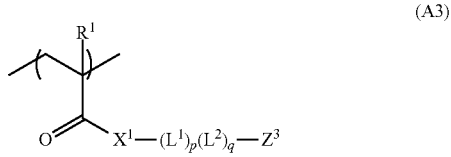

(A3)

In Formula (A3), $R^1$ represents a hydrogen atom or an alkyl group. Among these, a hydrogen atom or an alkyl group having 1 to 6 carbon atoms (for example, a methyl group, an ethyl group, a propyl group, or the like) is preferable.

In Formula (A3), $X^1$ represents a single bond or a divalent linking group. $L^1$ and $L^2$ each represent the structural unit GF, p and q each represent an integer equal to or greater than 1. $Z^3$ represents a hydrogen atom or a monovalent organic group (the monovalent organic group may be a curable group or a group other than a curable group). The aspects of these groups are as described above.

It is preferable that the sum of p and q (hereinafter, described as "p+q") in Formula (a3) and Formula (A3) is greater than 5 and less than 120. In a case where p+q is greater than the lower limit, the colorant dispersion which will be described later has further improved temporal stability. In contrast, in a case where p+q is smaller than the upper limit, the colorant dispersion is further inhibited from generating a precipitate in a low-temperature environment and has further improved temporal stability. Furthermore, a curable composition having further improved developability can be obtained.

In a case where the specific resin contains two or more kinds of structural units GF, the content of the structural unit $L^1$ in the polymer chain is not particularly limited. However, in view of further improving the effects of the present invention, the content of the structural unit $L^1$ with respect to the total mass of the polymer chain is preferably 2% to 98% by mass, and more preferably 5% to 95% by mass.

The content of the structural unit $L^2$ in the polymer chain is not particularly limited. However, in view of further improving the effects of the present invention, the content of the structural unit $L^2$ with respect to the total mass of the polymer chain is preferably 2% to 98% by mass, and more preferably 5% to 95% by mass.

The mass ratio of the structural unit $L^1$ to the structural unit $L^2$ is more preferably higher than 50/50 and less than 95/5. In a case where the mass ratio is within the above range, the occurrence of a precipitate in the colorant dispersion in a low-temperature environment is further inhibited.

As the structural unit A, a structural unit represented by Formula A0 is preferable.

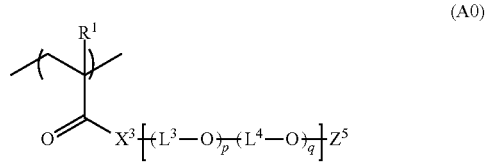

(A0)

In Formula A0, $R^1$ represents a hydrogen atom or an alkyl group, $X^3$ represents a single bond or a divalent linking group, p represents an integer equal to or greater than 1, q represents 0 or an integer equal to or greater than 1, $L^3$ and $L^4$ each independently represent a linear or branched alkyl group having 2 to 6 carbon atoms, and $Z^5$ represents a hydrogen atom or a monovalent organic group.

The aspects of $R^1$ and $X^3$ in Formula A0 are the same as those described above regarding $R^1$ and $X^1$ in Formula (a3) respectively.

$L^3$ and $L^4$ more preferably each independently represent a linear or branched alkyl group having 2 or 3 carbon atoms, and even more preferably each independently represent an ethyl group. The sum of p and q (hereinafter, described as "p+q") is preferably greater than 5 and less than 120, and more preferably equal to or greater than 11 and less than 90. In a case where p+q is greater than the lower limit, the colorant dispersion, which will be described later, has further improved temporal stability. In contrast, in a case where p+q is smaller than the upper limit, the colorant dispersion is further inhibited from generating a precipitate in a low-temperature environment and has further improved temporal stability. Furthermore, a curable composition having further improved developability can be obtained. The monovalent organic group represented by $Z^5$ may be a group which contains or does not contain a curable group. Particularly, in view of obtaining a curable composition having further improved effects of the present invention, $Z^5$ is preferably an alkyl group or an aryl group which has 6 or more carbon atoms and may contain a substituent, more preferably an alkyl group or an aryl group which has 12 or more carbon atoms and may contain a substituent, and even more preferably one kind of group selected from the group consisting of an alkyl group which has 12 or more carbon atoms and does not contain a substituent, an aryl group which has 12 or more carbon atoms and does not contain a substituent, and an aryl group which has 12 or more carbon atoms and contains an alkyl group as a substituent.

The formula weight of the structural unit A is preferably 500 to 30,000, and more preferably 1,200 to 20,000. In a case where the formula weight is equal to or greater than the upper limit, the colorant dispersion has further improved temporal stability. In contrast, in a case where the formula weight is equal to or smaller than the lower limit, the colorant dispersion has further improved temporal stability, and the curable composition has further improved effects of the present invention.

In the present specification, in a case where the structural unit A is formed of the aforementioned macromonomer, the aforementioned formula weight corresponds to the weight-average molecular weight of the macromonomer. The weight-average molecular weight of the macromonomer can be measured by a GPC method which will be described later. In the present specification, the structural unit A means a structural unit different from a structural unit B, a structural unit C, a structural unit D, a structural unit A1, a structural unit B1, and a structural unit B2 which will be described later.

(Structural Unit B)

The structural unit B is a structural unit of the specific resin and contains an acidic group in the structure thereof. "Contains an acidic group in the structure" means that the structural unit B contains an acidic group in a side chain which does not contribute to the formation of the main chain of the specific resin. The acidic group refers to a functional group corresponding to the definition of at least any of a Bronsted acid or a Lewis acid and a derivative group thereof (for example, a functional group having the structure of a salt thereof). Examples of the acidic group include an acidic group selected from a carboxylic acid group, a phosphoric acid group, a sulfonic acid group, a phenolic hydroxyl group, and a thiol group, a derivative group thereof (for example, a salt of the acidic group), and the like.

In view of making it easier to manufacture the specific resin, the structural unit B is preferably a structural unit based on a compound having a reactive double bond group (hereinafter, referred to as "polymerizable monomer" as well). The reactive double bond group and the acidic group described above may be bonded to each other directly or through a linking group.

In the present specification, the structural unit B refers to a structural unit different from the structural unit A described above and the structural unit C, the structural unit D, the structural unit A1, the structural unit B1, and the structural unit B2 which will be described later.

Because the structural unit B has an acidic group, the structural unit B can interact with the colorant (for example, a black pigment or the like, particularly, titanium black). Particularly, in a case where the structural unit B has an alkali-soluble group such as a carboxylic acid group as an acidic group, the structural unit B can impart further improved developability to the specific resin for forming a pattern by development. The curable composition containing such a specific resin exhibits excellent light blocking properties in an exposed portion and exhibits excellent developability in an unexposed portion.

Furthermore, in a case where the specific resin contains a structural unit having an acidic group, the specific resin easily becomes excellently compatible with a solvent, and hence the coating properties of the curable composition tend to be improved as well.

Presumably, this is because the acidic group in the structural unit B may easily interact with a colorant, the structural unit B may stably disperse the colorant, the viscosity of the specific resin dispersing the colorant may be reduced, and hence the specific resin may also be easily dispersed in a stable manner.

Examples of the acidic group as a functional group which can interact with the colorant include a carboxylic acid group, a phosphoric acid group, a sulfonic acid group, a phenolic hydroxyl group, a thiol group, and the like. At least one kind of acidic group among a carboxylic acid group, a sulfonic acid group, and a phosphoric acid group is preferable, and a carboxylic acid group is more preferable which exhibits excellent adsorptivity with respect to the colorant (for example, a black pigment or the like) and results in high dispersibility of the colorant.

That is, it is preferable that the specific resin further has a structural unit having at least one kind of group among a carboxylic acid group, a phosphoric acid group, a sulfonic acid group, a phenolic hydroxyl group, and a thiol group.

In the present invention, the way the acidic group is introduced into the specific resin is not particularly limited. However, it is preferable that the specific resin contains one or more kinds of structural units selected from structural units derived from monomers represented by Formulae (ib) to (iiib).

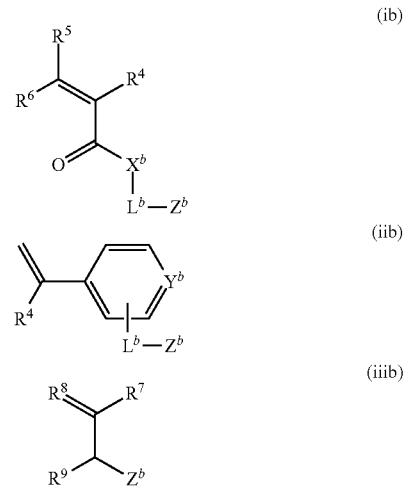

In Formulae (ib) and (iib), $R^4$, $R^5$, and $R^6$ each independently represent a hydrogen atom, a halogen atom, or an alkyl group. Among these, a hydrogen atom, a halogen atom, or an alkyl group having 1 to 6 carbon atoms (for example, a methyl group, an ethyl group, a propyl group, or the like) is preferable.

$X^b$ in Formula (ib) represents an oxygen atom (—O—) or an imino group (—NH—). $Y^b$ in Formula (iib) represents a methine group or a nitrogen atom.

In Formulae (ib) and (iib), $L^b$ represents a single bond or a divalent linking group. The divalent linking group is not particularly limited, but is preferably an alkylene group (the alkylene group may be any of a linear, branched, or cyclic alkylene group), —O—, —CO—, an arylene group, or a combination of these, and more preferably a group represented by -Lc-Ld-Le-. Lc represents an alkylene group (the alkylene group may be any of a linear, branched, or cyclic alkylene group), Ld represents an ester group (—COO—) or —O—, and Le represents an alkylene group (the alkylene group any of a linear, branched, or cyclic alkylene group) or an arylene group.

It is even more preferable that Lc and Le are alkylene groups and Ld is an ester group, because then colorant dispersion has further improved temporal stability, and the curable composition has further improved effects of the present invention. At this time, the number of carbon atoms in Lc and Le is not particularly limited. However, the total number of carbon atoms in Lc and Le is particularly preferably equal to or greater than 9, and the number of carbon atoms in each of Lc and Le is most preferably equal to or greater than 5.

$L^b$ may be a single bond, an alkylene group, or a divalent linking group having an oxyalkylene structure. The oxyalkylene structure is more preferably an oxyethylene structure or an oxypropylene structure. Furthermore, $L^b$ may have a polyoxyalkylene structure having two or more repeating oxyalkylene structures. As the polyoxyalkylene structure, a polyoxyethylene structure or a polyoxypropylene structure is preferable. The polyoxyethylene structure is represented by —(OCH$_2$CH$_2$)$_v$—, and v is preferably an integer equal to or greater than 2 and more preferably an integer of 2 to 10.

In Formulae (ib) to (iiib), $Z^b$ represents an acidic group. As the acidic group, an acidic group selected from a carboxylic acid group, a phosphoric acid group, a sulfonic acid group, a phenolic hydroxyl group, and a thiol group and a derivative group thereof are preferable, a carboxylic acid group, a sulfonic acid group, and a phosphoric acid group are more preferable, and a carboxylic acid group is even more preferable.

In Formula (iiib), $R^7$, $R^8$, and $R^9$ each independently represent a hydrogen atom, a halogen atom (for example, a fluorine atom, a chlorine atom, a bromine atom, or the like), an alkyl group having 1 to 6 carbon atoms (for example, a methyl group, an ethyl group, a propyl group, or the like), —$Z^b$, or $L^b$-$Z^b$. Herein, $L^b$ and $Z^b$ have the same definition as $L^b$ and $Z^b$ described above, and suitable aspects thereof are also the same. $R^7$, $R^8$, and $R^9$ preferably each independently represent a hydrogen atom or an alkyl group having 1 to 3 carbon atoms, and more preferably each independently represent a hydrogen atom.

As the monomer represented by Formula (iib), a compound is preferable in which $R^4$ is a hydrogen atom or a methyl group, $L^b$ is an alkylene group, $Z^b$ is a carboxylic acid group, and $Y^b$ is a methine group.

As the monomer represented by Formula (iiib), a compound is preferable in which $R^7$, $R^8$, and $R^9$ each independently represent a hydrogen atom or a methyl group, and $Z^b$ is a carboxylic acid group.

Examples of the aforementioned monomers include methacrylic acid, crotonic acid, isocrotonic acid, a product of a reaction between a compound having an addition polymerizable double bond and a hydroxyl group in a molecule (for example, 2-hydroxyethyl methacrylate) and succinic acid anhydride, a product of a reaction between a compound having an addition polymerizable double bond and a hydroxyl group in a molecule and phthalic acid anhydride, a product of a reaction between a compound having an addition polymerizable double bond and a hydroxyl group in a molecule and tetrahydrophthalic acid anhydride, a product of a reaction between a compound having an addition polymerizable double bond and a hydroxyl group in a molecule and trimellitic acid anhydride, a product of a reaction between a compound having an addition polymerizable double bond and a hydroxyl group in a molecule and pyromellitic acid anhydride, acrylic acid, an acrylic acid dimer, an acrylic acid oligomer, maleic acid, itaconic acid, fumaric acid, 4-vinylbenzoic acid, and the like.

In view of obtaining a curable composition having further improved effects of the present invention, the structural unit B is preferably a structural unit represented by at least one kind of formula selected from the group consisting of Formula (B1) and Formula (B2).

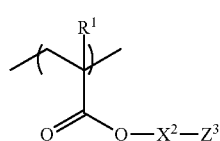

(B1)

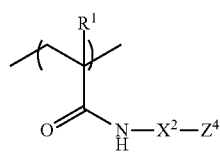

(B2)

In Formula (B1), $R^1$ represents a hydrogen atom or an alkyl group. Among these, a hydrogen atom or an alkyl group having 1 to 6 carbon atoms (for example, a methyl group, an ethyl group, a propyl group, or the like) is preferable. $X^2$ represents a single bond or a divalent linking group, $Z^3$ represents a hydrogen atom or an acidic group selected from a carboxylic acid group, a phosphoric acid group, a sulfonic acid group, a phenolic hydroxyl group, and a thiol group and a derivative group of the acidic group. In a case where $Z^3$ is a hydrogen atom, $X^2$ represents a single bond. In a case where $X^2$ is a divalent linking group, the aspect of $X^2$ is the same as that of $X^2$ described above.

In Formula (B2), $X^2$ represents a single bond or a divalent linking group, and $Z^4$ represents an acidic group selected from a carboxylic acid group, a phosphoric acid group, a sulfonic acid group, a phenolic hydroxyl group, and a thiol group and a derivative group of the acidic group.

Among these, the structural unit B is preferably represented by Formula (B1-2), because then the colorant dispersion has further improved temporal stability, and the curable composition has further improved effects of the present invention.

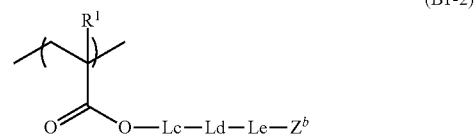

(B1-2)

The aspect of $R^1$ in Formula (B1-2) is the same as that of $R^1$ in Formula (B1). $Z^b$ represents an acidic group selected from a carboxylic acid group, a phosphoric acid group, a sulfonic acid group, a phenolic hydroxyl group, and a thiol group and a derivative group of the acidic group. Among these, a carboxylic acid group is preferable. Lc represents an alkylene group (the alkylene group may be any of a linear, branched, or cyclic alkylene group), Ld represents an ester group or —O—, and Le represents an alkylene group (the alkylene group may be any of a linear, branched, or cyclic alkylene group) or an arylene group.

Particularly, it is preferable that Lc and Le are alkylene groups and Ld is an ester group, because then the colorant dispersion has further improved temporal stability, and the curable composition has further improved effects of the present invention. At this time, the number of carbon atoms in Lc and Le is not particularly limited. However, the total number of carbon atoms in Lc and Le is more preferably equal to or greater than 9, and the number of carbon atoms in each of Lc and Le is even more preferably equal to or greater than 5.

(Structural Unit C)

The specific resin may contain a hydrophobic structural unit as the structural unit C. In the present specification, the hydrophobic structural unit means a structural unit different from the structural unit A, the structural unit B, and the structural unit D, the structural unit A1, the structural unit B1, and the structural unit B2 which will be described later.

As the hydrophobic structural unit, a structural unit derived from (corresponding to) a compound (monomer) having a C log P value equal to or greater than 1.2 is preferable, and a structural unit derived from a compound having a C log P value of 1.2 to 8 is more preferable.

The C log P value is a value calculated by a program "C LOG P" available from Daylight Chemical Information System, Inc. This program provides a value of "calculated log P" calculated by the fragment approach (see the following documents) of Hansch and Leo. The fragment approach is based on the chemical structure of a compound. In this method, the chemical structure is divided into partial structures (fragments), and degrees of contribution to log P that are assigned to the fragments are summed up, thereby estimating the log P value of the compound. Details of the method are described in the following documents. In the present invention, a C log P value calculated by a program C LOG P v 4.82 is used.

A. J. Leo. Comprehensive Medicinal Chemistry, Vol. 4, C. Hansch. P. G. Sammnens

J. B. Taylor and C. A. Ramsden, Eds., p. 295, Pergamon press, 1990

C. Hansch & A. J. Leo. Substituent Constants For Correlation Analysis in Chemistry and Biology. John Wiley & Sons.

A. J. Leo. Calculating log Poct from structure. Chem. Rev., 93, 1281-1306, 1993.

log P means a common logarithm of a partition coefficient P. log P is a value of physical properties that shows how a certain organic compound is partitioned in an equilibrium of two-phase system consisting of oil (generally, 1-octanol) and water by using a quantitative numerical value. log P is represented by the following expression.

$$\log P = \log(Coil/Cwater)$$

In the formula, Coil represents a molar concentration of a compound in an oil phase, and Cwater represents a molar concentration of the compound in a water phase.

The greater the positive log P value based on 0, the higher the oil solubility. The greater the absolute value of negative log P, the higher the water solubility. The value of log P is negatively correlated with the water solubility of an organic compound, and widely used as a parameter for estimating the hydrophilicity and hydrophobicity of an organic compound.

As the hydrophobic structural unit, one or more kinds of structural units selected from structural units based on monomers represented by General Formulae (ic) to (iiic) are preferable.

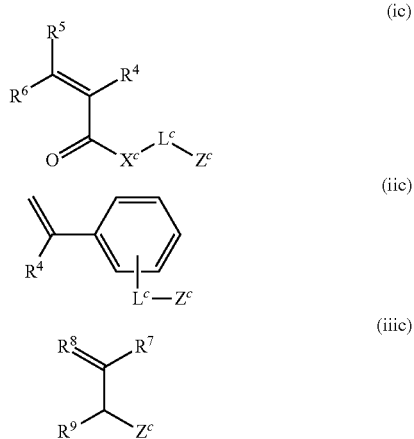

in Formulae (ic) and (iic), $R^4$, $R^5$, and $R^6$ each independently represent a hydrogen atom, a halogen atom, or an alkyl group. Among these, a hydrogen atom, a halogen atom, or an alkyl group having 1 to 6 carbon atoms (for example, a methyl group, an ethyl group, a propyl group, or the like) is preferable.

Each of $X^c$ and $L_c$ has the same definition as each of $X^b$ and $L^b$ described above, and suitable aspects thereof are also the same. Examples of $Z^c$ include an aliphatic group (for example, an alkyl group, a substituted alkyl group, an unsaturated alkyl group, or a substituted unsaturated alkyl group), an aromatic group (for example, an aryl group, a substituted aryl group, an arylene group, or a substituted arylene group), a heterocyclic group, and a combination of these. These groups may contain an oxygen atom (—O—), a sulfur atom (—S—), an imino group (—NH—), a substituted imino group (—NR³¹—, R³¹ represents an aliphatic group, an aromatic group, or a heterocyclic group), or a carbonyl group (—CO—).

In Formula (iiib), $R^7$, $R^8$, and $R^9$ each independently represent a hydrogen atom, a halogen atom (for example, a fluorine atom, a chlorine atom, a bromine atom, or the like), an alkyl group having 1 to 6 carbon atoms (for example, a methyl group, an ethyl group, a propyl group, or the like), —$Z^c$, or $L^c$-$Z_c$. Each of $L^c$ and $Z^c$ has the same definition as each of $L^c$ and $Z^c$ described above, and suitable aspects thereof are also the same. $R^7$, $R^8$, and $R^9$ preferably each independently represent a hydrogen atom or an alkyl group having 1 to 3 carbon atoms, and more preferably each independently represent a hydrogen atom.

The aliphatic group may have a cyclic structure or a branched structure. The number of carbon atoms in the aliphatic group is preferably 1 to 20, more preferably 1 to 15, and even more preferably 1 to 10. The aliphatic group also includes a ring-aggregated hydrocarbon group and a crosslinkable cyclic hydrocarbon group. Examples of the ring-aggregated hydrocarbon group include a bicyclohexyl group, a perhydronaphthalenyl group, a biphenyl group, a 4-cyclohexylphenyl group, and the like. Examples of the crosslinkable cyclic hydrocarbon ring include a bicyclic hydrocarbon ring such as a pinane, bornane, norpinane, norbornane, or bicyclooctane ring (a bicyclo[2.2.2]octane ring, a bicyclo[3.2.1]octane ring, or the like), a tricyclic hydrocarbon ring such as a homobredane, adamantane, tricyclo[5.2.1.0²,⁶]decane, or tricyclo[4.3.1.1²,⁵]undecane ring, a tetracyclic hydrocarbon ring such as a tetracyclo [4.4.0.1²,⁵.1⁷,¹⁰]dodecane or perhydro-1,4-methano-5,8-methanonaphthalene ring, and the like. The crosslinkable cyclic hydrocarbon ring also includes a fused hydrocarbon ring, for example, a fused ring in which a plurality of 5- to 8-membered cycloalkane rings such as perhydronaphthalene (decalin), perhydroanthracene, perhydrophenanthrene, perhydroacenaphthene, perhydrofluorene, perhydroindene, and perhydrophenalene rings are fused.

As the aliphatic group, a saturated aliphatic group is more preferable than an unsaturated aliphatic group. Furthermore, the aliphatic group may have a substituent. Examples of the substituent include a halogen atom, an aromatic group, and a heterocyclic group. Here, the aliphatic group does not have an acidic group as a substituent.

The number of carbon atoms in the aromatic group is preferably 6 to 20, more preferably 6 to 15, and even more preferably 6 to 10. Furthermore, the aromatic group may have a substituent. Examples of the substituent include a halogen atom, an aliphatic group, an aromatic group, and a heterocyclic group. Here, the aromatic group does not have an acidic group as a substituent.

It is preferable that the heterocyclic group has a 5-membered ring or a 6-membered ring as a heterocyclic ring. Another heterocyclic ring, an aliphatic ring, or an aromatic ring may be fused with the heterocyclic ring. Furthermore, the heterocyclic group may have a substituent. Examples of the substituent include a halogen atom, a hydroxyl group, an oxo group (=O), a thioxo group (=S), an imino group (=NH), a substituted imino group (=N—$R^{32}$, $R^{32}$ is an aliphatic group, an aromatic group, or a heterocyclic group), an aliphatic group, an aromatic group, and a heterocyclic group. Here, the heterocyclic group does not have an acidic group as a substituent.

In the present invention, as the monomer represented by Formula (ic), a compound is preferable in which each of $R^4$, $R^5$, and $R^6$ is a hydrogen atom or a methyl group, $L^c$ is a single bond, an alkylene group, or a divalent linking group having an oxyalkylene structure, $X^c$ is an oxygen atom or an imino group, and $Z^c$ is an aliphatic group, a heterocyclic group, or an aromatic group.

Furthermore, as the monomer represented by Formula (iic), a compound is preferable in which $R^4$ is a hydrogen atom or a methyl group, $L^c$ is an alkylene group, and $Z^c$ is an aliphatic group, a heterocyclic group, or an aromatic group.

As the monomer represented by Formula (iiic), a compound is preferable in which each of $R^6$, $R^7$, and $R^8$ is a hydrogen atom or a methyl group, and $Z^c$ is an aliphatic group, a heterocyclic group, or an aromatic group.

As the monomer represented by any of Formulae (ic) to (iiic), a compound represented by Formula (ic) is more preferable because this compound has excellent polymerization properties. Particularly, a compound ((meth)acrylic acid esters) represented by Formula (ic) is even more preferable in which $R^4$ is a hydrogen atom or a methyl group, each of $R^5$ and $R^6$ is a hydrogen atom, $L^c$ is a single bond, $X^c$ is an oxygen atom, and $Z^c$ is an aromatic group. Furthermore, benzyl (meth)acrylate is most preferable because this compound has higher hydrophobicity and further improves the effects of the present invention that the curable composition has.

Examples of typical compounds represented by Formulae (ic) to (iiic) include a radically polymerizable compound selected from acrylic acid esters, methacrylic acid esters, styrenes, and the like.

Regarding the examples of typical compounds represented by Formulae (ic) to (iiic), the compounds described in paragraphs "0089" to "0093" in JP2013-249417A can be referred to, and the contents thereof are incorporated into the present specification.

(Constitutional Unit D)

For the purpose of improving various performances including image intensity and the like, as long as the effects of the present invention are not impaired, the specific resin may further have another structural unit D having various functions (for example, a structural unit having a functional group having affinity with a dispersion medium used in the colorant dispersion which will be described later) that is different from the structural unit A, the structural unit B, the structural unit C, the structural unit A1, the structural unit B1, and the structural unit B2.

Examples of another structural unit described above include a structural unit derived from a radically polymerizable compound selected from acrylonitriles, methacrylonitriles, and the like.

The specific resin can be synthesized based on known methods.

(Content of Each Structural Unit in Specific Resin)

The content of the structural unit A with respect to the total mass of the specific resin is preferably 3% to 90% by mass, more preferably 30% to 90% by mass, and even more preferably 30% to 80% by mass. In a case where the content of the structural unit A is within the above range, the curable composition has further improved effects of the present invention.

The content of the structural unit B with respect to the total mass of the specific resin is preferably 3% to 90% by mass, more preferably 5% to 70% by mass, and even more preferably 10% to 60% by mass. In a case where the content of the structural unit B is within the above range, the curable composition has further improved effects of the present invention.

The content of the structural unit C with respect to the total mass of the specific resin is preferably 3% to 90% by mass, more preferably 5% to 60% by mass, and even more preferably 10% to 40% by mass. In a case where the content of the structural unit C is within the above range, the patterning properties of the curable composition are improved.

The content of the structural unit D with respect to the total mass of the specific resin is preferably 0% to 80% by mass, and more preferably 10% to 60% by mass. In a case where the content of the structural unit D is within the above range, the patterning properties of the curable composition are improved.

One kind of each of the structural units may be used singly, or two or more kinds of each of the structural units may be used in combination.

The weight-average molecular weight of the specific resin is preferably 1,000 to 100,000, more preferably 10,000 to 50,000, and even more preferably 16,000 to 40,000. In a case where the weight-average molecular weight of the specific resin is within the above range, the curable composition has further improved effects of the present invention.

The weight-average molecular weight of the specific resin is measured by the method specifically described in Examples which will be described later.

The content of the specific resin in the curable composition with respect to the total solid content in the curable composition is preferably 1% to 70% by mass, and more preferably 5% to 50% by mass. In view of further improving the effects of the present invention that the curable composition has, the content of the specific resin is even more preferably 10% to 40% by mass.

In view of securing dispersion performance of the colorant, a mass ratio of the amount of the specific resin contained in the curable composition to the amount of the colorant contained in the curable composition (content of specific resin/colorant, hereinafter, described as D/P as well) is preferably 0.05 to 0.7, and more preferably 0.1 to 0.5.

In view of causing an excellent polymerization reaction, a mass ratio of the amount of a polymerization initiator, which will be described later, contained in the curable composition to the amount of the specific resin contained in the curable composition (content of polymerization initiator/content of resin containing curable group) is preferably 0.05 to 5.0, and more preferably 0.1 to 2.0.

The curable composition according to the embodiment of the present invention may contain two or more kinds of resins containing a curable group. As an embodiment of a case where the curable composition contains two or more kinds of resins containing a curable group, an aspect in which (1) and (2) described below are used in combination can be exemplified.

(1) Resin (specific resin) which contains structural unit A and structural unit B and contains at least one curable group in molecule (2) Resin (hereinafter, referred to as "curable resin 2" as well) which does not contain structural unit A and contains at least one curable group in molecule In the embodiment described above, the curable resin 2 may contain the structural unit B. In a case where the curable resin 2 contains the structural unit B, in an alkali development step which will be described later, the solubility of the resin (2) in an alkaline developer is easily further improved, and the resin has a function of assisting the dissolution of an unexposed portion. Meanwhile, because the curable resin 2 contains a curable group, the curable composition in which the curable resin 2 is used in combination has an advantage in that the contrast between an exposed portion and an unexposed portion can be further increased.

The curable group contained in the curable resin 2 is not particularly limited, and examples thereof include an ethylenically unsaturated group (for example, a (meth)acryloyl group, a vinyl group, a styryl group, or the like), a cyclic ether group (for example, an epoxy group, an oxetanyl group, or the like), and the like. In view of making it possible to control polymerization by a radical reaction, as the curable group, an ethylenically unsaturated group is preferable. The ethylenically unsaturated group is not particularly limited, but is preferably a (meth)acryloyl group or a styryl group, and more preferably an acryloyl group.

<Structural Unit A1 and Structural Unit B1 (Suitable Aspect 1 of Resin Containing Curable Group)>

The resin containing a curable group more preferably contains at least one kind of structural unit selected from the group consisting of Formula A1 and Formula B1. The curable composition containing the resin which contains such a structural unit further improves the effects of the present invention.

In the present specification, the structural unit A1 and the structural unit B1 mean structural units different from the structural units A, B, C, and D and a structural unit B2.

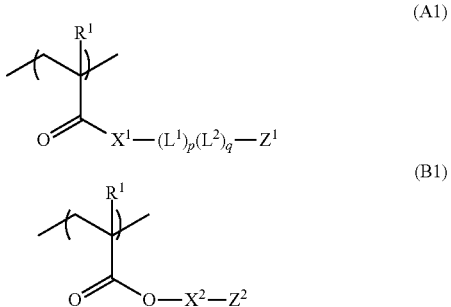

In Formula A1, $R^1$ represents a hydrogen atom or an alkyl group.

$X^1$ represents a single bond or a divalent linking group, and the aspect thereof is as described above.

$L^1$ and $L^2$ represent structural units GF which may be the same as or different from each other, and the aspect thereof is as described above. p and q each represent an integer equal to or greater than 1, and $Z^1$ represents a group containing a curable group. In the present specification, a group containing a curable group means a group containing the curable group described above.

The group containing a curable group represented by $Z^1$ is not particularly limited, and examples thereof include a group represented by -$L^{CR}$-$R^{CR}$. $R^{CR}$ represents the curable group described above, and -$L^{CR}$- represents a divalent linking group having 1 to 20 carbon atoms that may have a nitrogen atom and/or an oxygen atom. As the divalent linking group, an alkylene group containing an oxygen atom is preferable. In Formula B1, $R^1$ represents a hydrogen atom or an alkyl group. $X^2$ represents a single bond or a divalent linking group, and the aspect thereof is as described above. $Z^2$ represents a group containing the curable group described above.

The structural unit A1 can be obtained by polymerizing and/or copolymerizing a macromonomer (for example, a macromonomer B-1 or the like in Examples which will be described later), which is the macromonomer represented by Formula (a3) and contains a reactive group as $Z^3$ (for example, a hydroxyl group or the like) described above and then reacting the resultant with a compound containing a group (for example, an isocyanate group, an epoxy group (containing a glycidyl group and an alicyclic epoxy group), or the like) reacting with $Z^3$ described above and a curable group such that a group containing a curable group is introduced into a terminal of the polymer chain. The structural unit B1 can be obtained in the same manner as described above.

As the compound containing a curable group, the compounds exemplified above in the description of the manufacturing method of the resin containing a curable group and the like can be used without particular limitation.

(Content of Structural Unit A1 and Structural Unit B1 in Resin Containing Curable Group)

The content of the structural unit A1 and the structural unit B1 in the resin containing a curable group is not particularly limited, and is preferably adjusted such that the C=C value in the resin containing a curable group falls into the range described above.

The content of the structural unit A1 in the resin containing a curable group with respect to the total mass of the resin is preferably 3% to 90% by mass, more preferably 30% to 90% by mass, and even more preferably 30% to 80% by mass.

The content of the structural unit B1 in the resin containing a curable group with respect to the total mass of the resin is preferably 3% to 90% by mass, more preferably 5% to 70% by mass, and even more preferably 10% to 60% by mass.

The structural unit A1 and the structural unit B1 may be used singly or used in combination. In a case where the structural unit A1 and the structural unit B1 are used in combination, the total content thereof is preferably within the above range.

In a case where the resin containing a curable group contains the specific resin, some or all of the structural unit A and/or the structural unit B in the specific resin can be substituted with the structural unit A1 and/or the structural unit B1.

<Structural Unit A1 and Structural Unit B2 (Suitable Aspect 2 of Resin Containing Curable Group)>

As another suitable aspect of the resin containing a curable group, a resin containing at least one kind of structural unit selected from the group consisting of Formula A1 and Formula B2 can be exemplified. The curable composition containing the resin containing the structural unit has further improved effects of the present invention.

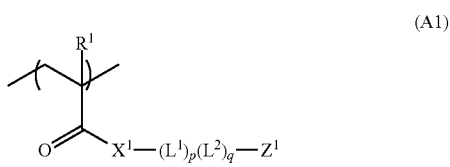

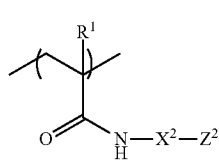
(B2)

In Formula A1, $R^1$ represents a hydrogen atom or an alkyl group, $X^1$ represents a single bond or a divalent linking group, $L^1$ and $L^1$ represent structural units GF which may be the same as or different from each other, p and q each represent an integer equal to or greater than 1, and $Z^1$ represents a group containing a curable group.

In Formula B2, $R^1$ represents a hydrogen atom or an alkyl group, $X^2$ represents a single bond or a divalent linking group, and $Z^2$ represents a group containing a curable group.

The aspects of $R^1$, $X^1$, $L^1$, $L^2$, and $Z^1$ in the structural unit A1 are the same as the aspects of $R^1$, $X^1$, $L^1$, $L^2$, and $Z^1$ in the structural unit A1 described in the suitable aspect 1 of the resin containing a curable group.

The aspects of $R^1$, $X^2$, and $Z^2$ in the structural unit B2 are the same as the aspects of $R^1$, $X^2$, and $Z^2$ in the structural unit B2 described in the suitable aspect 1 of the resin containing a curable group.

The method for obtaining the structural unit A1 is as described above in the suitable aspect 1 of the resin containing a curable group. The method for obtaining the structural unit B2 is as described above in the suitable aspect 1 of the resin containing a curable group.

In view of obtaining a curable composition having further improved effects of the present invention, as the structural unit A1, a structural unit represented by Formula (A0-1) is preferable.

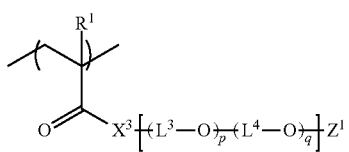
(A0-1)

The aspects of $R^1$, $X^3$, $L^1$, $L^4$, p, and q in Formula (A0-1) are the same as the aspects of $R^1$, $X_3$, $L^3$, $L^4$, p, and q in Formula (A0). Furthermore, $Z^1$ is the same as $Z^1$ in Formula (A1) described above.

(Content of Structural Unit A1 and Structural Unit B2 in Resin Containing Curable Group)

The content of the structural unit A1 and the structural unit B2 in the resin containing a curable group is not particularly limited, but is preferably adjusted such that the C=C value in the resin containing a curable group falls into the above range.

The content of the structural unit A1 in the resin containing a curable group with respect to the total mass of the resin is preferably 3% to 90% by mass, more preferably 30% to 90% by mass, and even more preferably 30% to 80% by mass.

The content of the structural unit B2 in the resin containing a curable group with respect to the total mass of the resin is preferably 3% to 90% by mass, more preferably 5% to 70% by mass, and even more preferably 10% to 60% by mass.

The structural unit A1 and the structural unit B2 may be used singly or used in combination. In a case where the structural unit A1 and the structural unit B2 are used in combination, the total content thereof is preferably within the above range.

In a case where the resin containing a curable group contains the specific resin, some or all of the structural unit A and/or the structural unit B in the specific resin can be substituted with the structural unit A1 and/or the structural unit B2.

[Colorant]

As the colorant, known colorants can be used without particular limitation. As the colorant, various known pigments (coloring pigments), dyes (coloring dyes), and the like can be used.

The content of the colorant in the curable composition is not particularly limited, but is preferably 20% to 99% by mass and more preferably 20% to 80% by mass with respect to the total solid content in the curable composition.

One kind of colorant may be used singly, or two or more kinds of colorants may be used in combination. In a case where two or more kinds of colorants are used in combination, the total content thereof is preferably within the above range.

In a case where the colorant contains a black pigment which will be described later, the effects of the present invention are further improved. The content of the black pigment in the curable composition with respect to the total solid content of the curable composition is preferably equal to or greater than 40% by mass, more preferably equal to or greater than 50% by mass, and even more preferably equal to or greater than 70% by mass.

The upper limit of the content of the black pigment in the curable composition is not particularly limited, but is generally preferably equal to or smaller than 99% by mass with respect to the total solid content in the curable composition.

For example, in a case where a color filter is prepared using the curable composition, as the coloring dye, in addition to dyes of chromatic colors (chromatic dyes) such as red (R), green (G), and blue (B) forming color pixels of the color filter, the colorants described in paragraphs "0027" to "0200" in JP2014-042375A can be used. Furthermore, in a case where a light blocking film (for example, a black matrix or the like which will be described later) is prepared using the curable composition, a black dye can be used.

In a case where a color filter is prepared using the curable composition, as the coloring pigment, pigments of chromatic colors (chromatic pigments) such as red (R), green (G), and blue (B) forming color pixels of the color filter can also be used. Furthermore, in a case where a light blocking film is prepared using the curable composition, a black pigment can be used.

As the pigments of chromatic colors, it is possible to use various inorganic or organic pigments known in the related art. It is preferable that the pigments are inorganic or organic pigments having a high transmittance. Considering this, it is preferable that the pigments are as fine as possible. Considering handleability, the average primary particle diameter of the pigments is preferably 0.01 to 0.1 μm, and more preferably 0.01 to 0.05 μm.

The average primary particle diameter of a pigment can be measured using a transmission electron microscope (TEM). As the transmission electron microscope, for example, a transmission electron microscope HT7700 manufactured by Hitachi High-Technologies Corporation can be used.

For a particle image obtained using a transmission electron microscope, a maximum length (Dmax: maximum length between two points on the contour of the particle image) and a vertical length to maximum length (Dv-max: in a case where the image is interposed between two straight lines parallel to the line of the maximum length, a minimum length of a line vertically connecting the two straight lines) are measured, and the value of geometric mean thereof (Dmax×DV-max)$^{1/2}$ is calculated and adopted as the particle diameter. By this method, particle diameters of 100 particles are measured, and the arithmetic mean thereof is calculated as the average particle diameter and adopted as the average primary particle diameter of the pigment. In the present specification, "average primary particle diameter" in Examples is the same as the arithmetic mean described above.

(Pigment)

As a pigment, known inorganic pigments and/or organic pigments can be used without particular limitation.

Inorganic Pigment

As the inorganic pigment, known inorganic pigments can be used without particular limitation.

Examples of the inorganic pigment include zinc oxide, white lead, lithopone, titanium oxide, chromium oxide, iron oxide, precipitated barium sulfate and barite powder, red lead, red iron oxide, chromium yellow, zinc chromium (one kind of zinc chromium or two kinds of zinc chromium), ultramarine blue, Prussian blue (potassium ferric ferrocyanide), zircon grey, Praseodymium yellow, chromium titanium yellow, chromium green, peacock, Victoria green, iron blue (not Prussian blue), vanadium zirconium blue, chromium tin pink, manganese pink, salmon pink, and the like. Examples of inorganic black pigments include a metal oxide, a metal nitride, a metal oxynitride, and the like containing one kind of metal element or two or more kinds of metal elements selected from the group consisting of Co, Cr, Cu, Mn, Ru, Fe, Ni, Sn, Ti, and Ag. The inorganic pigment may have undergone a surface modification treatment. For example, the inorganic pigment may have undergone a surface modification treatment using a unique surface treatment agent having a silicone group and an alkyl group in combination. Examples of such an inorganic pigment include a "KTP-09" series (manufactured by Shin-Etsu Chemical Co., Ltd.).

As the inorganic pigment, carbon black, titanium black, a metal pigment, and the like (referred to as "black pigment" as well) are preferable because these pigments make it possible to obtain a curable composition which can form a cured film having a high optical density even though the content of these pigments is small. Examples of the metal pigment include a metal oxide or a metal nitride containing one kind of metal element or two or more kinds of metal elements selected from the group consisting of Nb, V, Co, Cr, Cu, Mn, Ru, Fe, Ni, Sn, Ti, Zr, and Ag.

The black pigment preferably contains at least one kind of metal pigment selected from the group consisting of a metal pigment containing titanium nitride, titanium oxynitride, niobium nitride, niobium oxynitride, vanadium nitride, vanadium oxynitride, zirconium nitride, zirconium oxynitride, silver, or tin and metal pigments containing silver and tin, and more preferably contains at least one kind of compound selected from the group consisting of titanium oxynitride, titanium nitride, niobium oxynitride, niobium nitride, zirconium oxynitride, and zirconium nitride.

As the black pigment, carbon black can also be used. Specific examples of the carbon black include an organic pigment such as C. I. Pigment Black 1 which is a commercial product and an inorganic pigment such as C. I. Pigment Black 7 which is a commercial product, but the carbon black is not limited to these.

In the present specification, titanium nitride means TiN, and may contain oxygen atoms that are inevitably incorporated into the compound in the manufacturing process (for example, oxygen atoms that are generated in a case where the surface of TiN particles are unintentionally oxidized, and the like).

In the present specification, titanium nitride means a compound which is found to have an angle of diffraction 2θ of a peak resulting from a (200) plane of 42.5° to 42.8° in a case where CuKα radiation is used as an X-ray source.

Furthermore, in the present specification, titanium oxynitride means a compound which is found to have an angle of diffraction 2θ of a peak resulting from a (200) plane of greater than 42.8° in a case where CuKα radiation is used as an X-ray source. The upper limit of the angle of diffraction 2θ of the titanium oxynitride is not particularly limited, but is preferably equal to or smaller than 43.5°.

Examples of the titanium oxynitride include titanium black and the like. More specifically, examples thereof include an aspect in which the compound contains low-order titanium oxide represented by $TiO_2$ or $Ti_nO_{2n-1}$ (1≤n≤20) and/or titanium oxynitride represented by $TIN_xO_y$ (0<x<2.0, 0.1<y<2.0). In the following description, titanium nitride (angle of diffraction 2θ: 42.5° to 42.8°) and titanium oxynitride (angle of diffraction 2θ: greater than 42.8°) will be collectively called titanium nitride, and the aspect thereof will be explained.

In a case where the X-ray diffraction spectrum of the titanium nitride is measured using CuKα radiation as an X-ray source, as peaks of highest intensity, a peak resulting from a (200) plane of TiN is observed at around 2θ=42.5°, and a peak resulting from a (200) plane of TiO is observed at around 2θ=43.4°. Meanwhile, a peak resulting from a (200) plane of anatase-type $TiO_2$ is observed at around 2θ=48.1°, and a peak resulting from a (200) plane of rutile-type $TiO_2$ is observed at around 2θ=39.2°, although these peaks are not peaks of highest intensity. Accordingly, as the amount of oxygen atoms contained in the titanium oxynitride increases, the peak position shifts to a higher angle side compared to 42.5°.

In a case where the titanium nitride contains titanium oxide $TiO_2$, as peaks of highest intensity, a peak resulting from anatase-type $TiO_2$ (101) is observed at around 2θ=25.3°, and a peak resulting from rutile-type $TiO_2$ (110) is observed at around 2θ=27.4°. However, because $TiO_2$ is white and becomes a factor of deteriorating light blocking properties of a light blocking film obtained by curing the curable composition, it is preferable to reduce the amount of $TiO_2$ such that the compound is not observed as a peak.

From the half-width of the peak obtained by the measurement of an X-ray diffraction spectrum described above, the size of crystallites constituting the titanium nitride can be determined. The crystallite size can be calculated using the Scherrer equation.

The size of crystallites constituting the titanium nitride is preferably equal to or smaller than 50 nm, and preferably equal to or greater than 20 nm. In a case where the crystallite size is 20 to 50 nm, an ultraviolet (particularly, i line (365 nm)) transmittance of the light blocking film formed of the curable composition is easily increased, and a curable composition having higher photosensitivity is obtained.

The specific surface area of the titanium nitride is not particularly limited, and can be determined by a BET (Brunauer, Emmette, Teller) method. The specific surface area of the titanium nitride is preferably 5 to 100 m²/g, and more preferably 10 to 60 m²/g.

The manufacturing method of the black pigment is not particularly limited, and known manufacturing methods can be used. Examples thereof include a gas-phase reaction method. Examples of the gas-phase reaction method include an electric furnace method, a thermal plasma method, and the like. Among these, a thermal plasma method is preferable because this method reduces the amount of impurities mixed in, makes it easy to obtain a uniform particle diameter, and has high productivity.

The method for generating thermal plasma in the thermal plasma method is not particularly limited, and examples thereof include direct current discharge, multilayer arc discharge, radio frequency (RF) plasma, hybrid plasma, and the like. Among these, radio frequency plasma is more preferable because this reduces the amount of impurities mixed in from an electrode.

The specific manufacturing method of the black pigment using the thermal plasma method is not particularly limited. Examples thereof include a manufacturing method of titanium nitride such as a method of reacting titanium tetrachloride and ammonia gas in plasma flame (JP1990-022110A (JP-H02-022110A)), a method of evaporating titanium powder by using radio frequency thermal plasma, introducing nitrogen as carrier gas, and performing nitriding by a cooling process so as to synthesize the pigment (JP1986-011140A (JP-S61-011140A)), a method of blowing ammonia gas into the peripheral portion of plasma (JP1988-085007A (JP-S63-085007A)), and the like.

Here, the manufacturing method of the black pigment is not limited to the above. As long as a black pigment having the desired physical properties is obtained, the manufacturing method is not limited.

The black pigment may contain a layer of a silicon-containing compound on a surface thereof. That is, the (oxy)nitride of the aforementioned metal atom may be coated with a silicon-containing compound and used as a black pigment.

As the method for coating the (oxy)nitride of the metal atom, known methods can be used without particular limitation. Examples thereof include the method described on pp. 2-4 in JP1978-033228A (JP-S53-033228A) (in this method, instead of a titanium oxide, the (oxy)nitride of the metal atom is used), the method described in paragraphs "0015" to "0043" in JP2008-069193A (in this method, instead of titanium dioxide particles, the (oxy)nitride of the metal atom is used), and the method described in paragraph "0020" and paragraphs "0124" to "0138" in JP2016-074870A (in this method, instead of metal oxide particles, the (oxy)nitride of the metal atom is used). The contents of the above documents are incorporated into the present specification.

In the curable composition described above, in addition to the pigment described as a black pigment, a pigment having infrared absorptivity can also be used.

As the pigment having infrared absorptivity, a tungsten compound, a metal boride, and the like are preferable. Among these, a tungsten compound is preferable because this compound exhibits excellent light blocking properties at a wavelength of an infrared range. The tungsten compound is preferable particularly because this compound exhibits excellent light transmitting properties in a wavelength range, in which the polymerization initiator relating to the curing efficiency by exposure absorbs light, and in a range of visible rays.

Two or more kinds of pigments described above may be used in combination, or the pigments described above may be used in combination with the dyes which will be described later. In order to adjust tint and to improve the light blocking properties in the desired wavelength range, for example, an aspect can be adopted in which the black pigment or the pigment having infrared blocking properties is mixed with a chromatic pigment of red, green, yellow, orange, purple, blue, or the like or with the dyes which will be described later. The black pigment or the pigment having infrared blocking properties is preferably mixed with a red pigment or dye or with a purple pigment or dye, and more preferably mixed with a red pigment.

Furthermore, a near-infrared absorber or an infrared absorber which will be described later may be added.

Organic Pigment

Examples of the organic pigment include Color Index (C. I.) Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, 214, and the like, C. I. Pigment Orange 2, 5, 13, 16, 17:1, 31, 34, 36, 38, 43, 46, 48, 49, 51, 52, 55, 59, 60, 61, 62, 64, 71, 73, and the like, C. I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, 279, and the like; and C. I. Pigment Green 7, 10, 36, 37, 58, 59, and the like; C. I. Pigment Violet 1, 19, 23, 27, 32, 37, 42, and the like; C. I. Pigment Blue 1, 2, 15, 15:1, 15:2, 15:3, 15:4, 15:6, 16, 22, 60, 64, 66, 79, 80, and the like. One kind of pigment may be used singly, or two or more kinds of pigments may be used in combination.

(Dye)

As the dye, for example, it is possible to use the coloring agents disclosed in JP1989-090403A (JP-S64-090403A), JP1989-091102A (JP-S64-091102A), JP1989-094301A (JP-H01-094301A), JP1994-011614A (JP-H06-011614A), JP2592207B, U.S. Pat. Nos. 4,808,501A, 5,667,920A, 0,505,950A. JP1993-333207A (JP-H05-333207A), JP1994-035183A (JP-H06-035183A), JP1994-051115A (JP-H06-051115A). JP1994-194828A (JP-H06-194828A), and the like. As dyes sorted based on the chemical structure, it is possible to use a pyrazole azo compound, a pyrromethene compound, an anilinoazo compound, a triphenylmethane compound, an anthraquinone compound, a benzylidene compound, an oxonol compound, a pyrazolotriazole azo compound, a pyridone azo compound, a cyanine compound, a phenothiazine compound, a pyrrolopyrazole azomethine compound, and the like. Furthermore, as the dye, a coloring agent multimer may also be used. Examples of the coloring agent multimer include the compounds described in JP2011-213925A and JP2013-041097A. In addition, a polymerizable dye having a polymerizable group in a molecule may be used, and examples thereof include commercial products such as a RDW series manufactured by Wako Pure Chemical Industries, Ltd.

(Infrared Absorber)

The aforementioned colorant may contain an infrared absorber.

The infrared absorber means a compound absorbing light in a wavelength range of infrared (preferably at a wavelength of 650 to 1,300 nm). The infrared absorber is preferably a compound having a maximum absorption wavelength in a range of a wavelength of 675 to 900 nm.

Examples of the colorant having such spectral characteristics include a pyrrolopyrrole compound, a copper compound, a cyanine compound, a phthalocyanine compound, an iminium compound, a thiol complex-based compound, a transition metal oxide-based compound, a squarylium compound, a naphthalocyanine compound, a quaterrylene compound, a dithiol metal complex-based compound, a croconium compound, and the like.

As the phthalocyanine compound, the naphthalocyanine compound, the iminium compound, the cyanine compound, the squarylium compound, and the croconium compound, the compounds disclosed in paragraphs "0010" to "0081" in JP2010-111750A may be used, and the contents thereof are incorporated into the present specification. Regarding the cyanine compound, for example, "Functional Dyes, Makoto Okawara/Masaru Matsuoka/Teijiro Kitao/Tsuneaki Hirashima, Kodansha Scientific Ltd." can be referred to, and the contents thereof are incorporated into the present specification.

As the colorant having the spectral characteristics described above, it is possible to use the compound disclosed in paragraphs "0004" to "0016" in JP1995-164729A (JP-H07-164729A), the compound disclosed in paragraphs "0027" to "0062" in JP2002-146254A, and the near-infrared absorption particles disclosed in paragraphs "0034" to "0067" in JP2011-164583A that are formed of crystallites of an oxide containing Cu and/or P and have a number-average aggregated particle diameter of 5 to 200 nm.

As the compound having a maximum absorption wavelength in a range of a wavelength of 675 to 900 nm, at least one kind of compound selected from the group consisting of a cyanine compound a pyrrolopyrrole compound, a squarylium compound a phthalocyanine compound, and a naphthalocyanine compound is preferable.

Furthermore, the infrared absorber is preferably a compound which dissolves in an amount equal to or greater than 1% by mass in water at 25° C., and more preferably a compound which dissolves in an amount equal to or greater than 10% by mass in water at 25° C. In a case where such a compound is used, solvent resistance becomes excellent.

Regarding the pyrrolopyrrole compound, paragraphs "0049" to "0062" in JP2010-222557A can be referred to, and the contents thereof are incorporated into the present specification. Regarding the cyanine compound and the squarylium compound, paragraphs "0022" to "0063" in WO2014/088063A, paragraphs "0053" to "0118" in WO2014/030628A, paragraphs "0028" to "0074" in JP2014-059550A, paragraphs "0013" to "0091" in WO2012/169447A, paragraphs "0019" to "0033" in JP2015-176046A, paragraphs "0053" to "0099" in JP2014-063144A, paragraphs "0085" to "0150" in JP2014-052431A, paragraphs "0076" to "0124" in JP2014-044301A, paragraphs "0045" to "0078" in JP2012-008532A, paragraphs "0027" to "0067" in JP2015-172102A, paragraphs "0029" to "0067" in JP2015-172004A, paragraphs "0029" to "0085" in JP2015-040895A, paragraphs "0022" to "0036" in JP2014-126642A, paragraphs "0011" to "0017" in JP2014-148567A, paragraphs "0010" to "0025" in JP2015-157893A, paragraphs "0013" to "0026" in JP2014-095007A, paragraphs "0013" to "0047" in JP2014-080487A, paragraphs "0007" to "0028" in JP2013-227403A. and the like can be referred to, and the contents of these publications are incorporated into the present specification.

As the infrared absorber, at least one kind of compound selected from the group consisting of compounds represented by Formulae 1 to 3 is preferable.

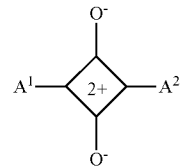

Formula 1

In Formula 1, $A^1$ and $A^2$ each independently represent an aryl group, a heteroaryl group, or a group represented by Formula 1-A.

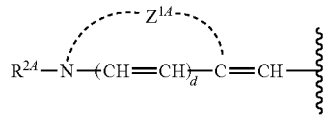

Formula 1-A

In Formula 1-A, $Z_{1A}$ represents a group of nonmetallic atoms forming a nitrogen-containing heterocyclic ring. $R^{24}$ represents an alkyl group, an alkenyl group, or an aralkyl group, d represents 0 or 1, and the wavy line represents a bond.

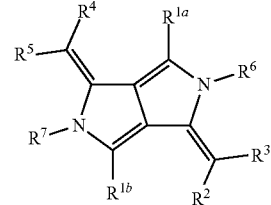

Formula 2

In Formula 2, $R^{1a}$ and $R^{1b}$ each independently represent an alkyl group, an aryl group, or a heteroaryl group, $R^2$ to $R^5$ each independently represent a hydrogen atom or a substituent, $R^2$ and $R^3$ as well as $R^4$ and $R^5$ may form a ring by being bonded to each other, $R^6$ and $R^7$ each independently represent a hydrogen atom, an alkyl group, an aryl group, a heteroaryl group, —$BR^AR^B$, or a metal atom, $R^A$ and $R^B$ each independently represent a hydrogen atom or a substituent, $R^6$ may form a covalent bond or a coordinate bond with $R^{1a}$ or $R^3$, and $R^7$ may form a covalent bond or a coordinate bond with $R^{1b}$ or $R^5$.

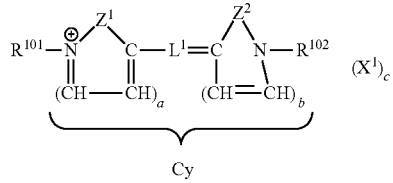

Formula 3

In Formula 3. $Z^1$ and $Z^2$ each independently represent a group of nonmetallic atoms forming a 5-membered or 6-membered nitrogen-containing heterocyclic ring which may be fused; $R^{101}$ and $R^{102}$ each independently represent an alkyl group, an alkenyl group, an alkynyl group, an aralkyl group, or an aryl group; $L^1$ represents a methine chain formed of an odd number of methine molecules; a and b each independently represent 0 or 1; in a case where a is 0, a carbon atom and a nitrogen atom are bonded to each other through a double bond; in a case where b is 0, a carbon atom and a nitrogen atom are bonded to each other through a single bond; in a case where the moiety represented by Cy in the formula is a cation portion, $X^1$ represents an anion, and c represents a number necessary for achieving charge balance; in a case where the moiety represented by Cy in the formula is an anion portion, $X^1$ represents a cation, and c represents a number necessary for achieving charge balance; and in case where the charge of the moiety represented by Cy in the formula is neutralized in a molecule, c is 0.

(Pigment Derivative)

The curable composition may contain a pigment derivative. As the pigment derivative, a compound is preferable which has a structure established by substituting a portion of an organic pigment with an acidic group, a basic group, or a methyl phthalimide group. As the pigment derivative, from the viewpoint of dispersibility and dispersion stability of the colorant, a pigment derivative having an acidic group or a basic group is preferable. Particularly, a pigment derivative having a basic group is preferable. Furthermore, as a combination of the aforementioned resin (dispersant) and the pigment derivative, a combination of the dispersant which is an acidic dispersant and the pigment derivative which has a basic group is preferable.

Examples of the organic pigment for constituting the pigment derivative include a diketopyrrolopyrrole-based pigment, an azo-based pigment, a phthalocyanine-based pigment, an anthraquinone-based pigment, a quinacridone-based pigment, a dioxazine-based pigment, a perinone-based pigment, a perylene-based pigment, a thioindigo-based pigment, an isoindoline-based pigment, an isoindolinone-based pigment, a quinophthalone-based pigment, a threne-based pigment, a metal complex-based pigment, and the like.

As the acidic group contained in the pigment derivative, a sulfonic acid group, a carboxylic acid group, and salt of these are preferable, a carboxylic acid group and a sulfonic acid group are more preferable, and a sulfonic acid group is even more preferable. As the basic group contained in the pigment derivative, an amino group is preferable, and a tertiary amino group is more preferable.

[Polymerization Inhibitor]

As the polymerization inhibitor, known polymerization inhibitors can be used without particular limitation. Examples of the polymerization inhibitor include a phenol-based polymerization inhibitor (for example, p-methoxyphenol, 2,5-di-tert-butyl-4-methylphenol, 2,6-di-tert-butyl-4-methylphenol, 4,4'-thiobis(3-methyl-6-t-butylphenol), 2,2'-methylenebis(4-methyl-6-t-butylphenol), 4-methoxynaphthaol, or the like), a hydroquinone-based polymerization inhibitor (for example, hydroquinone, 2,6-di-tert-butylhydroquinone, or the like); a quinone-based polymerization inhibitor (for example, benzoquinone or the like), a free radical-based polymerization inhibitor (examples thereof will be described later); a nitrobenzene-based polymerization inhibitor (for example, nitrobenzene, 4-nitrotoluene, or the like); a phenothiazine-based polymerization inhibitor (for example, phenothiazine, 2-methoxyphenothiazine, or the like); and the like.

In the present specification, a free radical-based polymerization inhibitor means a polymerization inhibitor capable of trapping a radical.

Examples of the free radical-based polymerization inhibitor include nitroso compounds such as p-nitrosophenol, nitrobenzene, N-nitrosodiphenylamine, isononyl nitrite, N-nitrosocyclohexylhydroxylamine. N-nitrosophenylhydroxylamine, N,N'-dinitrosophenylenediamine, and salts of these; hindered amine compounds such as 2,2,6,6-tetramethylpiperidin-1-oxyl (in the present specification, referred to as "TEMPO" as well), TEMPO-H(2,2,6,6-tetramethyl-1-piperidinol, another name: 2,2,6,6-tetramethyl-1-hydroxypiperidine), 4-hydroxy-2,2,6,6-tetramethylpiperidin-1-oxyl (in the present specification, referred to as "H-TEMPO" as well), H-TEMPO-H(4-hydroxy-2,2,6,6-tetramethyl-1-hydroxypiperidine), 4-oxo-2,2,6,6-tetramethylpiperidin-1-oxyl (in the present specification, referred to as "OXO-TEMPO" as well), and OXO-TEMPO-H(4-oxo-2,2,6,6-tetramethyl-1-oxypiperidine); and the like.

Among these, in view of further improving the effects of the present invention that the curable composition has, at least one kind of compound selected from the group consisting of a phenol-based polymerization inhibitor and a free radical-based polymerization inhibitor is preferable as the polymerization inhibitor.

Furthermore, in view of further improving the effects of the present invention that the curable composition has, as the polymerization inhibitor, a free radical-based polymerization inhibitor is more preferable, and a hindered amine compound is even more preferable.

In a case where a free radical-based polymerization inhibitor is used as a polymerization inhibitor, the temporal stability of the curable composition and/or the colorant dispersion is further improved.

Particularly, in a case where the colorant dispersion contains a free radical-based polymerization inhibitor, it is possible to effectively inhibit the resin, which contains a curable group, in the colorant dispersion from being unintentionally polymerized. As a result, the curable composition prepared using the colorant dispersion has further improved effects of the present invention.

It is preferable that the curable composition contains two or more kinds of polymerization inhibitors (uses two or more kinds of polymerization inhibitors in combination). In a case where two or more kinds of polymerization inhibitors are used in combination, the combination of the polymerization inhibitors is not particularly limited. In view of further improving the effects of the present invention, the polymerization inhibitors are preferably selected from the group consisting of a phenol-based polymerization inhibitor and a free radical-based polymerization inhibitor. Particularly, the curable composition preferably contains one or more kinds of phenol-based polymerization inhibitors and one or more kinds of free radical-based polymerization inhibitors as a polymerization inhibitor, and the phenol-based polymerization inhibitors are even more preferably hindered amine compounds.

Examples of the preferable combination of two or more kinds of polymerization inhibitors include (1) to (3) described below.

(1) Phenol-based polymerization inhibitor and phenol-based polymerization inhibitor (2) Phenol-based polymerization inhibitor and free radical-based polymerization inhibitor (3) Free radical-based polymerization inhibitor and free radical-based polymerization inhibitor For example, the combination (3) is not particularly limited, and examples thereof include a combination of two or more kinds of compounds selected from the group consisting of TEMPO, H-TEMPO, and OXO-TEMPO.

The content of the polymerization inhibitor in the curable composition is not particularly limited. In view of further improving the temporal stability of the colorant dispersion which will be described later and in view of further improving the curing properties of the curable composition, the total content of the polymerization inhibitor with respect to the total solid content in the curable composition is preferably 0.001% to 1.0% by mass. In view of further improving the effects of the present invention that the curable composition has, the total content of the polymerization inhibitor is more preferably 0.01% to 0.5% by mass. Herein, the total content of the polymerization inhibitor refers to the content of one kind of polymerization inhibitor in a case where the curable composition contains one kind of polymerization inhibitor, and refers to the content of two or more kinds of polymerization inhibitors in a case where the curable composition contains two or more kinds of polymerization inhibitors.

The effect of the polymerization inhibitor becomes marked particularly in a case where the polymerization inhibitor is used together with the resin containing a curable group. For example, even in a case where the temperature of the colorant dispersion and/or the curable composition becomes high, such as a case where the process of preparing the colorant dispersion, which will be described later, is being performed or has been finished or a case where the process of preparing the curable composition is being performed or has been finished, a case where the either or both of the colorant dispersion and the curable composition are stored for a long period of time, or in a case where it is apprehended that the polymerization of the resin containing a curable group may proceed, the colorant dispersion and/or the curable composition can be used without a problem.

[Polymerization Initiator]

As the polymerization initiator, known polymerization initiators can be used without particular limitation. Examples of the polymerization initiator include a photo-polymerization initiator, a thermal polymerization initiator, and the like. Among these, a photopolymerization initiator is preferable. As the polymerization initiator, a so-called radical polymerization initiator is preferable.

The content of the polymerization initiator with respect to the total solid content in the curable composition is preferably 0.1% to 30% by mass, and more preferably 1.0% to 8.0% by mass.

One kind of polymerization initiator may be used singly, or two or more kinds of polymerization initiators may be used in combination. In a case where two or more kinds of polymerization initiators are used in combination, the total content thereof is preferably within the above range.

Furthermore, it is preferable to adjust the content of the polymerization initiator in the curable composition such that the relationship, which was described above, of the mass ratio between the content of the polymerization initiator and the content of the resin containing a curable group is satisfied.

Examples of the thermal polymerization initiator include an azo compound such as 2,2'-azobisisobutyronitrile (AIBN), 3-carboxypropionitrile, azobismalenonitrile, or dimethyl-(2,2')-azobis(2-methylpropionate) [V-601] and an organic peroxide such as benzoyl peroxide, lauroyl peroxide, or potassium peroxide.

Specific examples of the polymerization initiator include the polymerization initiators described in "Ultraviolet Curing System", Kiyomi Kato, United Engineering Co., Ltd., 1989, pp. 65-148, and the like.

<Photopolymerization Initiator>

It is preferable that the curable composition contains a photopolymerization initiator. As the photopolymerization initiator, known photopolymerization initiators can be used without particular limitation.

Examples of the photopolymerization initiator include an alkylphenone-based photopolymerization initiator, an acyl phosphine oxide-based photopolymerization initiator, an oxime ester-based photopolymerization initiator, and the like.

In view of further improving the effects of the present invention that the curable composition has, it is preferable that the curable composition contains an oxime ester-based photopolymerization initiator among the above compounds.

More specifically, examples of the photopolymerization initiator include a halogenated hydrocarbon derivative (for example, a halogenated hydrocarbon derivative containing a triazine skeleton, a halogenated hydrocarbon derivative containing an oxadiazole skeleton, or the like), an acyl phosphine compound such as acyl phosphine oxide, hexaaryl biimidazole, an oxime compound such as an oxime derivative, an organic peroxide, a thio compound, a ketone compound, an aromatic onium salt, ketoxime ether, an aminoacetophenone compound, hydroxyacetophenone, and the like.

Particularly, in a case where the curable composition is used for preparing a light blocking film, it is necessary to form a fine pattern having a sharp shape. Therefore, it is important for the curable composition to have curing properties and to be developed without leaving a residue in an unexposed portion. From this point of view, it is preferable to use an oxime compound as a photopolymerization initiator. Particularly, for forming a fine pattern, a stepper exposure machine is used for exposure for curing. This exposure machine is damaged by halogen in some cases, and accordingly, the amount of the photopolymerization initiator added needs to be reduced. Considering these points, for forming a fine pattern, it is particularly preferable to use an oxime compound as a photopolymerization initiator.

Regarding specific examples of the photopolymerization initiator, for example, paragraphs "0265" to "0268" in JP2013-029760A can be referred to, and the contents thereof are incorporated into the present specification.

As the photopolymerization initiator, a hydroxyacetophenone compound, an aminoacetophenone compound, and an acyl phosphine compound can also be suitably used. More specifically, for example, it is also possible to use the aminoacetophenone-based initiator described in JP1998-291969A (JP-H10-291969A) and the acyl phosphine-based initiator described in JP4225898B.

As the hydroxyacetophenone compound, it is possible to use IRGACURE-184, DAROCUR-1173, IRGACURE-500, IRGACURE-2959, and IRGACURE-127 (trade names: manufactured by BASF SE).

As the aminoacetophenone compound, it is possible to use commercial products such as IRGACURE-907, IRGACURE-369, and IRGACURE-379EG (trade names: manufactured by BASF SE). As the aminoacetophenone compound, it is also possible to use the compound described in JP2009-191179A whose absorption wavelength is matched with a light source of a long wavelength such as 365 nm, 405 nm, or the like.

As the acyl phosphine compound, it is possible to use commercial products such as IRGACURE-819 and IRGACURE-TPO (trade names: manufactured by BASF SE).

Oxime Ester-Based Photopolymerization Initiator

Examples of more preferable photopolymerization initiators include an oxime ester-based photopolymerization initiator (oxime compound). The oxime compound is particularly preferable because this compound has high sensitivity and high polymerization efficiency, makes it possible to cure the curable composition regardless of the concentration of the colorant, and makes it easy to design the concentration of the colorant to be high.

Specific examples of the oxime compound include the compound described in JP2001-233842A, the compound described in JP2000-080068A, and the compound described in JP2006-342166A.

Examples of the oxime compound include 3-benzoyloxyiminobutan-2-one, 3-aceotxyiminobutan-2-one, 3-propionyloxyiminobutane-2-one, 2-acetoxyiminopentan-3-one, 2-acetoxyimino-1-phenylpropan-1-one, 2-benzoyloxyimino-1-phenylpropan-1-one, 3-(4-toluenesulfonyloxy)iminobutan-2-one, 2-ethoxycarbonyloxyimino-1-phenylpropan-1-one, and the like.

Examples of the oxime compound also include the compounds described in J. C. S. Perkin II (1979) pp. 1653-1660, J. C. S. Perkin II (1979) pp. 156-162, Journal of Photopolymer Science and Technology (1995) pp. 202-232. JP2000-066385A, JP2000-080068A, JP2004-534797A, and JP2006-342166A, and the like.

As a commercial product, IRGACURE-OXE01 (manufactured by BASF SE), IRGACURE-OXE02 (manufactured by BASF SE), IRGACURE-OXE03 (manufactured by BASF SE), or IRGACURE-OXE04 (manufactured by BASF SE) is also suitably used. Furthermore, TR-PBG-304 (manufactured by TRONLY), ADEKA ARKLS NCI-831 and ADEKA ARKLS NCI-930 (manufactured by ADEKA CORPORATION), or N-1919 (carbazole-oxime ester skeleton-containing photoinitiator (manufactured by ADEKA CORPORATION)) can also be used.

As oxime compounds other than those described above, the compound described in JP2009-519904A in which oxime is linked to N-position of carbazole; the compound described in U.S. Pat. No. 7,626,957B in which a hetero substituent is introduced into a benzophenone moiety; the compound described in JP2010-015025A and US2009/0292039A in which a nitro group is introduced into the moiety of a coloring agent; the ketoxime compound described in WO2009/131189A; the compound described in U.S. Pat. No. 7,556,910B that contains a triazine skeleton and an oxime skeleton in the same molecule; the compound described in JP2009-221114A that has maximal absorption at 405 nm and exhibits excellent sensitivity with respect to a light source of g-line; and the like may also be used.

For example, paragraphs "0274" and "0275" in JP2013-029760A can be preferably referred to, and the contents thereof are incorporated into the present specification.

Specific examples of the oxime compound preferably used in the curable composition are shown below. Furthermore, as the oxime compound, the compound described in Table 1 in WO2015/036910A can also be used, and the contents thereof are incorporated into the present specification.

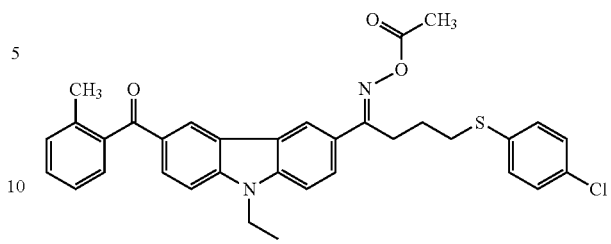
(C-1)

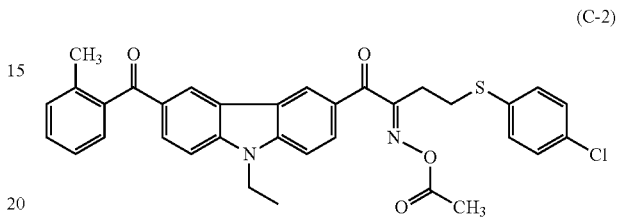
(C-2)

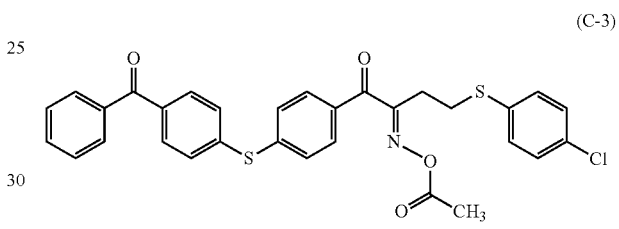
(C-3)

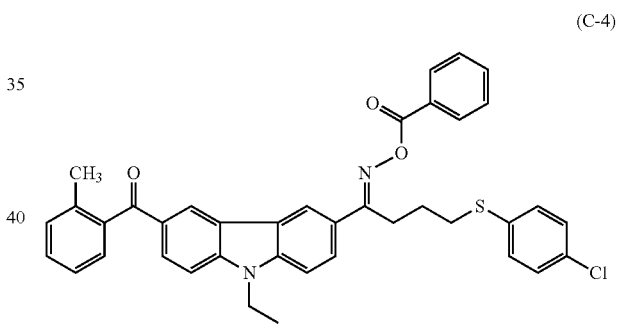
(C-4)

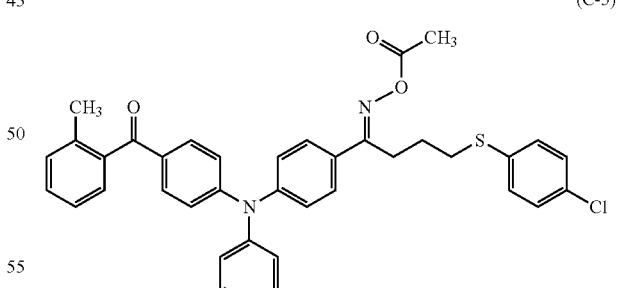
(C-5)

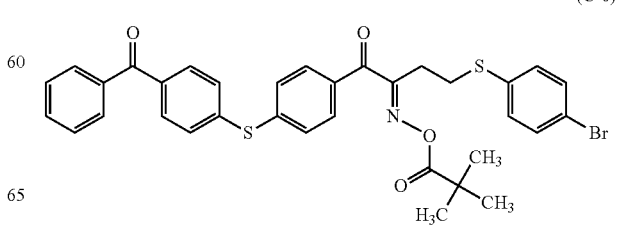
(C-6)

(C-7) 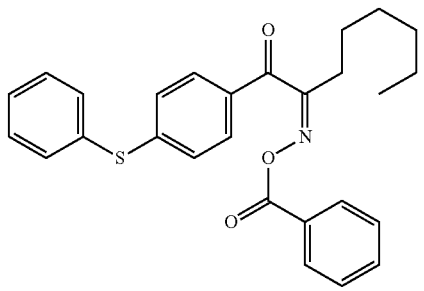

(C-8) 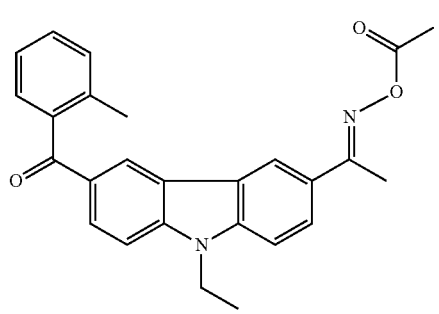

(C-9) 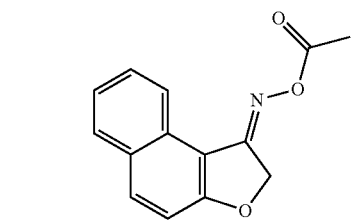

(C-10) 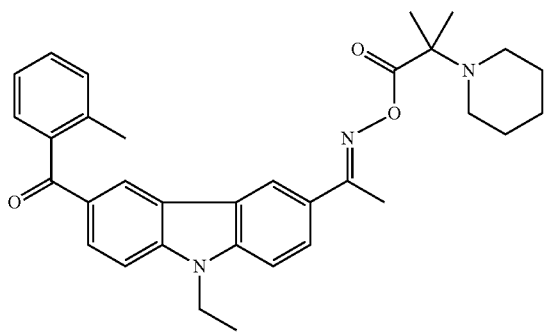

(C-11) 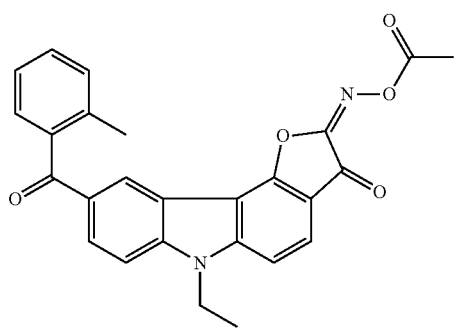

(C-12) 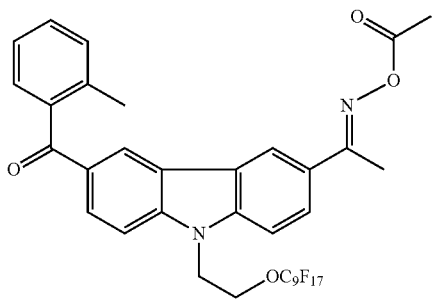

(C-13) 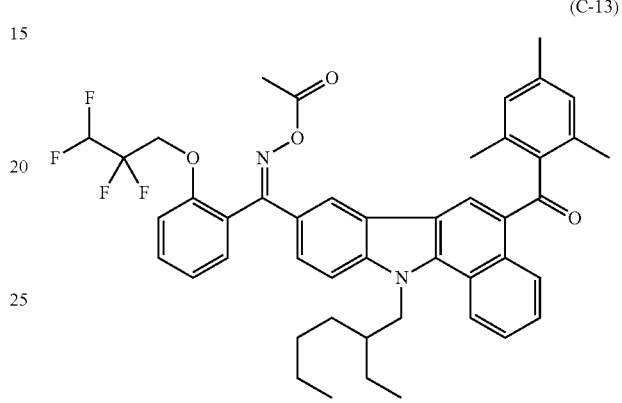

As the photopolymerization initiator, a compound having two functional groups or three or more functional groups may be used. Specific examples of such a compound include dimers of the oxime compounds described in JP2010-527339A, JP2011-524436A, WO2015/004565A, paragraphs "0407" to "0412" in JP2016-532675A, and paragraphs "0039" to "0055" in WO2017/033680A, the compounds (E) and (G) described in JP2013-522445A, and Cmpd 1 to 7 described in WO2016/034963A.

[Optional Component]

[Another Resin]

It is preferable that the curable composition contains another resin. In the present specification, another resin means a resin which is different from the resin containing a curable group described above and does not contain a curable group.

The content of another resin in the curable composition is not particularly limited. However, in view of further improving the effects of the present invention that the curable composition has, the content of another resin with respect to the total solid content in the curable composition is preferably 0.5% to 15% by mass.

One kind of another resin may be used singly, or two or more kinds of other resins may be used in combination. In a case where two or more kinds of other resins are used in combination, the total content thereof is preferably within the above range.

It is preferable that another resin has an action of further improving the solubility of an unexposed portion in an alkaline developer by experiencing the change of the polarity by the alkaline developer in a development step which will be described later. It is preferable the aforementioned another resin contains at least one alkali-soluble group in a molecule, and examples thereof include a polyhydroxystyrene-based resin, a polysiloxane-based resin, a (meth)acrylic resin, a (meth)acrylamide-based resin, a (meth)acryl/(meth)

acrylamide copolymer resin, an epoxy-based resin, a polyimide-based resin, and the like.

The alkali-soluble group is not particularly limited, and examples thereof include a carboxylic acid group, a phosphoric acid group, a sulfonic acid group, a phenolic hydroxyl group, and the like. Only one kind of alkali-soluble group may be used, or two or more kinds of alkali-soluble groups may be used.

As another resin, for example, a resin is preferable which is a linear organic polymer and contains at least one alkali-soluble group in a molecule (preferably a molecule having a (meth)acrylic copolymer or a styrene-based copolymer as a main chain) (hereinafter, in the present specification, a resin which does not contain a curable group and contains an alkali-soluble group is particularly referred to as "alkali-soluble resin" as well).

Examples of such an alkali-soluble resin include a radical polymer containing a carboxylic acid group in a side chain. Examples of the radical polymer containing a carboxylic acid group in a side chain include the polymers described in JP1984-044615A (JP-S59-044615A), JP1979-034327B (JP-S54-034327B), JP1983-012577B (JP-S58-012577B), JP1979-025957B (JP-S54-025957B), JP1979-092723A (JP-S54-092723A), JP1984-053836A (JP-S59-053836A), and JP1984-071048A (JP-S59-071048A). Examples of the radical polymer containing a carboxylic acid group in a side chain include a resin obtained by homopolymerizing or copolymerizing a monomer containing a carboxylic acid group, a resin obtained by hydrolyzing, half-esterifying, or half-amidating an acid anhydride unit obtained by homopolymerizing or copolymerizing a monomer containing an acid anhydride, epoxy acrylate obtained by modifying an epoxy resin with unsaturated monocarboxylic acid and an acid anhydride, and the like.

Examples of the monomer containing a carboxylic acid group include acrylic acid, methacrylic acid, itaconic acid, crotonic acid, maleic acid, fumaric acid, 4-carboxyl styrene, and the like. Examples of the monomer containing a carboxylic acid group also include an acidic cellulose derivative containing a carboxylic acid group in a side chain.

Examples of the monomer containing an acid anhydride include maleic acid anhydride and the like. In addition, a compound obtained by adding a cyclic acid anhydride to a polymer containing a hydroxyl group, and the like are also useful.

In addition, acetal-modified polyvinyl alcohol-based alkali-soluble resins containing an acid group are described in EP993966B, EP 204000B, JP2001-318463A, and the like. The acetal-modified polyvinyl alcohol-based alkali-soluble resins containing an acid group are suitable because these resins are excellent in balance between film hardness and developability.

Furthermore, as a water-soluble linear organic polymer, polyvinyl pyrrolidone, polyethylene oxide, or the like is useful. In addition, for improving the hardness of a cured film, alcohol-soluble nylon, polyether which is a product of a reaction between 2,2-bis-(4-hydroxyphenyl)-propane and epichlorohydrin, and the like are also useful.

Moreover, the polyimide resin described in WO2008/123097A is also useful.

Particularly, among these, a copolymer of [benzyl (meth)acrylate/(meth)acrylic acid/other addition polymerizable vinyl monomers used if necessary] and a copolymer of [allyl (meth)acrylater(meth)acrylic acid/other addition polymerizable vinyl monomers used if necessary] are suitable because these copolymers are excellent in the balance among film hardness, sensitivity, and developability.

The alkali-soluble resin can be manufactured by, for example, a known radical polymerization method. In a case where the alkali-soluble resin is manufactured by a radical polymerization method, the polymerization conditions such as temperature, pressure, type and amount of radical polymerization initiator, and type of solvent can be easily set by those skilled in the related art.

As the alkali-soluble resin, it is also preferable to use a polymer containing a structural unit containing an acid group (alkali-soluble group).

Examples of the acid group include a carboxylic acid group, a sulfonic acid group, a phosphoric acid group, a phenolic hydroxyl group, and the like. At least one kind of acid group among a carboxylic acid group, a sulfonic acid group, and a phosphoric acid group is preferable, and a carboxylic acid group is more preferable.

(Structural Unit Containing Acid Group)

As the structural unit containing an acid group, one or more kinds of structural units are preferable which may be contained in the resin containing a curable group described above and selected from structural units derived from monomers represented by Formulae (ib) to (iiib).

The alkali-soluble resin may contain one kind of structural unit containing an acid group or two or more kinds of structural units containing an acid group. The content of the structural unit containing an acid group, expressed in terms of mass, with respect to the total mass of the alkali-soluble resin is preferably 5% to 95%. From the viewpoint of inhibiting the image intensity from being damaged by alkali development, the content of the structural unit containing an acid group is more preferably 10% to 90%.

As another aspect of the alkali-soluble resin, a polyamic acid can be exemplified. The polyamic acid is generally obtained causing an addition polymerization reaction between a compound having an acid anhydride group and a diamine compound at a temperature of 40° C. to 100° C., and contains a repeating unit represented by Formula (4).

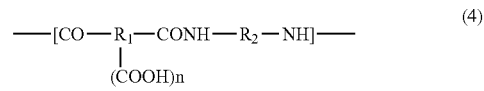

(4)

In Formula (4) $R_1$ is an organic group having three or more functional groups that has 2 to 22 carbon atoms, $R_2$ is a divalent organic group having 1 to 22 carbon atoms, and n is an integer equal to or greater than 1.

It is preferable that the polyamic acid is obtained by, for example, reacting tetracarboxylic acid dianhydride and an aromatic diamine compound in a polar solvent. Examples of the tetracarboxylic acid dianhydride include the compounds described in paragraph 0041 and paragraph 0043 in JP2008-260927A, and the contents thereof are incorporated into the present specification.

Examples of the aromatic diamine compound include the compounds described in paragraph 0040 and paragraph 0043 in JP2008-260927A, and the contents thereof are incorporated into the present specification.

As the synthesis method of the polyamic acid, known methods can be used without particular limitation. As the synthesis method of the polyamic acid, for example, the method described in paragraph 0044 in JP2008-260927A can be used, and the contents thereof are incorporated into the present specification.

[Polymerizable Compound]

It is preferable that the curable composition contains a polymerizable compound.

The polymerizable compound is not particularly limited as long as it is a compound having a polymerizable group, and known polymerizable compounds can be used. The content in the polymerizable compound with respect to the total solid content of the curable composition is preferably 1.0% to 25.0% by mass. The polymerizable compound means a component different from the resin containing a curable group.

One kind of polymerizable compound may be used singly, or two or more kinds of polymerizable compounds may be used in combination. In a case where two or more kinds of polymerizable compounds are used in combination, the total content thereof is preferably within the above range.

As the polymerizable compound, a compound containing one or more groups containing an ethylenically unsaturated bond is preferable, a compound containing two or more groups containing ethylenically unsaturated bonds is more preferable, a compound containing three or more groups containing ethylenically unsaturated bonds is even more preferable, and a compound containing five or more groups containing ethylenically unsaturated bonds is particularly preferable. The upper limit of the number of groups containing an ethylenically unsaturated bond is equal to or smaller than 15. Examples of the group containing an ethylenically unsaturated bond include a vinyl group, a (meth)allyl group, a (meth)acryloyl group, and the like.

As the polymerizable compound, for example, the compounds described in paragraph "0050" in JP2008-260927A and paragraph "0040" in JP2015-068893A can be used, and the contents thereof are incorporated into the present specification.

The polymerizable compound may be in any chemical form such as a monomer, a prepolymer, an oligomer, a mixture of these, or a multimer of these.

The polymerizable compound is preferably a (meth)acrylate compound having 3 to 15 functional groups, and more preferably a (meth)acrylate compound having 3 to 6 functional groups.

Examples of the monomer and the prepolymer include unsaturated carboxylic acid (for example, acrylic acid, methacrylic acid, itaconic acid, crotonic acid, isocrotonic acid, maleic acid, or the like), esters or amides of unsaturated carboxylic acid, and a multimer of these. Among these, an ester of unsaturated carboxylic acid and an aliphatic polyhydric alcohol compound, amides of unsaturated carboxylic acid and an aliphatic polyvalent amine compound, and a multimer of these are preferable. Furthermore, a product of an addition reaction between unsaturated carboxylic acid esters or amides containing a nucleophilic substituent such as a hydroxyl group, an amino group, or a mercapto group and monofunctional or polyfunctional isocyanates or epoxies, a product of a dehydrocondensation reaction between unsaturated carboxylic acid esters or amides and monofunctional or polyfunctional carboxylic acid, and the like are also suitably used. In addition, a product of a reaction between unsaturated carboxylic acid esters or amides containing an electrophilic substituent such as an isocyanate group or an epoxy group and monofunctional or polyfunctional alcohols, amines, or thiols and a product of a reaction between unsaturated carboxylic acid esters or amides containing a dissociable substituent such as a halogen group or a tosyloxy group and monofunctional or polyfunctional alcohols, amines, or thiols are also suitable. Moreover, instead of the aforementioned unsaturated carboxylic acid, unsaturated phosphonic acid, a vinyl benzene derivative such as styrene, a compound substituted with vinyl ether, allyl ether, or the like can also be used.

Specifically, as these compounds, the compounds described in paragraphs "0095" to "0108" in JP2009-288705A can be suitably used in the present invention.

As the polymerizable compound, a compound which contains one or more groups containing an ethylenically unsaturated bond and has a boiling point equal to or higher than 100° C. at normal pressure is also preferable. For example, the compounds described in paragraph "0227" in JP2013-029760A and paragraphs "0254" to "0257" in JP2008-292970A can be referred to, and the contents thereof are incorporated into the present specification.

As the polymerizable compound, dipentaerythritol triacrylate (as a commercial product, KAYARAD D-330; manufactured by Nippon Kayaku Co., Ltd.), dipentaerythritol tetraacrylate (as a commercial product, KAYARAD D-320; manufactured by Nippon Kayaku Co., Ltd.), dipentaerythritol penta(meth)acrylate (as a commercial product, KAYARAD D-310; manufactured by Nippon Kayaku Co., Ltd.), dipentaerythritol hexa(meth)acrylate (as a commercial product, KAYARAD DPHA; manufactured by Nippon Kayaku Co., Ltd., A-DPH-12E; manufactured by SHIN-NAKAMURA CHEMICAL CO., LTD.), and a structure in which an ethylene glycol residue or a propylene glycol residue is between these (meth)acryloyl groups (for example, SR454 and SR499 marketed by Sartomer) are preferable. Oligomer types of these can also be used. In addition, NK ESTER A-TMMT (pentaerythritol tetraacrylate, manufactured by SHIN-NAKAMURA CHEMICAL CO., LTD.), KAYARAD RP-1040 (manufactured by Nippon Kayaku Co., Ltd.), and the like can also be used.

Hereinafter, aspects of preferable polymerizable compounds will be described.

The polymerizable compound may have an acid group such as a carboxylic acid group, a sulfonic acid group, a phosphoric acid group, or the like. As the polymerizable compound containing an acid group, an ester of an aliphatic polyhydroxy compound and unsaturated carboxylic acid is preferable, and a polymerizable compound is more preferable which is obtained by reacting a nonaromatic carboxylic acid anhydride with an unreacted hydroxyl group of an aliphatic polyhydroxy compound such that an acid group is added to the compound. As the polymerizable compound containing an acid group, the aforementioned esters in which the aliphatic polyhydroxy compound is pentaerythritol and/or dipentaerythritol are even more preferable. Examples of commercial products of the polymerizable compound include ARONIX TO-2349, M-305, M-510, and M-520 manufactured by TOAGOSEI CO., LTD., and the like.

The acid value of the polymerizable compound containing an acid group is preferably 0.1 to 40 mgKOH/g, and more preferably 5 to 30 mgKOHg. In a case where the acid value of the polymerizable compound is equal to or greater than 0.1 mgKOH/g, development and dissolution characteristics become excellent. In a case where the acid value of the polymerizable compound is equal to or smaller than 40 mgKOHg, there is an advantage in manufacturing and/or handling. Furthermore, the photopolymerization performance becomes excellent, and the curing properties are improved.

A compound containing a caprolactone structure is also a preferable aspect of the polymerizable compound.

The compound containing a caprolactone structure is not particularly limited as long as the compound contains a caprolactone structure in a molecule. Examples thereof include ε-caprolactone-modified polyfunctional (meth)acrylate which is obtained by esterifying a polyhydric alcohol such as trimethylolethane, ditrimethylolethane, trimethylolpropane, ditrimethylolpropane, pentaerythritol, dipentaerythritol, tripentaerythritol, glycerin, diglycerol, or trimethylol melamine, (meth)acrylic acid, and ε-caprolactone. Particularly, a compound containing a caprolactone structure represented by Formula (Z-1) is preferable.

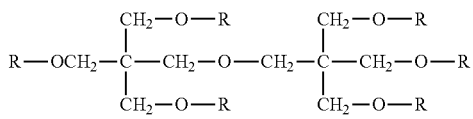
(Z-1)

In Formula (Z-1), all the six R's are groups represented by Formula (Z-2). Alternatively, one to five R's among six R's are groups represented by Formula (Z-2), and others are groups represented by Formula (Z-3).

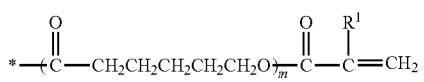
(Z-2)

In Formula (Z-2), $R^1$ represents a hydrogen atom or a methyl group, m represents a number of 1 or 2, and "*" represents a bond.

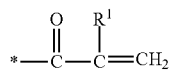
(Z-3)

In Formula (Z-3), $R^1$ represents a hydrogen atom or a methyl group, and "*" represents a bond.

As the polymerizable compound, a compound represented by Formula (Z-4) or (Z-5) can also be used.

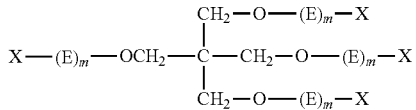
(Z-4)

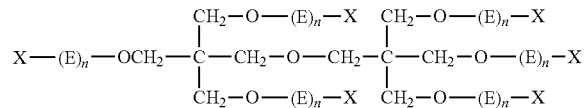
(Z-5)

In Formulae (Z-4) and (Z-5), E each independently represents $-((CH_2)_yCH_2)-$ or $-((CH_2)_yCH(CH_3)O)-$, y each independently represents an integer of 0 to 10, and X each independently represents a (meth)acryloyl group, a hydrogen atom, or a carboxylic acid group.

In Formula (Z-4), the total number of (meth)acryloyl groups is 3 or 4, m each independently represents an integer of 0 to 10, and the total number of m's is an integer of 0 to 40.

In Formula (Z-5), the total number of (meth)acryloyl groups is 5 or 6, n each independently represents an integer of 0 to 10, and the total number of n's is an integer of 0 to 60.

m in Formula (Z-4) is preferably an integer of 0 to 6, and more preferably an integer of 0 to 4.

The total number of m's is preferably an integer of 2 to 40, more preferably an integer of 2 to 16, and even more preferably an integer of 4 to 8.

n in Formula (Z-5) is preferably an integer of 0 to 6, and more preferably an integer of 0 to 4.

The total number of n's is preferably an integer of 3 to 60, more preferably an integer of 3 to 24, and even more preferably an integer of 6 to 12.

It is preferable that a terminal of the oxygen atom side of $-((CH_2)_yCH_2O)-$ or $-((CH_2)_yCH(CH_3)O)-$ in Formula (Z-4) or Formula (Z-5) is bonded to X.

One kind of compound represented by Formula (Z-4) or Formula (Z-5) may be used singly, or two or more kinds of compounds represented by Formula (Z-4) or Formula (Z-5) may be used in combination. Particularly, an aspect is preferable in which all of six X's in Formula (Z-5) are acryloyl groups. Furthermore, an aspect is preferable in which the compound represented by Formula (Z-5) is a mixture of a compound in which all of six X's are acryloyl groups and a compound in which at least one of six X's is a hydrogen atom. In a case where this constitution is adopted, the developability can be further improved.

The total content of the compound represented by Formula (Z-4) or Formula (Z-5) in the polymerizable compound is preferably equal to or greater than 20% by mass, and more preferably equal to or greater than 50% by mass.

Among the compounds represented by Formula (Z-4) or Formula (Z-5), either or both of a pentaerythritol derivative and a dipentaerythritol derivative are more preferable.

Furthermore, the polymerizable compound may contain a cardo-skeleton.

As the polymerizable compound containing a cardo-skeleton, a polymerizable compound containing a 9,9-bisarylfluorene skeleton is preferable.

The polymerizable compound containing a cardo-skeleton is not particularly limited, and examples thereof include an ONCOAT EX series (manufactured by NAGASE & CO., LTD.), OGSOL EA-0300 and EA-0200 (manufactured by Osaka Gas Chemicals Co., Ltd.), and the like. Paragraphs "0085" to "0095" in JP2005-096108A can also be referred to. In a case where the polymerizable compound containing a cardo-skeleton is used, the developability, the adhesiveness, and the patterning properties can be further improved.

[Solvent]

It is preferable that the aforementioned curable composition contains a solvent. In a case where the curable composition contains a solvent, the content of the solvent is not particularly limited, but it is preferable that the content of the solvent is adjusted such that the total solid content in the curable composition becomes 5% to 80% by mass.

One kind of solvent may be used singly, or two or more kinds of solvents may be used in combination. In a case where two or more kinds of solvents are used in combination, it is preferable to adjust the content thereof such that the total solid content of the curable composition falls into the above range.

Examples of the solvent include water and an organic solvent. Basically, the type of the solvent is not particularly limited as long as the solubility of components and the coating properties of the composition are satisfied. Examples of the organic solvent include esters, ethers, ketones, aromatic hydrocarbons, and the like. For details of these, paragraph "0223" in WO2015/166779A can be referred to, and the contents thereof are incorporated into the present specification. Furthermore, an ester-based solvent substituted with a cyclic alkyl group and a ketone-based solvent substituted with a cyclic alkyl group can also be preferably used. Specific examples of the organic solvent include acetone, methyl ethyl ketone, cyclohexanone, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetyl acetone, cyclohexanone, cyclopentanone, diacetone alcohol, ethylene glycol monomethyl ether acetate, ethylene glycol ethyl ether acetate, ethylene glycol monoisopropyl ether, ethylene glycol monobutyl ether acetate, 3-methoxypropanol, methoxymethoxy ethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethyl sulfoxide, γ-butyrolactone, butyl acetate, cyclohexyl acetate, methyl lactate, ethyl lactate, methyl 3-ethoxypropionate, ethyl 3-ethoxypropionate, ethyl cellosolve acetate, methyl 3-methoxypropionate, 2-heptanone, ethyl carbitol acetate, butyl carbitol acetate, dichloromethane, and the like. Furthermore, from the viewpoint of improving solubility, 3-methoxy-N,N-dimethyl propanamide and 3-butoxy-N,N-dimethyl propanamide are also preferable.

In some cases, in view of environmental consequences, it is preferable to reduce the amount of aromatic hydrocarbons (benzene, toluene, xylene, ethyl benzene, and the like) as a solvent (for example, the amount of aromatic hydrocarbons with respect to the total amount of organic solvents can be set to be equal to or smaller than 50 mass parts per million (ppm), 10 mass ppm, or 1 mass ppm).

[Silane Coupling Agent]

The curable composition may also contain a silane coupling agent.

The silane coupling agent is a compound containing a hydrolyzable group and other functional groups in a molecule. A hydrolyzable group such as an alkoxy group is bonded to a silicon atom.

The hydrolyzable group refers to a substituent which is directly bonded to a silicon atom and can form a siloxane bond by a hydrolysis reaction and/or a condensation reaction. Examples of the hydrolyzable group include a halogen atom, an alkoxy group, an acyloxy group, and an alkenyloxy group. In a case where the hydrolyzable group contains carbon atoms, the number of carbon atoms is preferably equal to or smaller than 6, and more preferably equal to or smaller than 4. Particularly, an alkoxy group having 4 or less carbon atoms or an alkenyloxy group having 4 or less carbon atoms is preferable.

In a case where a cured film is formed on a substrate, in order to improve the adhesiveness between the substrate and the cured film, it is preferable that the silane coupling agent does not contain a fluorine atom or a silicon atom (except for a silicon atom bonded to the hydrolyzable group). It is desirable that the silane coupling agent does not contain a fluorine atom, a silicon atom (except for a silicon atom bonded to the hydrolyzable group), an alkylene group substituted with a silicon atom, a linear alkyl group having 8 or more carbon atoms, and a branched alkyl group having 3 or more carbon atoms.

The content of the silane coupling agent in the curable composition with respect to the total solid content in the curable composition is preferably 0.1% to 10% by mass, more preferably 0.5% to 8% by mass, and even more preferably 1.0% to 6% by mass.

The curable composition may contain one kind of silane coupling agent or two or more kinds of silane coupling agents. In a case where the curable composition contains two or more kinds of silane coupling agents, the total content thereof is preferably within the above range.

[Ultraviolet Absorber]

The curable composition may also contain an ultraviolet absorber. In a case where the curable composition contains an ultraviolet absorber, the pattern shape of the cured film can be further improved (can be finer).

As the ultraviolet absorber, it is possible to use ultraviolet absorbers based on salicylate, benzophenone, benzotriazole, substituted acrvlonitrile, and triazine. Specifically, for example, the compounds described in paragraphs "0137" to "0142" in JP2012-068418A (paragraphs "0251" to "0254" in US2012/0068292A corresponding to JP2012-068418A) can be used, and the contents thereof can be adopted and incorporated into the present specification.

In addition, a diethylamino-phenylsulfonyl-based ultraviolet absorber (manufactured by DAITO CHEMICAL CO., LTD., trade name: UV-503) and the like are also suitably used.

Examples of the ultraviolet absorber include the compounds exemplified in paragraphs "0134" to "0148" in JP2012-032556A.

The content of the ultraviolet absorber with respect to the total solid content in the curable composition is preferably 0.001% to 15% by mass, more preferably 0.01% to 10% by mass, and even more preferably 0.1% to 5% by mass.

[Surfactant]

It is preferable that the curable composition contains a surfactant. The surfactant contributes to the improvement of coating properties of the curable composition.

In a case where the curable composition contains a surfactant, the content of the surfactant with respect to the total solid content in the curable composition is preferably 0.001% to 2.0% by mass.

One kind of surfactant may be used singly, or two or more kinds of surfactants may be used in combination. In a case where two or more kinds of surfactants are used in combination, it is preferable that the total content thereof is within the above range.

Examples of the surfactant include a fluorine-based surfactant, a nonionic surfactant, a cationic surfactant, an anionic surfactant, a silicone-based surfactant, and the like.

For example, in a case where the curable composition contains a fluorine-based surfactant, the liquid characteristics (particularly, fluidity) of the curable composition are further improved. That is, in a case where a film is formed of the curable composition containing the fluorine-based surfactant, the interfacial tension between a surface to be coated and a coating solution is reduced, and accordingly, the wettability of the curable composition with respect to the surface to be coated is improved, and the coating properties of the curable composition with respect to the surface to be coated is improved. Therefore, even in a case where a thin film having a thickness of about several micrometers is formed of a small amount of the curable composition, a film having a uniform thickness and small thickness unevenness can be more suitably and effectively formed.

The content rate of fluorine in the fluorine-based surfactant is preferably 3% to 40% by mass, more preferably 5% to 30% by mass, and even more preferably 7% to 25% by mass. The fluorine-based surfactant in which the fluorine content rate is within the above range is effective in view of thickness uniformity of the coating film and/or liquid saving, and exhibits excellent solubility in the curable composition.

Examples of the fluorine-based surfactant include MEGAFACE F171, MEGAFACE F172, MEGAFACE F173, MEGAFACE F176. MEGAFACE F177, MEGAFACE F141, MEGAFACE F142, MEGAFACE F143, MEGAFACE F144, MEGAFACE R30, MEGAFACE F437, MEGAFACE F475, MEGAFACE F479, MEGAFACE F482, MEGAFACE F554, and MEGAFACE F780 (manufactured by DIC Corporation), FLUORAD FC430, FLUORAD FC431, and FLUORAD FC171 (manufactured by Sumitomo 3M Limited). SURFLON S-382, SURFLON SC-101, SURFLON SC-103, SURFLON SC-104, SURFLON SC-105, SURFLON SC-1068. SURFLON SC-381, SURFLON SC-383, SURFLON S-393, and SURFLON KH-40 (manufactured by ASAHI GLASS CO., LTD.), PF636, PF656, PF6320. PF6520, and PF7002 (manufactured by OMNOVA Solutions Inc.), and the like.

As the fluorine-based surfactant, a block polymer can also be used, and specific examples thereof include the compounds described in JP2011-089090A.

In view of further improving the light blocking properties of the obtained cured film, an optical density (OD) of the curable composition per film thickness of 1.0 μm in a wavelength range of 400 to 1,100 nm is preferably equal to or higher than 3.0, and more preferably equal to or higher than 3.5. The cured film formed of the curable composition having the above characteristics can be preferably used as a light blocking film (black matrix).

In the present specification, the optical density means an optical density measured by the method described in Examples. Furthermore, in the present specification, having an optical density equal to or higher than 3.0 per film thickness of 1.0 m in a wavelength range of 400 to 1,100 nm means that the optical density is equal to or higher than 3.0 per film thickness of 1.0 μm in the entire range of a wavelength of 400 to 1,100 nm.

[Manufacturing Method of Curable Composition]

The curable composition can be prepared by mixing together the aforementioned components by known mixing methods (for example, mixing methods using a stirrer, a homogenizer, a high-pressure emulsification device, a wet-type pulverizer, a wet-type disperser (for example, a beads mill), and the like). Among these, a beads mill is preferably used because this device makes it possible to obtain a homogeneous and fine pigment within a short time and to obtain a colorant dispersion having further improved temporal stability in a case where the colorant dispersion is heated in a colorant dispersing step which will be described later.

In view of further improving the effects of the present invention, it is preferable that the manufacturing method of the curable composition includes the following steps.

(1) Colorant dispersing step of mixing together a resin containing a curable group (particularly preferably the specific resin), a colorant, a polymerization inhibitor (and other optional components as well as, for example, the solvent described above) so as to obtain a colorant dispersion (2) Mixing step of mixing together the colorant dispersion and a polymerization initiator (and other optional components as well as, for example, a resin containing a curable group (particularly preferably the curable resin 2) other than the resin described above, a polymerizable compound, other resins, and the like) so as to obtain a curable composition According to the manufacturing method of the curable composition described above, it is possible to inhibit the resin containing a curable group from being unintentionally polymerized in the colorant dispersion. Therefore, the temporal stability of the colorant dispersion is improved.

In a case where resins containing a curable group is used in combination, in the colorant dispersing step, the resins containing a curable group may be mixed together at once or separately mixed in the colorant dispersing step and the mixing step according to the type of the resins containing a curable group.

Particularly, in view of obtaining a curable composition having further improved effects of the present invention, it is more preferable that a resin which contains a structural unit containing a polymer chain and a curable group (preferably the specific resin) is mixed in the colorant dispersing step, and then a resin which does not contain a polymer chain but contains a curable group (preferably the curable resin 2) is mixed in the mixing step.

In the colorant dispersing step, the liquid temperature of the colorant dispersion is not particularly limited, but is preferably kept at 0° C. to 70° C. in general. Keeping the liquid temperature of the colorant dispersion at a predetermined temperature means that in a case where the resin containing a curable group, a colorant, and a polymerization inhibitor are mixed together and the colorant is dispersed, the liquid temperature of the colorant dispersion is kept at a predetermined temperature.

Particularly, in the colorant dispersing step, the liquid temperature of the colorant dispersion is more preferably kept at a temperature equal to or higher than 5° C., even more preferably kept at a temperature equal to or higher than 15° C., and particularly preferably kept at a temperature equal to or higher than 30° C., because then it becomes more difficult for moisture to be mixed into the colorant dispersion from the outside of the system (for example, from the atmosphere).

In a case where the colorant dispersion contains a solvent in the colorant dispersing step, the liquid temperature of the colorant dispersion is more preferably kept at a temperature less than 60° C., even more preferably kept at a temperature equal to or lower than 55° C., and particularly preferably kept at a temperature equal to or lower than 50° C., because then it becomes more difficult for the solvent to be volatilized from the colorant dispersion.

It is preferable that the colorant dispersion has further improved temporal stability, because then the obtained curable composition also has further improved temporal stability.

In a case where the liquid temperature of the colorant dispersion is kept at a temperature equal to or higher than 23° C. in the colorant dispersing step, the wettability of the organic solvent with respect to the surface of the colorant is improved, dissolution of the resin containing a curable group easily proceeds, and homogenization of the solvent easily proceeds. Furthermore, the resin containing a curable group is more easily adsorbed onto the colorant. As a result, the treatment time is shortened, and the temporal stability of the obtained colorant dispersion is further improved.

The manufacturing method of the curable composition may further include, before the colorant dispersing step, a temperature adjustment step of obtaining a mixture by mixing together at least two kinds of components selected from the group consisting of a resin containing a curable group, a colorant, and a polymerization inhibitor and adjusting the temperature of the mixture.

In the temperature adjustment step, the temperature of the mixture to be adjusted is not particularly limited, but is preferably the same as the liquid temperature of the colorant dispersion kept in the colorant dispersing step described above.

Furthermore, for the purpose of removing foreign substances and/or reducing defects, it is preferable that either or both of the curable composition and the colorant dispersion are filtered using a filter. As the filter, filters used for filtering and the like in the related art can be used without particular limitation. Examples thereof include filters made of a fluororesin such as polytetrafluoroethylene (PTFE), a polyamide-based resin such as nylon, a polyolefin resin (including a high-density and ultrahigh-molecular weight polyolefin resin) such as polyethylene or polypropylene (PP), and the like. Among these materials, polypropylene (including high-density polypropylene) or nylon is preferable.

An appropriate pore size of the filter is about 0.1 to 7.0 µm. The pore size is preferably about 0.2 to 2.5 µm, more preferably about 0.2 to 1.5 µm, and even more preferably about 0.3 to 0.7 µm. In a case where the pore size is within this range, it is possible to reliably remove tiny foreign substances such as impurities contained in the colorant and aggregates while inhibiting filter clogging.

Different filters may be used in combination. At this time, filtering performed using a first filter may be carried out only once or twice or more. In a case where filtering is performed twice or more by using a combination of different filters, the pore size in the first filtering is preferably the same as or larger than the pore size in the second filtering and the next filtering. In addition, first filters having different pore sizes within the aforementioned range may be combined. Regarding the pore size, the nominal pore size of the filter manufacturer can be referred to. As commercial filters, the filters can be selected from various filters provided by, for example, Pall Corporation Japan, Advantac Toyo Kaisha, Ltd., Nihon Entegris K.K. (former MICRONIX JAPAN CO., LTD.), KITZ MICRO FILTER CORPORATION, and the like.

As a second filter, a filter formed of the same material as the first filter described above and the like can be used. An appropriate pore size of the second filter is about 0.2 to 10.0 µm. The pore size of the second filter is preferably about 0.2 to 7.0 µm, and more preferably about 0.3 to 6.0 µm.

It is preferable that the curable composition according to the embodiment of the present invention does not contain impurities such as a metal, a metal salt containing halogen, an acid, and an alkali. The content of the impurities contained in these materials is preferably equal to or smaller than 1 ppm, more preferably equal to or smaller than 1 ppb, even more preferably equal to or smaller than 100 ppt, and particularly preferably equal to or smaller than 10 ppt. It is most preferable that the curable composition substantially does not contain impurities (it is most preferable that the amount of impurities is equal to or smaller than the detection limit of a measurement device).

The impurities can be measured using an inductively coupled plasma mass spectrometer (manufactured by Yokogawa Analytical Systems, Inc., Agilent 7500cs model).

<Container>

The curable composition may be temporarily stored in a container until the curable composition is used. As the container for storing the curable composition, known containers can be used without particular limitation.

As the container for storing the curable composition, a container having a high degree of internal cleanness and hardly causes elution of impurities is preferable. For example, commercial containers used for semiconductors may be used.

Specifically, examples of the container which can be used include a "CLEAN BOTTLE" series manufactured by AICELLO CORPORATION, "PURE BOTTLE" manufactured by KODAMA PLASTICS Co., Ltd., and the like, but the container is not limited to these.

For example, it is also preferable to use a multilayer bottle which is a container whose inner wall is constituted with six kinds of resins forming a six-layer structure or a multilayer bottle which is a container whose inner wall is constituted with six kinds of resins forming a seven-layer structure. Examples of these containers include the containers described in JP2015-123351A.

[Cured Film]

The cured film according to the embodiment of the present invention is a cured film obtained by curing a curable composition layer formed of the aforementioned curable composition.

The manufacturing method of the cured film is not particularly limited, but it is preferable that the manufacturing method includes the following steps.

Curable composition layer-forming step

Exposure step

Development step

Hereinafter, each of the steps will be described.

<Curable Composition Layer-Forming Step>

The curable composition layer-forming step is a step of forming a curable composition layer by using the aforementioned curable composition. Examples of the step of forming a curable composition layer by using the curable composition include a step of forming a curable composition layer by coating a substrate with the curable composition.

The type of the substrate is not particularly limited. However, in a case where the cured film is used as a solid-state imaging element, examples of the substrate include a silicon substrate. In a case where the cured film is used as a color filter (including a color filter for a solid-state imaging element), examples of the substrate include a glass substrate and the like.

As the method for coating a substrate with the curable composition, it is possible to use various coating methods such as spin coating, slit coating, injection method, spray coating, rotation coating, cast coating, roll coating, and a screen printing method.

The curable composition with which the substrate is coated is generally formed into a curable composition layer by being dried under the condition of a temperature of 70° C. to 150° C. for about 1 to 4 minutes.

<Exposure Step>

In the exposure step, the curable composition layer formed in the curable composition layer-forming step is subjected to exposure by being irradiated with actinic rays or radiation such that the curable composition layer subjected to light irradiation is cured.

The method of light irradiation is not particularly limited, but it is preferable to perform light irradiation through a photo mask having pattern-like opening portions.

It is preferable to perform exposure by the irradiation of radiation. As the radiation which can be used at the time of exposure, ultraviolet rays such as g-line, h-line, and i-line are particularly preferable. As a light source, a bright line spectrum of a high-pressure mercury lamp is preferable. The irradiation intensity is preferably 5 to 1,500 mJ/cm$^2$, and more preferably 10 to 1,000 mJ/cm$^2$.

In a case where the curable composition contains a thermal polymerization initiator, in the exposure step, the curable composition layer may be heated. The heating temperature is not particularly limited, but is preferably 80° C. to 250° C. Furthermore, the heating time is not particularly limited, but is preferably 30 to 300 seconds.

In a case where the curable composition layer is heated in the exposure step, the exposure step may also function as a post-baking step which will be described later. In other words, in a case where the curable composition layer is heated in the exposure step, the manufacturing method of the cured film may not include the post-baking step.

<Development Step>

In a development step, after the exposure step, a development treatment is performed such that a portion not being irradiated with light in the exposure step is eluted in a developer. Therefore, only a portion cured by light remains.

As the developer, an alkaline developer may be used. In this case, it is preferable to use an organic alkaline developer. The development temperature is generally 20° C. to 30° C., and the development time is 20 to 90 seconds.

Examples of the aqueous alkaline solution (alkaline developer) include an inorganic alkaline developer and an organic alkaline developer.

Examples of the inorganic alkaline developer include an aqueous alkaline solution in which an alkaline compound such as sodium hydroxide, potassium hydroxide, sodium carbonate, sodium hydrogen carbonate, sodium silicate, or sodium metasilicate is dissolved such that the concentration thereof becomes 0.001% to 10% by mass (preferably 0.005% to 0.5% by mass).

Examples of the organic alkaline developer include an aqueous alkaline solution in which an alkaline compound such as aqueous ammonia, ethylamine, diethylamine, dimethylethanolamine, tetramethylammonium hydroxide, tetraethylammonium hydroxide, tetrapropylammonium hydroxide, tetrabutylammonium hydroxide, benzyltrimethylammonium hydroxide, choline, pyrrole, piperidine, or 1,8-diazabicyclo-[5,4,0]-7-undecene is dissolved such that the concentration thereof becomes 0.001% to 10% by mass (preferably 0.005% to 0.5% by mass).

It is also possible to add, for example, a water-soluble organic solvent such as methanol or ethanol and/or a surfactant in an appropriate amount to the aqueous alkaline solution. In a case where a developer formed of the aqueous alkaline solution is used, generally, after development, the cured film is washed (rinsed) with pure water.

The manufacturing method of the cured film may include other steps.

Those other steps are not particularly limited and can be appropriately selected according to the purpose.

Examples of those other steps include a surface treatment step, a pre-baking step, a post-baking step for the substrate, and the like.

It is preferable that the manufacturing method of the cured film includes a step (post-baking step) of heating the curable composition layer having undergone exposure, between the exposure step and the development step.

The heating temperature in the pre-baking step and the post-baking step is preferably 80° C. to 250° C.

The upper limit of the heating temperature is more preferably equal to or lower than 200° C., and even more preferably equal to or lower than 150° C. The lower limit of the heating temperature is preferably equal to or higher than 90° C.

The heating time in the pre-baking step and the post-baking step is preferably 30 to 300 seconds. The upper limit of the heating time is more preferably 240 seconds, and even more preferably equal to or shorter than 180 seconds. The lower limit of the heating time is more preferably equal to or longer than 60 seconds.

[Solid-State Imaging Device and Solid-State Imaging Element]

The solid-state imaging device and the solid-state imaging element according to the embodiment of the present invention include the cured film described above. The aspect in which the solid-state imaging element includes the cured film is not particularly limited. For example, a constitution may be adopted in which a plurality of photodiodes and light-receiving elements formed of polysilicon or the like constituting a light-receiving area of a solid-state imaging element (a CCD image sensor, a CMOS image sensor, or the like) are provided on a substrate, and the cured film according to the embodiment of the present invention is provided on a surface side of a support on which the light-receiving elements are formed (for example, a portion other than light-receiving portions and/or pixels for adjusting color, and the like) or on a side opposite to the surface on which the light-receiving elements are formed.

The solid-state imaging device includes the aforementioned solid-state imaging element.

Figure 2:
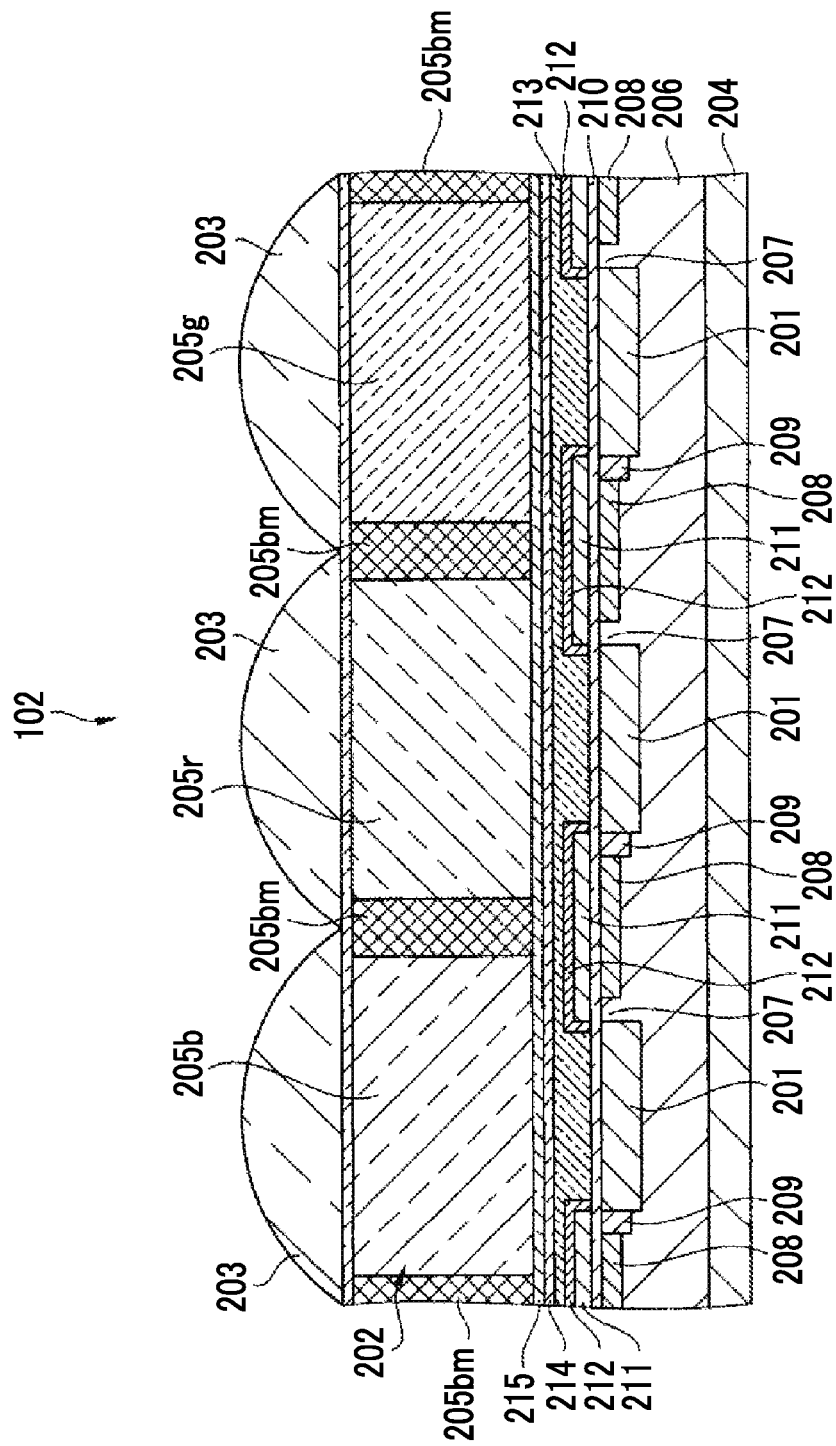
FIG. 2 is a schematic cross-sectional view in which an imaging portion in FIG. 1 is enlarged.

Examples of the constitutions of the solid-state imaging device and the solid-state imaging element will be described with reference to FIG. 1 and FIG. 2. In FIG. 1 and FIG. 2, in order that each portion is clearly seen, some portions are magnified in disregard of a thickness ratio and/or a width ratio between the portions.

As shown in FIG. 1, a solid-state imaging device 100 comprises a rectangular solid-state imaging element 101 and a transparent cover glass 103 which is held above the solid-state imaging element 101 and seals the solid-state imaging element 101. Furthermore, on the cover glass 103, a lens layer 111 is superposed through a spacer 104. The lens layer 111 is constituted with a support 113 and a lens material 112. The lens layer 111 may be constituted with the support 113 and the lens material 112 that are integrally formed. In a case where stray light comes into the peripheral region of the lens layer 111, due to the diffusion of light, a light condensing effect of the lens material 112 is weakened. Accordingly, the light reaching an imaging portion 102 is reduced, and noise occurs due to the stray light. Therefore, a light blocking film 114 is provided in the peripheral region of the lens layer 111 such that light is blocked. The cured film according to the embodiment of the present invention can also be used as the light blocking film 114.

The solid-state imaging element 101 performs photoelectric conversion on an optical image formed on the imaging portion 102, which becomes a light-receiving surface of the solid-state imaging element 101, and outputs the converted optical image as an image signal. The solid-state imaging element 101 comprises a laminated substrate 105 obtained by laminating two sheets of substrates. The laminated substrate 105 is formed of a chip substrate 106 and a circuit substrate 107 that are rectangular substrates having the same size. The circuit substrate 107 is laminated on the rear surface of the chip substrate 106.

As the material of the substrate used as the chip substrate 106, known materials can be used without particular limitation.

The imaging portion 102 is provided in the central portion of the surface of the chip substrate 106. In a case where stray light comes into the peripheral region of the imaging portion 102, a dark current (noise) occurs from the circuit in the peripheral region. Therefore, the peripheral region is provided with a light blocking film 115 such that light is blocked. The cured film according to the embodiment of the present invention can also be used as the light blocking film 115.

A plurality of electrode pads 108 are provided at the edge of the surface of the chip substrate 106. The electrode pads 108 are electrically connected to the imaging portion 102 through a signal line (a bonding wire can also be used) not shown in the drawing that is provided on the surface of the chip substrate 106.

On the rear surface of the circuit substrate 107, external connection terminals 109 are provided approximately in positions below the electrode pads 108. The external connection terminals 109 are connected to the electrode pads 108 through a penetration electrode 110 vertically penetrating the laminated substrate 105. Furthermore, the external connection terminals 109 are connected to a control circuit controlling the driving of the solid-state imaging element 101, an image processing circuit performing image processing on an imaging signal output from the solid-state imaging element 101, and the like through wiring not shown in the drawing.

As shown in FIG. 2, the imaging portion 102 is constituted with the portions provided on a substrate 204 such as a light-receiving element 201, a color filter 202, and a microlens 203. The color filter 202 has a blue pixel 205b, a red pixel 205r, a green pixel 205g, and a black matrix 205bm. The cured film according to the embodiment of the present invention can also be used as the black matrix 205bm.

As the material of the substrate 204, the same material as that of the chip substrate 106 can be used. On the surface layer of the substrate 204, a p-well layer 206 is formed. In the p-well layer 206, the light-receiving elements 201, which are formed of an n-type layer and generate and accumulate signal charges by photoelectric conversion, are arranged in the form of square grids.

On one lateral side of each light-receiving element 201, through a reading gate portion 207 on the surface layer of the p-well layer 206, a vertical electric charge transfer path 208 formed of an n-type layer is formed. Furthermore, on the other lateral side of each light-receiving element 201, through an element separation region 209 formed of a p-type layer, a vertical electric charge transfer path 208 belonging to the adjacent pixel is formed. The reading gate portion 207 is a channel region for the signal charges accumulated in the light-receiving element 201 to be read out toward the vertical electric charge transfer path 208.

On the surface of the substrate 204, a gate insulating film 210 formed of an oxide-nitride-oxide (ONO) film is formed. On the gate insulating film 210, vertical electric charge transfer electrodes 211 formed of polysilicon or amorphous silicon are formed to cover the portions which are approximately immediately above the vertical electric charge transfer path 208, the reading gate portion 207, and the element separation region 209. The vertical electric charge transfer electrodes 211 function as driving electrodes for driving the vertical electric charge transfer path 208 and performing charge transfer and as reading electrodes for driving the reading gate portion 207 and reading out signal charges. The signal charges are transferred to a horizontal electric charge transfer path and an output portion (floating diffusion amplifier), which are not shown in the drawing, in this order from the vertical electric charge transfer path 208 and then output as voltage signals.

On each of the vertical electric charge transfer electrodes 211, a light blocking film 212 is formed to cover the surface of the electrode. The light blocking film 212 has an opening portion in a position immediately above the light-receiving element 201 and shields a region other than the opening portion from light. The cured film according to the embodiment of the present invention can also be used as the light blocking film 212.

On the light blocking film 212, a transparent interlayer is provided which is formed of an insulating film 213 formed of borophosphosilicate glass (BPSG), an insulating film (passivation film) 214 formed of P—SiN, and a planarization film 215 formed of a transparent resin or the like. The color filter 202 is formed on the interlayer.

[Black Matrix]

The black matrix includes the cured film according to the embodiment of the present invention. The black matrix is incorporated into a color filter, a solid-state imaging element, and a liquid crystal display device in some cases.

Examples of the black matrix include those described above; a black rim provided in the peripheral portion of a display device such as a liquid crystal display device; a grid-like and/or a stripe-like black portion between pixels of red, blue, and green; a dot-like and/or a linear black pattern for shielding a thin film transistor (TFT) from light; and the like. The definition of the black matrix is described in, for example, Yasuhira Kanno, "Glossary of Liquid Crystal display Manufacturing Device", $2^{nd}$ edition, NIKKAN KOGYO SHIMBUN, LTD., 1996, p. 64.

In order to improve the display contrast and to prevent image quality deterioration resulting from current leak of light in the case of an active matrix driving-type liquid crystal display device using a thin film transistor (TFT), it is preferable that the black matrix has high light blocking properties (it is preferable that the optical density OD is equal to or higher than 3).

The manufacturing method of the black matrix is not particularly limited, and the black matrix can be manufactured by the same method as the manufacturing method of the cured film described above. Specifically, by coating a substrate with the curable composition so as to form a curable composition layer and performing exposure and development, a pattern-like cured film can be manufactured. The film thickness of the cured film used as the black matrix is preferably 0.1 to 4.0 μm.

The material of the substrate is not particularly limited, but it is preferable that the material has a transmittance equal to or higher than 80% for visible light (wavelength: 400 to 800 nm). Specifically, examples of such a material include glass such as soda lime glass, alkali-free glass, quartz glass, and borosilicate glass; plastic such as a polyester-based resin and a polyolefin-based resin; and the like. From the viewpoint of chemical resistance and heat resistance, alkali-free glass, quartz glass, or the like is preferable.

[Color Filter]

The color filter according to the embodiment of the present invention includes a cured film.

The aspect in which the color filter includes the cured film is not particularly limited, and examples thereof include a color filter comprising a substrate and the aforementioned black matrix. That is, examples of the color filter include a color filter comprising colored pixels of red, green, and blue formed on the opening portion of the black matrix formed on a substrate.

The color filter including a black matrix (cured film) can be manufactured by, for example, the following method.

First, on an opening portion of a pattern-like black matrix formed on a substrate, a coating film of a resin composition (resin composition layer) containing pigments corresponding to the colored pixels of the color filter is formed. As the resin composition for each color, known resin compositions can be used without particular limitation. However, it is preferable to use the curable composition according to the embodiment of the present invention.

Then, the resin composition layer is subjected to exposure through a photo mask having a pattern corresponding to the opening portion of the black matrix. Thereafter, an unexposed portion is removed by a development treatment and then performing baking. In this way, colored pixels can be formed in the opening portion of the black matrix. In a case where the series of operations are performed using, for example, a resin composition for each color containing red, green, and blue pigments, a color filter having red, green, and blue pixels can be manufactured.

[Liquid Crystal Display Device]

The liquid crystal display device according to the embodiment of the present invention includes the cured film. The aspect in which the liquid crystal display device includes the cured film is not particularly limited, and examples thereof include an aspect in which the liquid crystal display device includes the color filter including the black matrix (cured film) described above.

Examples of the liquid crystal display device according to the present embodiment include an aspect in which the liquid crystal display device comprises a pair of substrates disposed to face each other and a liquid crystal compound sealed into the space between the substrates. The substrates are as described above as the substrate for a black matrix.

Examples of a specific aspect of the liquid crystal display device include a laminate having polarizing plate/substrate/color filter/transparent electrode layer/alignment film/liquid crystal layer/alignment film/transparent electrode layer/TFT element/substrate/polarizing plate/backlight unit in this order from the user's side.

The liquid crystal display device according to the embodiment of the present invention is not limited to the above, and examples thereof include the liquid crystal display devices described in "Electronic display device (Akio Sasaki, Kogyo Chosakai Publishing Co., Ltd., 1990)" and "Display Device (Sumiaki Ibuki, Sangyo Tosho Publishing Co., Ltd., 1989)" and the liquid crystal display device described in "Next-Generation Liquid Crystal Display Technology (Tatsuo Uchida, Kogyo Chosakai Publishing Co., Ltd., 1994)".

[Infrared Sensor]

The infrared sensor according to the embodiment of the present invention includes the aforementioned cured film.

The infrared sensor according to the embodiment will be described using FIG. 3. In an infrared sensor 300 shown in FIG. 3, the reference 310 represents a solid-state imaging element.

The imaging region provided on the solid-state imaging element 310 is constituted with a combination of an infrared absorption filter 311 and a color filter 312 according to the embodiment of the present invention.

The infrared absorption filter 311 is a film which transmits light of the range of visible rays (for example, light having a wavelength of 400 to 700 nm) and blocks light of the infrared range (for example, light having a wavelength of 800 to 1,300 nm, preferably having a wavelength of 900 to 1,200 nm, and more preferably having a wavelength of 900 to 1,000 nm). In the infrared absorption filter 311, a cured film containing an infrared absorber (the aspect of the infrared absorber is as described above) as a colorant can be used.

The color filter 312 is a color filter in which pixels transmitting or absorbing light having a specific wavelength in the range of visible rays are formed. As the color filter 312, for example, a color filter in which pixels of red (R), green (G), and blue (B) are formed is used, and the aspect thereof is as described above.

Between an infrared transmission filter 313 and the solid-state imaging element 310, a resin film 314 (for example, a transparent resin film or the like) is disposed which can transmit light having a wavelength transmitted through the infrared transmission filter 313.

The infrared transmission filter 313 is a filter which blocks visible rays and transmits infrared rays having a specific wavelength. In the infrared transmission filter 313, the cured film according to the embodiment of the present invention can be used which contains a colorant absorbing light of the range of visible rays (for example, a perylene compound and/or a bisbenzofuranone compound) and an infrared absorber (for example, a pyrrolopyrrole compound, a phthalocyanine compound, a naphthalocyanine compound, a polymethine compound, or the like). It is preferable that the infrared transmission filter 313 blocks light having a wavelength of 400 to 830 nm and transmits light having a wavelength of 900 to 1,300 nm, for example.

On an incidence ray hv side of the color filter 312 and the infrared transmission filter 313, microlenses 315 are arranged. A planarization film 316 is formed to cover the microlenses 315.

Figure 3:
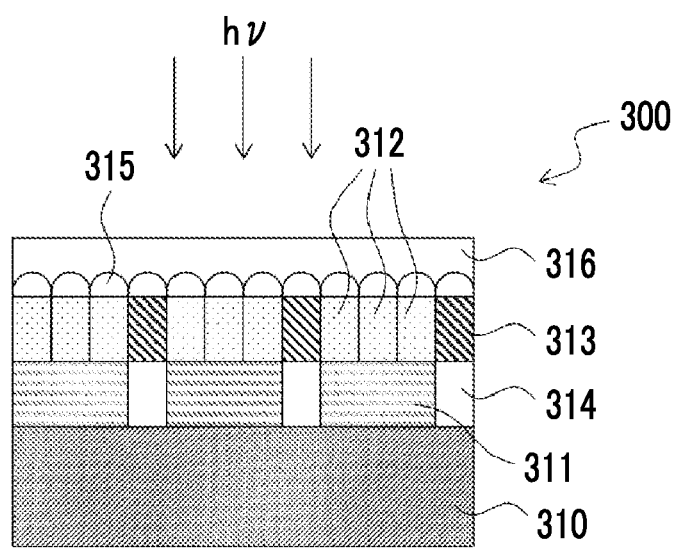
FIG. 3 is a schematic cross-sectional view showing an example of the constitution of an infrared sensor.

Although a resin film 314 is disposed in the embodiment shown in FIG. 3, the infrared transmission filter 313 may be formed instead of the resin film 314. That is, on the solid-state imaging element 310, the infrared transmission filter 313 may be formed.

In the embodiment shown in FIG. 3, the film thickness of the color filter 312 is the same as the film thickness of the infrared transmission filter 313. However, the film thicknesses may be different from each other.

In the embodiment shown in FIG. 3, the color filter 312 is provided to be closer to the incidence ray hv side than the infrared absorption filter 311. However, the order of the infrared absorption filter 311 and the color filter 312 may be switched such that the infrared absorption filter 311 is provided to be closer to the incidence ray hv side than the color filter 312.

In the embodiment shown in FIG. 3, the infrared absorption filter 311 and the color filter 312 are laminated to be adjacent to each other. However, these filters do not need to be adjacent to each other, and another layer may be provided between the filters.

According to the infrared sensor, image information can be simultaneously input. Therefore, motion sensing by which a subject whose movement is to be detected is recognized can be carried out. Furthermore, because distance information can be obtained, images including 3D information and the like can be captured.

Next, a solid-state imaging device in which the aforementioned infrared sensor is used will be described.

The solid-state imaging device includes a lens optical system, a solid-state imaging element, an infrared emission diode, and the like. Regarding each of the constituents of the solid-state imaging device, paragraphs "0032" to "0036" in JP2011-233983A can be referred to, and the contents thereof are incorporated into the present specification.

The aforementioned cured film is suitable for a light blocking member, a light blocking film, an antireflection member, and an antireflection film of optical filters and modules used in portable instruments such as a personal computer, a tablet PC, a mobile phone, a smart phone, and a digital camera; office automation (OA) instruments such as a printer composite machine and a scanner; industrial instruments such as monitoring camera, a barcode reader, an automated teller machine (ATM), a high-speed camera, and an instrument having a personal authentication function exploiting face image recognition; camera instruments for automobile use; medical camera instruments such as an endoscope, a capsule endoscope, and a catheter; a biosensor, a military reconnaissance camera, a camera for a three-dimensional map, a camera for observing weather and sea, a camera for land resource investigation, space instruments such as an exploration camera for the astronomy of the universe and a deep space target; and the like.

The aforementioned cured film can also be used in a micro light emitting diode (LED), a micro organic light emitting diode (OLED), and the like. The cured film is suitable for an optical filter and an optical film used in the micro LED and the micro OLED and for a member to which a light blocking function or an antireflection function is to be imparted.

Examples of the micro LED and the micro OLED include those described in JP2015-500562A and JP2014-533890A.

The cured film is suitable as an optical filter and an optical film used in a quantum dot display. Furthermore, the cured film is suitable as a member to which a light blocking function or an antireflection function is to be imparted.

Examples of the quantum dot display include those described in US2013/0335677A, US2014/0036536A, US2014/0036203A, and US2014/0035960A.

EXAMPLES

Hereinafter, the present invention will be more specifically described based on examples. The materials, the amount of the materials used, the proportion of the materials, the treatment content, the treatment procedure, and the like shown in the following examples can be appropriately modified as long as the gist of the present invention is maintained. Accordingly, the scope of the present invention is not limited to the following examples. Unless otherwise specified, "part" and "%" are based on mass.

Synthesis Example A1: Synthesis of Macromonomer A-1

The synthesis method of a macromonomer A-1 containing a structural unit (corresponding to structural unit GF) formed of an oxyalkylene carbonyl group will be shown below. ε-Caprolactone (1,044.2 g, corresponding to a cyclic compound), δ-valerolactone (184.3 g, corresponding to a cyclic compound), and 2-ethyl-1-hexanol (71.6 g, corresponding to a ring-opening polymerization initiator) were introduced into a three-neck flask having a volume of 3,000 mL, thereby obtaining a mixture. Then, the mixture was stirred in a state where nitrogen was being blown thereinto. Thereafter, monobutyl tin oxide (0.61 g) was added to the mixture, and the obtained mixture was heated to 90° C. After 6 hours, by using $^1$H-nuclear magnetic resonance (NMR), the disappearance of a signal resulting from 2-ethyl-1-hexanol in the mixture was confirmed, and then the mixture was heated to 110° C. In a nitrogen atmosphere, the polymerization reaction was continued for 12 hours at 110° C., and then by $^1$H-NMR, the disappearance of signals resulting from ε-caprolactone and δ-valerolactone was confirmed. The molecular weight of the obtained compound was measured by a GPC method. After it was confirmed that the molecular weight of the compound reached a desired value, 2,6-di-tert-butyl-4-methylphenol (0.35 g) was added to the mixture containing the compound, and then 2-methacryloyloxyethyl isocyanate (87.0 g) was further added dropwise to the obtained mixture for 30 minutes. Six hours after the finish of the dropwise addition, by $^1$H-NMR, the disappearance of a signal resulting from 2-methacryloyloxyethyl isocyanate (MOI) was confirmed. Then, propylene glycol monomethyl ether acetate (PGMEA) (1,387.0 g) was added to the mixture, thereby obtaining a macromonomer A-1 solution (2,770 g) having a concentration of 50% by mass. The structure (represented by Formula (A-1)) of the macromonomer A-1 was confirmed by $^1$H-NMR The weight-average molecular weight of the obtained macromonomer A-1 was 6,000.

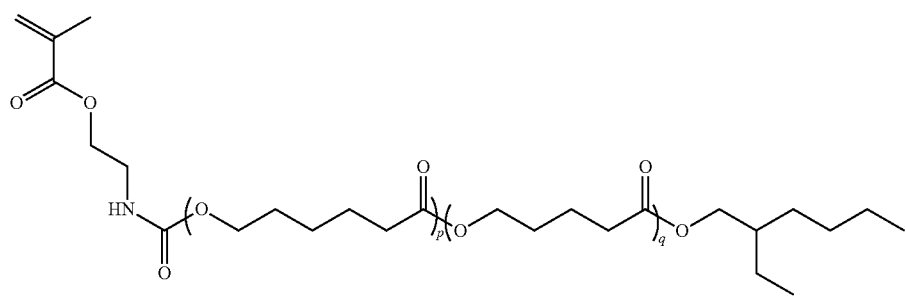

(A-1)

Synthesis Examples A2 to A6: Synthesis of Macromonomers A-2 to A-8

Macromonomers A2 to A8 were obtained by the same procedure as that in Synthesis Example A1 (synthesis method of the macromonomer A-1), except that the amount of cyclic compounds used was adjusted such that the content of the structural unit $L^1$ and the structural unit $L^2$ in one molecule of the macromonomer became the content described in Table 1, and the reaction time was adjusted such that the weight-average molecular weight of the macromonomer became the molecular weight described in Table 1.

Synthesis Example B1: Synthesis of Macromonomer B-1

The synthesis method of a macromonomer B-1 containing a structural unit (corresponding to structural unit GF)

formed of an oxyalkylene carbonyl group will be shown below. ε-Caprolactone (1,124.5 g, corresponding to a cyclic compound), δ-valerolactone (198.5 g, corresponding to a cyclic compound), 2-hydroxyethyl methacrylate (77.0 g, corresponding to a ring-opening polymerization initiator), and 2,6-di-tert-butyl-4-methylphenol (0.37 g) were introduced into a three-neck flask having a volume of 3,000 mL, thereby obtaining a mixture. Then, the mixture was stirred in a state where nitrogen was being blown thereinto. Thereafter, monobutyl tin oxide (0.61 g) was added to the mixture, and the obtained mixture was heated to 90° C. After 6 hours, by $^1$H-NMR, the disappearance of a signal resulting from 2-hydroxyethyl methacrylate in the mixture was confirmed, and then the mixture was heated to 110° C. In a nitrogen atmosphere, the polymerization reaction was continued for 12 hours at 110° C., and then by $^1$H-NMR, the disappearance of signals resulting from ε-caprolactone and δ-valerolactone was confirmed. The molecular weight of the obtained compound was measured by a GPC method. After it was confirmed that the molecular weight of the compound reached a desired value, propylene glycol monomethyl ether acetate (PGMEA) (1,493.6 g) was added to the mixture containing the compound, thereby obtaining a macromonomer B-1 solution (2,987 g) having a concentration of 50% by mass. The structure (represented by Formula (B-1)) of the macromonomer B-1 was confirmed by $^1$H-NMR. The weight-average molecular weight of the obtained macromonomer B-1 was 6,200.

(B-1)

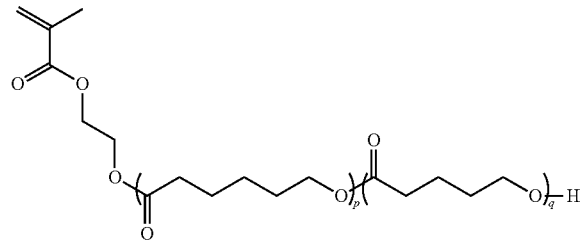

Synthesis Examples B2 to B6: Synthesis of Macromonomers B-2 to B-6

Macromonomers B-2 to B-6 were obtained by the same procedure as that in Synthesis Example B1 (synthesis method of the macromonomer B-1), except that the amount of cyclic compounds used was adjusted such that the content of the structural unit $L^1$ and the structural unit $L^2$ in one molecule of the macromonomer became the content described in Table 1, and the reaction time was adjusted such that the weight-average molecular weight of the macromonomer became the molecular weight described in Table 1.

Table 1 shows the type of the ring-opening polymerization initiators used for synthesizing the macromonomers A1 to A6 and macromonomers B-1 to B-6: the content (% by mass) of the structural unit $L^1$ and the structural unit $L^2$ in one molecule of the macromonomer; the weight-average molecular weight of the macromonomer; and the total number of the structural unit $L^1$ and the structural unit $L^2$ (corresponding to p+q described above) in one molecule of the macromonomer calculated using $^1$H-NMR. The number of the units in the number of repeating units was approximately the same as the ratio of the units used. In Table 1 which is divided into Table 1-1 and Table 1-2, each of the synthesis examples is described in each row. For example, in the case of Synthesis Example A1 (macromonomer A-1), 2-ethyl-1-hexanol is used as a ring-opening polymerization initiator, structural unit $L^1$ is a structural unit obtained by ring-opening polymerization of ε-caprolactone, the content of the structural unit $L^1$ is 85% by mass, the structural unit $L^2$ is a structural unit obtained by ring-opening polymerization of S-valerolactone, the content of the structural unit $L^2$ is 15% by mass, the weight-average molecular weight of the macromonomer is 6,000, and p+q equals 20.

TABLE 1

Table 1-1

| | | | Structural unit $L^1$ | |
|---|---|---|---|---|
| | Macro-monomer | Ring-opening polymerization initiator | Cyclic compound | Content (% by mass) |
| Synthesis Example A1 | A-1 | 2-Ethyl-1-hexanol | ε-Caprolactone | 85 |
| Synthesis Example A2 | A-2 | 2-Ethyl-1-hexanol | ε-Caprolactone | 90 |
| Synthesis Example A3 | A-3 | 2-Ethyl-1-hexanol | ε-Caprolactone | 80 |
| Synthesis Example A4 | A-4 | 2-Ethyl-1-hexanol | ε-Caprolactone | 70 |
| Synthesis Example A5 | A-5 | 2-Ethyl-1-hexanol | ε-Caprolactone | 60 |
| Synthesis Example A6 | A-6 | 2-Ethyl-1-hexanol | ε-Caprolactone | 100 |
| Synthesis Example A7 | A-7 | 2-Ethyl-1-hexanol | ε-Caprolactone | 100 |
| Synthesis Example A8 | A-8 | 2-Ethyl-1-hexanol | ε-Caprolactone | 0 |
| Synthesis Example B1 | B-1 | 2-Hydroxyethyl methacrylate | ε-Caprolactone | 85 |
| Synthesis Example B2 | B-2 | 2-Hydroxyethyl methacrylate | ε-Caprolactone | 90 |
| Synthesis Example B3 | B-3 | 2-Hydroxyethyl methacrylate | ε-Caprolactone | 80 |
| Synthesis Example B4 | B-4 | 2-Hydroxyethyl methacrylate | ε-Caprolactone | 70 |
| Synthesis Example B5 | B-5 | 2-Hydroxyethyl methacrylate | ε-Caprolactone | 60 |
| Synthesis Example B6 | B-6 | 2-Hydroxyethyl methacrylate | ε-Caprolactone | 100 |

TABLE 2

Table 1-2

| | Structural unit $L^2$ | | Weight-average molecular weight | Number of repeating structural units (p + q) |
|---|---|---|---|---|
| | Cyclic compound | Content (% by mass) | | |
| Synthesis Example A1 | δ-Valerolactone | 15 | 6,000 | 20 |
| Synthesis Example A2 | δ-Valerolactone | 10 | 6,100 | 20 |
| Synthesis Example A3 | δ-Valerolactone | 20 | 6,000 | 20 |
| Synthesis Example A4 | δ-Valerolactone | 30 | 6,000 | 20 |
| Synthesis Example A5 | δ-Valerolactone | 40 | 5,800 | 20 |
| Synthesis Example A6 | δ-Valerolactone | 0 | 6,400 | 20 |
| Synthesis Example A7 | δ-Valerolactone | 0 | 3,000 | 9 |
| Synthesis Example A8 | δ-Valerolactone | 100 | 2,800 | 9 |
| Synthesis Example B1 | δ-Valerolactone | 15 | 6,200 | 20 |
| Synthesis Example B2 | δ-Valerolactone | 10 | 6,250 | 20 |

TABLE 2-continued

Table 1-2

| | Structural unit L² | | Weight-average molecular weight | Number of repeating structural units (p + q) |
|---|---|---|---|---|
| | Cyclic compound | Content (% by mass) | | |
| Synthesis Example B3 | δ-Valerolactone | 20 | 6,200 | 20 |
| Synthesis Example B4 | δ-Valerolactone | 30 | 6,150 | 20 |
| Synthesis Example B5 | δ-Valerolactone | 40 | 5,900 | 20 |
| Synthesis Example B6 | δ-Valerolactone | 0 | 6,450 | 20 |

Synthesis Example B9: Synthesis of Macromonomer B-9

A macromonomer B-9 was obtained by the same mean as that in Synthesis Example B1, except that 77.0 g of 2-hydroxyethyl methacrylate in Synthesis Example B1 was changed to 68.1 g of N-(2-hydroxyethyl)acrylamide.

(B-9)

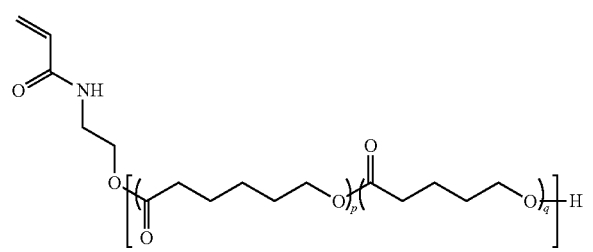

Macromonomers A-9 to A-12

Macromonomers A-9 to A-12 described in Table 2 that contain a structural unit (corresponding to the structural unit GF) formed of an oxyalkylene group are the following compounds. Each of the macromonomers was synthesized with reference to known methods (for example, the methods described in Example 1 and Example 2 in JP2000-344883A).

•Macromonomer A-9

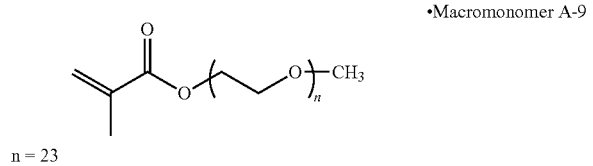

n = 23

•Macromonomer A-10

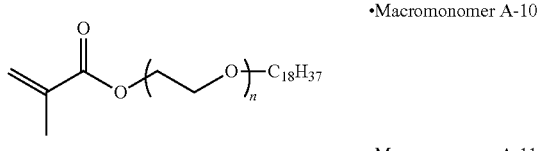

n = 30

•Macromonomer A-11

•Macromonomer A-12

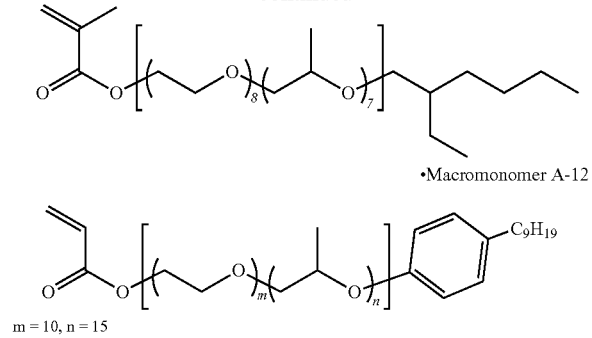

m = 10, n = 15

Macromonomer B-10

A Macromonomers B-10 described in Table 2 that contains a structural unit (corresponding to the structural unit GF) formed of an oxyalkylene group is the following compound. The macromonomer B-10 was synthesized with reference to a known method (for example, the method described in Synthesis Example 1 in JP2002-293918A).

•Macromonomer B-10

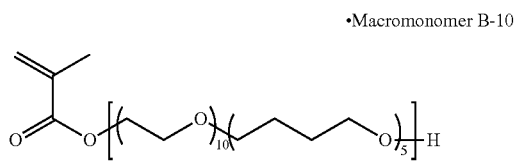

Synthesis Example K1: Synthesis of Macromonomer K-1

The synthesis method of a macromonomer K-1 containing a structural unit formed of an oxyalkylene carbonyl group will be shown below. ε-Caprolactone (1,124.5 g, corresponding to a cyclic compound), δ-valerolactone (198.5 g, corresponding to a cyclic compound), N-(2-hydroxyethyl) acrylamide (68.1 g, corresponding to a ring-opening polymerization initiator), and 2,6-di-t-butyl-4-methylphenol (0.37 g) were introduced into a three-neck flask having a volume of 3.000 mL, thereby obtaining a mixture. Then, the mixture was stirred in a state where nitrogen was being blown thereinto. Thereafter, phenyl phosphonic acid (3.0 g) was added to the mixture, and the obtained mixture was heated to 110° C. In a nitrogen atmosphere, the polymerization reaction was continued for 12 hours at 110° C., and then by $^1$H-NMR, the disappearance of signals resulting from ε-caprolactone and δ-valerolactone was confirmed. The molecular weight of the obtained compound was measured by a GPC method. After it was confirmed that the molecular weight of the compound reached a desired value. N,N-dimethylacetamide (1,493.6 g) was added to the mixture containing the compound, the mixture was cooled to 0° C. to 5° C., and chloropropionyl chloride (78.9 g) was added dropwise thereto. After the finish of the dropwise addition, the mixture was stirred for 1 hour at 25° C., and then by $^1$H-NMR, the disappearance of a signal resulting from chloropropionyl chloride was confirmed. Water (1,500 g) was added thereto, the mixture was stirred for 1 hour at 25° C., 1,500 g of ethyl acetate was added thereto, and the mixture was stirred for 15 minutes at 25° C. Thereafter, by a liquid separation operation, an aqueous layer was discarded, and an organic layer was collected. The obtained organic layer was washed twice with 1,500 g of water. Then, in a state where the organic layer was being concentrated using an evaporator, an appropriate amount of propylene glycol monomethyl ether acetate (PGMEA) was added thereto, thereby obtaining a macromonomer K-1 solution (3,000 g) having a concentration of 50% by mass. The structure (represented by Formula (K-1)) of the macromonomer K-1 was confirmed by $^1$H-NMR. The weight-average molecular weight of the obtained macromonomer K-1 was 5,500.

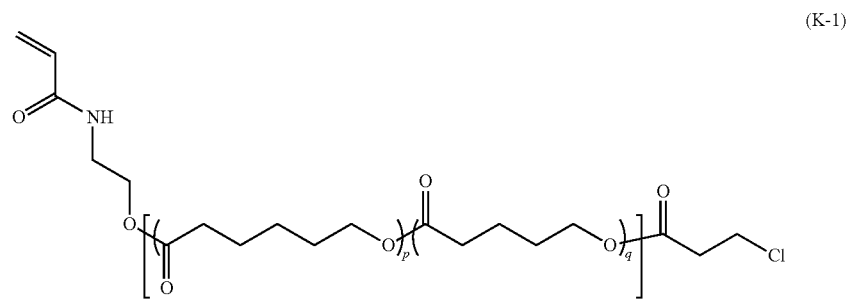

(K-1)

Synthesis Example K2: Synthesis of Macromonomer K-2

The synthesis method of a macromonomer K-2 containing a structural unit formed of an oxyalkylene carbonyl group will be shown below. A 30% by mass toluene solution (419 g) of PLACCEL FA-10 (manufactured by Daicel Corporation), which is an adduct obtained by adding 10 equivalents of ε-caprolactone to 2-hydroxyethyl acrylate, N,N-dimethylacetamide (419 g), and 2,6-di-t-butyl-4-methylphenol (0.10 g) were mixed together, thereby obtaining a mixture. Then, the mixture was cooled to 0° C. to 5° C., and then in the air, chloropropionyl chloride (13.9 g) was added dropwise thereto. After the finish of the dropwise addition, the mixture was stirred for 1 hour at 25° C., and by $^1$H-NMR, the disappearance of a signal resulting from chloropropionyl chloride was confirmed. Water (950 g) was added thereto, the mixture was stirred for 1 hour at 25° C., 950 g of ethyl acetate was added thereto, and the mixture was stirred for 15 minutes at 25° C. Thereafter, by a liquid separation operation, an aqueous layer was discarded, and an organic layer was collected. The obtained organic layer was washed twice with 950 g of water. Then, in a state where the organic layer was being concentrated using an evaporator, an appropriate amount of propylene glycol monomethyl ether acetate (PGMEA) was added thereto, thereby obtaining a macromonomer K-2 solution (260 g) having a concentration of 50% by mass. The structure (represented by Formula (K-2)) of the macromonomer K-2 was confirmed by $^1$H-NMR. The weight-average molecular weight of the obtained macromonomer K-2 was 2,800.

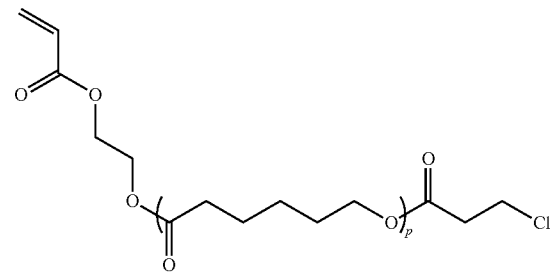

(K-2)

Synthesis Example K3: Synthesis of Macromonomer K-3

The synthesis method of a macromonomer K-3 having a structural unit formed of an oxyalkylene group will be shown below. A 50% by mass PGME solution (190 g) of the macromonomer K-3 was obtained in the same manner as in Synthesis Example K2, except that 419 g of the 30% by mass toluene solution of PLACCEL FA-10 (manufactured by Daicel Corporation) was changed to the macromonomer B-10 (88.7 g). The weight-average molecular weight of the obtained macromonomer K-3 was 2,000.

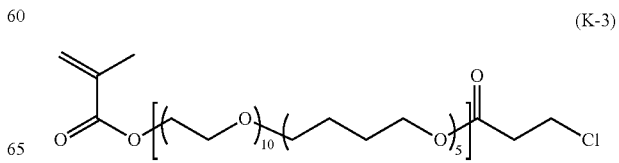

(K-3)

Synthesis Example L1: Synthesis of L-1

The synthesis method of a compound L-1 containing an epoxy group and an ethylenically unsaturated group (corresponding to a curable group, the same is true hereinafter) will be shown below.

Synthesis Example L1: Synthesis of L-1

Glycidol (manufactured by Sigma-Aldrich Co. LLC., 5.0 g), 53 g of butyl acetate, 0.04 g of p-methoxyphenol, 14.5 g of KARENZ BEI (manufactured by SHOWA DENKO K.K.), and 0.04 g of NEOSTANN U600 (Nippon Kasei Chemical Co., Ltd) were put into a 200 mL three-neck flask, and slowly heated to 60° C. The polymerization reaction was continued for 4 hours at 60° C., and then by $^1$H-NMR, the disappearance of a signal resulting from KARENZ BEI was confirmed. Water (50 g) was added thereto, and the mixture was stirred. By liquid separation, an aqueous layer was discarded, and the obtained organic layer was washed again with 50 g of water. Magnesium sulfate (3 g) was added to the washed organic layer, and filtering was performed. Then, 2,6-di-t-butyl-4-methylphenol (0.4 g) was added thereto, and concentration was performed, thereby obtaining 12 g of L-1.

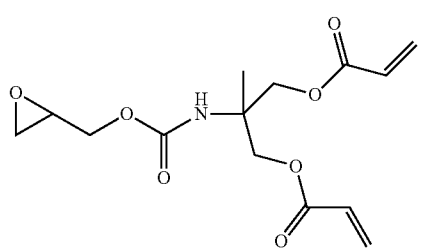

(L-1)

Synthesis Example L2: Synthesis of L-2

A compound L-2 containing an epoxy group and an ethylenically unsaturated group was synthesized in the same manner as in Synthesis Example 1 in JP2015-229633A.

(L-2)

Synthesis Example L3: Synthesis of L-3

A compound L-3 containing an epoxy group and an ethylenically unsaturated group was synthesized based on the known method described in JP1997-227540A (JP-H09-227540A).

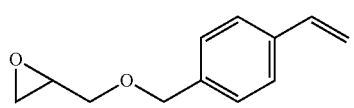

(L-3)

Synthesis Example L4: Synthesis of L-4

The synthesis method of a compound L-4 containing an epoxy group and an ethylenically unsaturated group will be shown below.

Glycidol (manufactured by Sigma-Aldrich Co. LLC., 5.0 g), 53 g of butyl acetate, 0.04 g of p-methoxyphenol, 14.5 g of KARENZ BEI (manufactured by SHOWA DENKO K.K.), and 0.04 g of NEOSTANN U600 (Nippon Kasei Chemical Co., Ltd) were put into a 200 mL three-neck flask, and slowly heated to 60° C. The polymerization reaction was continued for 4 hours at 60° C., and then by 1H-NMR, the disappearance of a signal resulting from KARENZ BEI was confirmed. Water (50 g) was added thereto, and the mixture was stirred. By liquid separation, an aqueous layer was discarded, and the obtained organic layer was washed again with 50 g of water. Magnesium sulfate (3 g) was added to the washed organic layer, and filtering was performed. Then, 2,6-di-t-butyl-4-methylphenol (0.4 g) was added thereto, and concentration was performed, thereby obtaining 12 g of L-1.

Compound L-4

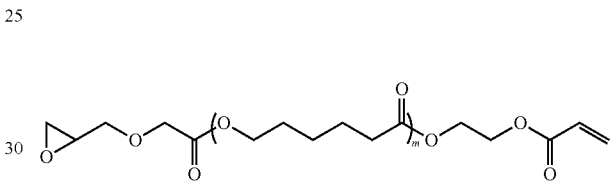

Synthesis Example L5: Synthesis of L-5

The synthesis method of a compound L-5 containing a dissociable group and an ethylenically unsaturated group will be shown below. 4-Hydroxybutyl acrylate (350 g), 350 g of acetonitrile, 2,6-di-t-butyl-4-methylphenol (0.36 g), 368 g of triethylamine, and 23.2 g of trimethylamine hydrochloride were put into a three-neck flask having a volume of 3.000 mL, and the internal temperature of the flask was cooled to a temperature equal to or lower than 5° C. Then, a solution obtained by dissolving 555 g of tosyl chloride in 1,050 g of acetonitrile was added dropwise thereto while keeping the internal temperature of the flask at a temperature equal to or lower than 10° C. After the finish of the dropwise addition, the mixture was stirred for 1 hour as it was at a temperature equal to or lower than 5° C., 700 g of water was then added thereto, and the mixture was stirred for 1 hour at room temperature. Ethyl acetate (700 g) was added thereto, and the mixture was stirred. Thereafter, liquid separation was performed, an aqueous layer was discarded, and the obtained organic layer was washed twice with 700 g of water. Magnesium sulfate (50 g) was added thereto, and filtering was performed. Subsequently, 2,6-di-t-butyl-4-methylphenol (0.36 g) was added thereto, and concentration was performed, thereby obtaining 615 g of L-5.

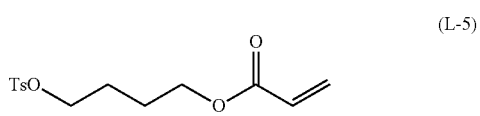 [SMILES: C=CC(=O)OCCCCOS(=O)(=O)c1ccc(C)cc1]

(L-5)

Synthesis Example L6: Synthesis of L-6

The synthesis method of a compound L-6 containing a dissociable group and an ethylenically unsaturated group will be shown below. L-5 (500 g) obtained in Synthesis Example L5, 500 g of N,N-dimethylacetamide, 2,6-di-t-butyl-4-methylphenol (0.17 g), and 218 g of lithium bromide were put into a three-neck flask having a volume of 3,000 mL, and stirred for 2 hours at 50° C. Then, by adding 600 g of water and 500 g of ethyl acetate, liquid separation was performed. An aqueous layer was discarded, and the obtained organic layer was washed three times with 600 g of water. Thereafter, 2,6-di-t-butyl-4-methylphenol (0.17 g) and 50 g of magnesium sulfate were added thereto. Filtering was performed, and then the solution was concentrated, thereby obtaining 305 g of L-6.

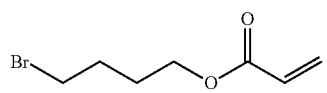

(L-6)

Synthesis Example L7: Synthesis of L-7

L-7 (310 g) containing a dissociable group and an ethylenically unsaturated group was obtained in the same manner as in Synthesis Examples L5 and L6, except that 350 g of 4-hydroxybutyl acrylate in Synthesis Example L5 was changed to 384 g of 4-hydroxybutyl methacrylate.

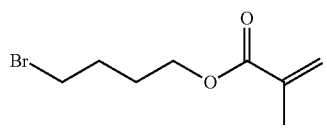

(L-7)

Synthesis Example L8: Synthesis of L-8

The synthesis method of a compound L-8 containing a dissociable group and an ethylenically unsaturated group will be shown below. 4-Hydroxybutyl acrylate (100 g), 450 g of N,N-dimethylacetamide, and 2,6-di-t-butyl-4-methylphenol (0.07 g) were put into a three-neck flask having a volume of 3,000 mL, and the internal temperature of the flask was cooled to a temperature equal to or lower than 5° C. Then, 103 g of chlorobutyl chloride was added dropwise thereto while keeping the internal temperature at a temperature equal to or lower than 10° C. After the finish of the dropwise addition, the mixture was stirred for 1 hour as it was at a temperature equal to or lower than 5° C., 450 g of water was added thereto, and the mixture was stirred for 1 hour at room temperature. Ethyl acetate (450 g) was added thereto, and the mixture was stirred. Thereafter, liquid separation was performed, an aqueous layer was discarded, and the obtained organic layer was washed twice with 450 g of water. Subsequently, 20 g of magnesium sulfate was added thereto, and filtering was performed. Then, 2,6-di-t-butyl-4-methylphenol (0.07 g) was added thereto, and concentration was performed, thereby obtaining 150 g of L-8.

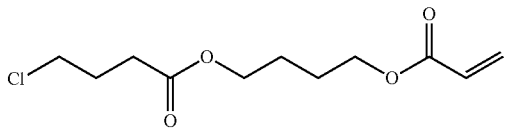

(L-8)

Synthesis Example L9: Synthesis of L-9

A compound L-9 (90 g) containing a dissociable group and an ethylenically unsaturated group was obtained in the same manner as in Synthesis Example L8, except that 100 g of 4-hydroxybutyl acrylate in Synthesis Example L8 was changed to 80 g of 2-hydroxyethyl acrylamide, and 103 g of chlorobutyl chloride in Synthesis Example L8 was changed to 82 g of chloroethyl chloride.

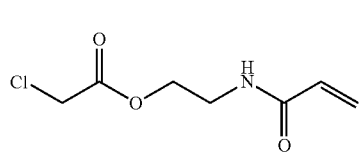

(L-9)

Synthesis Example L10: Synthesis of L-10

A compound L-10 (1,100 g) containing a dissociable group and an ethylenically unsaturated group was obtained in the same manner as in Synthesis Examples L5 and L6, except that 350 g of 4-hydroxybutyl acrylate in Synthesis Example L5 was changed to 1,167 g of PLACCEL FA-5 (manufactured by Daicel Corporation) which is an adduct obtained by adding 5 equivalents of ε-caprolactone to 2-hydroxyethyl acrylate.

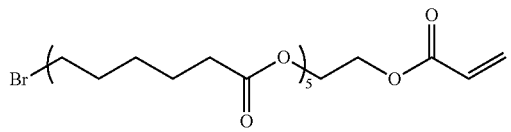

(L-10)

Synthesis Example L11: Synthesis of L-11

L-11 was obtained in the same manner as that used for synthesizing the compound (i-1) described in Examples of JP4057933B. L-11 is a compound which can generate an ethylenically unsaturated group by being subjected to a dehydrohalogenation reaction in the presence of a base.

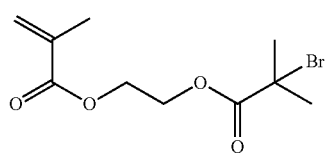

(L-11)

Synthesis Example L12: Synthesis of L-12

L-12 (140 g) was obtained in the same manner as in Synthesis Example L8, except that 103 g of chlorobutyl chloride was changed to 93 g of chloropropyl chloride. L-12 is a compound which can generate an ethylenically unsaturated group by being subjected to a dehydrohalogenation reaction in the presence of a base.

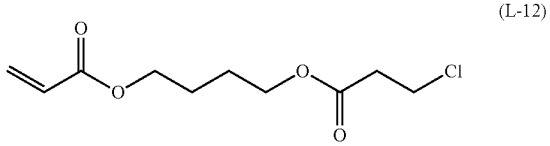
(L-12)

Synthesis Example P-1: Synthesis of Resin PA-1

A macromonomer A-1 solution (200 g) having a concentration (amount of solid contents) of 50% by mass (PGMEA: 100 g, macromonomer A-1 (100 g)), methacrylic acid (hereinafter, described as "MAA" as well, 60.0 g, corresponding to a polymerizable monomer for obtaining the structural unit B), benzyl methacrylate (hereinafter, described as "BzMA" as well, 40.0 g, corresponding to a compound for obtaining the structural unit C), and PGMEA (propylene glycol 1-monomethyl ether 2-acetate, 366.7 g) were introduced into a three-neck flask having a volume of 1,000 mL, thereby obtaining a mixture. The mixture was stirred while nitrogen was being blown thereinto. Then, while nitrogen was being allowed to flow in the flask, the mixture was heated to 75° C. Thereafter, dodecyl mercaptan (5.85 g) and 2,2'-azobis (methyl 2-methylpropionate) (1.48 g. hereinafter, described as "V-601" as well) were added in this order to the mixture, and a polymerization reaction was initiated. The mixture was heated for 2 hours at 75° C., and V-601 (1.48 g) was added to the mixture. After 2 hours, V-601 (1.48 g) was further added to the mixture. After the reaction was continued for 2 hours, the mixture was heated to 90° C. and stirred for 3 hours. By the above operation, the polymerization reaction was finished.

After the finish of the reaction, in the air, tetrabutylammonium bromide (TBAB, 7.5 g) and p-methoxyphenol (MEHQ, 0.13 g) were added thereto, and then glycidyl methacrylate (hereinafter, described as "GMA" as well, 66.1 g) was added dropwise thereto. After the finish of the dropwise addition, in the air, the reaction was continued for 7 hours, and the acid value was measured, thereby confirming the finish of the reaction. By adding PGMEA (643.6 g) to the obtained mixture, a 20% by mass solution of a resin PA-1 was obtained. The weight-average molecular weight of the obtained resin PA-1 was 35,000, and the acid value of the resin PA-1 was 50 mgKOH/mg.

Synthesis Examples P-2 to P-9 and P-20 to P-32: Synthesis of Resins PA-2 to PA-9 and Resins PA-11 to PA-23

Resins PA-2 to PA-9 and resins PA-11 to PA-23 were obtained according to the same procedure as in Synthesis Example P-1 (synthesis method of the resin PA-1), except that the amount of the macromonomer and the polymerizable monomer used was adjusted such that the content of the structural unit A (derived from the macromonomer), the structural unit B (derived from the polymerizable monomer), and the structural unit C (derived from the compound) in one molecule of the resin became the content described in Table 2, the amount of the polymerization initiator and the chain transfer agent used was adjusted such that the weight-average molecular weight of the resin became the weight-average molecular weight described in Table 2, and the amount of GMA added was adjusted such that the C=C value of the resin became the value described in Table 2.

Synthesis Example P-10: Synthesis of Resin PB-1

A macromonomer B-1 solution (280 g) having a concentration of 50% by mass (PGMEA: 140 g, macromonomer B-1 (140 g)), MMA (24.0 g), BzMA (36.0 g), and PGMEA (326.7 g) were introduced into a three-neck flask having a volume of 1,000 mL, thereby obtaining a mixture. The mixture was stirred while being nitrogen was being blown thereinto. Then, while nitrogen was being allowed to flow in the flask, the mixture was heated to 75° C. Thereafter, dodecyl mercaptan (2.93 g) and V-601 (0.74 g) were added in this order to the mixture, and a polymerization reaction was initiated. The mixture was heated for 2 hours at 75° C., and V-601 (0.74 g) was added to the mixture. After 2 hours, V-601 (0.74 g) was further added to the mixture. After the reaction was continued for 2 hours, the mixture was heated to 90° C. and stirred for 3 hours. By the above operation, the polymerization reaction was finished.

After the finish of the reaction, the mixture was cooled to 80° C. Thereafter, 2,2,6,6-tetramethylpiperidin-1-oxyl (hereinafter, described as "TEMPO" as well, 0.16 g) was added thereto, and then 2-methacryloyloxyethyl isocyanate (hereinafter, described as "MOI" as well, 8.91 g) was added dropwise thereto. After the finish of the dropwise addition, in a nitrogen atmosphere, the reaction was continued for 2 hours, and by $^1$H-nuclear magnetic resonance (NMR) measurement, the disappearance of the raw material MOI was confirmed. By adding PGMEA (315.3 g) to the obtained mixture, a 20% by mass solution of a resin PB-1 was obtained. The weight-average molecular weight of the obtained resin PB-1 was 30,000, and the acid value of the resin PB-1 was 75 mgKOH/mg.

Synthesis Examples P-11 to P-17: Synthesis of Resins PB-2 to PB-8

Resins PB-2 to PB-8 were obtained according to the same procedure as in Synthesis Example P-10 (synthesis method of the resin PB-1), except that the amount of the macromonomer and the polymerizable monomer used was adjusted such that the content of the structural unit A (derived from the macromonomer), the structural unit B (derived from the polymerizable monomer), and the structural unit C (derived from the compound) in one molecule of the resin became the content described in Table 2, the amount of the polymerization initiator and the chain transfer agent used was adjusted such that the weight-average molecular weight of the resin became the weight-average molecular weight described in Table 2, and the amount of MOI added was adjusted such that the C=C value of the resin became the value described in Table 2.

Synthesis Examples P-18 and P-19: Synthesis of Resins PA-10 and PB-9 (Resins without a Polymerizable Group)

A 20% by mass solution of a resin PA-10 which did not contain a polymerizable group and a 20% by mass solution of a resin PB-9 which did not contain a polymerizable group were obtained in the same manner as in Synthesis Examples P-1 and P-10, except that the synthesis of the resins was finished at a point in time when the polymerization reaction was finished.

Synthesis Examples P-33 and P-34: Synthesis of Resins PA-24 and PA-25

A resin PA-24 and a resin PA-25 were obtained in the same manner as in Synthesis Example P-22, except that 4-hydroxybutyl acrylate glycidyl ether (4HBAGE, manufactured by Nippon Kasei Chemical Co., Ltd) was used instead of GMA, and a polymerizable group was introduced using CYCLOMER M 100 (manufactured by Daicel Corporation).

Table 2 shows the content (% by mass) of each of the structural unit A, the structural unit B, and the structural unit C in one molecule of each of the resins PA-1 to PA-25 and PB-1 to PB-9 with respect to the total mass of each of the resins, the weight-average molecular weight of each of the resins, and the acid value and the C=C value of each of the resins.

TABLE 3

| Table 2 | Resin | Structural unit A Macro-monomer | Content (% by mass) | Structural unit B Polymerizable monomer | Content (% by mass) | Structural unit C Compound (raw material) | Content (% by mass) | Weight-average molecular weight | Acid value (mgKOH/g) | C=C value (mmol/g) |
|---|---|---|---|---|---|---|---|---|---|---|
| Synthesis Example P-1 | PA-1 | A-1 | 50 | MAA | 30 | BzMA | 20 | 35,000 | 50 | 1.8 |
| Synthesis Example P-2 | PA-2 | A-2 | 50 | MAA | 30 | BzMA | 20 | 35,000 | 50 | 1.8 |
| Synthesis Example P-3 | PA-3 | A-3 | 50 | MAA | 30 | BzMA | 20 | 34,500 | 50 | 1.8 |
| Synthesis Example P-4 | PA-4 | A-4 | 50 | MAA | 30 | BzMA | 20 | 34,800 | 50 | 1.8 |
| Synthesis Example P-5 | PA-5 | A-5 | 50 | MAA | 30 | BzMA | 20 | 28,000 | 50 | 1.8 |
| Synthesis Example P-6 | PA-6 | A-6 | 50 | MAA | 30 | BzMA | 20 | 36,500 | 50 | 1.8 |
| Synthesis Example P-7 | PA-7 | A-1 | 40 | MAA | 50 | BzMA | 10 | 29,000 | 70 | 2.5 |
| Synthesis Example P-8 | PA-8 | A-1 | 50 | MAA | 20 | BzMA | 30 | 35,500 | 90 | 0.5 |
| Synthesis Example P-9 | PA-9 | A-1 | 30 | HO-MS | 65 | BzMA | 5 | 38,000 | 40 | 1.8 |
| Synthesis Example P-10 | PB-1 | B-1 | 70 | MAA | 12 | BzMA | 18 | 30,000 | 75 | 0.35 |
| Synthesis Example P-11 | PB-2 | B-2 | 70 | MAA | 12 | BzMA | 18 | 32,000 | 75 | 0.35 |
| Synthesis Example P-12 | PB-3 | B-3 | 70 | MAA | 12 | BzMA | 18 | 30,000 | 75 | 0.35 |
| Synthesis Example P-13 | PB-4 | B-4 | 70 | MAA | 12 | BzMA | 18 | 31,000 | 75 | 0.35 |
| Synthesis Example P-14 | PB-5 | B-5 | 70 | MAA | 12 | BzMA | 18 | 31,200 | 75 | 0.35 |
| Synthesis Example P-15 | PB-6 | B-6 | 70 | MAA | 12 | BzMA | 18 | 34,700 | 75 | 0.35 |
| Synthesis Example P-16 | PB-7 | B-1 | 50 | MAA | 15 | BzMA | 35 | 33,000 | 95 | 0.25 |
| Synthesis Example P-17 | PB-8 | B-1 | 85 | HO-MS | 15 | | | 37,800 | 35 | 0.35 |
| Synthesis Example P-18 | PA-10 | A-1 | 50 | MAA | 30 | BzMA | 20 | 20,000 | 195 | |
| Synthesis Example P-19 | PB-9 | B-1 | 70 | MAA | 12 | BzMA | 18 | 30,000 | 78 | |
| Synthesis Example P-20 | PA-11 | A-1 | 35 | MAA | 65 | | | 28,500 | 54 | 3.2 |
| Synthesis Example P-21 | PA-12 | A-1 | 50 | MAA | 10 | BzMA | 40 | 33,000 | 60 | 0.08 |
| Synthesis Example P-22 | PA-13 | A-1 | 30 | M5300 | 70 | | | 19,200 | 95 | 0.5 |
| Synthesis Example P-23 | PA-14 | A-1 | 30 | CB-1 | 70 | | | 21,000 | 97 | 0.5 |
| Synthesis Example P-24 | PA-15 | A-1 | 35 | HOA-HH | 65 | | | 19,500 | 95 | 0.5 |
| Synthesis Example P-25 | PA-16 | A-1 | 45 | HOA-MS | 55 | | | 28,500 | 98 | 0.5 |
| Synthesis Example P-26 | PA-17 | A-1 | 35 | HOA-MPL | 65 | | | 20,500 | 97 | 0.5 |
| Synthesis Example P-27 | PA-18 | A-1 | 30 | HO-HH | 70 | | | 21,500 | 100 | 0.5 |
| Synthesis Example P-28 | PA-19 | A-1 | 50 | AA | 18 | BzMA | 32 | 32,800 | 90 | 0.5 |
| Synthesis Example P-29 | PA-20 | A-1 | 50 | β-CEA | 35 | BzMA | 15 | 25,500 | 100 | 0.5 |

TABLE 3-continued

| Table 2 | Resin | Structural unit A Macro-monomer | Content (% by mass) | Structural unit B Polymerizable monomer | Content (% by mass) | Structural unit C Compound (raw material) | Content (% by mass) | Weight-average molecular weight | Acid value (mgKOH/g) | C=C value (mmol/g) |
|---|---|---|---|---|---|---|---|---|---|---|
| Synthesis Example P-30 | PA-21 | A-1 | 50 | 6-AAmHA | 45 | BzMA | 5 | 16,500 | 95 | 0.5 |
| Synthesis Example P-31 | PA-22 | A-1 | 45 | AmHOA-MS | 55 | | | 16,800 | 95 | 0.5 |
| Synthesis Example P-32 | PA-23 | A-1 | 30 | 15-MAmPDA | 70 | | 18,500 | 90 | 0.5 |
| Synthesis Example P-33 | PA-24 | A-1 | 30 | M5300 | 70 | | 19,500 | 90 | 0.5 |
| Synthesis Example P-34 | PA-25 | A-1 | 30 | M5300 | 70 | | 20,100 | 100 | 0.5 |

The abbreviations described in Table 2 mean the following compounds (the same is applied to the following tables).

MAA: methacrylic acid
HO-MS: 2-methacryloyloxyethyl succinate (manufactured by KYOEISHA CHEMICAL Co., LTD)
M5300: ARONIX M5300 (manufactured by TOAGOSEI CO., LTD.)
CB-1: 2-methacryloyloxyethyl phthalate (manufactured by SHIN-NAKAMURA CHEMICAL CO., LTD.)
HOA-HH: 2-acryloyloxyethyl hexahydrophthalate (manufactured by KYOEISHA CHEMICAL Co., LTD)
HOA-MS: 2-acryloyloxyethyl-succinate (manufactured by KYOEISHA CHEMICAL Co., LTD)
HOA-MPL: 2-acryloyloxyethyl-phthalate (manufactured by KYOEISHA CHEMICAL Co., LTD)
HO-HH: 2-methacryloyloxyethyl hexahydrophthalate (manufactured by KYOEISHA CHEMICAL Co., LTD)
AA: acrylic acid
β-CEA: β-carboxyethyl acrylate (manufactured by DAICEL-ALLNEX LTD.)
6-AAmHA: 6-acrylamide hexanoate
AmHOA-MS: 4-(2-acnlamidoethoxy)-4-oxobutanoate (a synthesis example of this compound will be shown below)
15-MAmPDA: 15-methacrylamide pentacaonate (a synthesis example of this compound will be shown below.)
BzMA: benzyl methacrylate Synthesis Example: Synthesis of AmHOA-MS 2-Ethylalcohol acrylamide (20.0 g), succinic acid anhydride (17.38 g), and MEHQ (0.05 g) were introduced into a three-neck flask having a volume of 100 mL, thereby obtaining a mixture. While nitrogen was being allowed to flow in the three-neck flask, the mixture was heated to 90° C., thereby initiating a reaction. The mixture was heated at 90° C. for 8.5 hours and stirred, and then the reaction was finished, thereby obtaining a reaction product. The reaction product was purified by silica gel chromatography, thereby obtaining 21.4 g of a target compound AmHOA-MS (compound represented by the following formula).

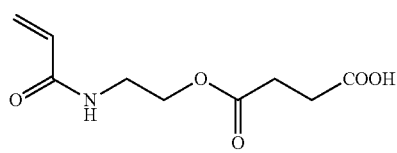

Synthesis Example: Synthesis of 15-MAmPDA

Acetonitrile (20.0 g), 12-aminododecanoic acid (67.2 g), hydroquinone (0.34 g), methacrylic acid anhydride (50.52 g), and acetonitrile (73.95 g) were introduced into a three-neck flask having a volume of 500 mL, thereby obtaining a mixture. The mixture was heated to 55° C., thereby initiating a reaction. The mixture was heated and stirred at 55° C. for 3 hours, and the reaction was finished, thereby obtaining a reaction product. After the finish of the reaction, 4.9 g of concentrated hydrochloric acid was added dropwise to the reaction product, and then 74.4 g of acetone was added thereto. Then, by stirring the reaction product for 1 hour at 30° C., the precipitation of crystals was confirmed. The reaction product was further stirred for 1 hour at −7° C. and then filtered, thereby obtaining 75.0 g of light yellow solids (15-MAmPDA, a compound represented by the following formula).

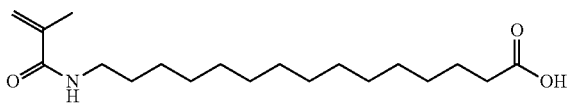 [SMILES: C=C(C)C(=O)NCCCCCCCCCCCCCCC(=O)O]

The weight-average molecular weight (Mw) of each of the macromonomers and resins was calculated by gel permeation chromatography (GPC) under the following measurement conditions.

Device: HLC-8220GPC [manufactured by Tosoh Corporation]
Detector: differential refractometer (RI detector)
Precolumn: TSKGUARD COLUMN MP(XL) 6 mm×40 mm [manufactured by Tosoh Corporation]
Sample column: the following four columns connected to each other in series [manufactured by Tosoh Corporation]
TSK-GEL Multipore-HXL-M 7.8 mm×300 mm
Reference column: same as sample column
Temperature of constant-temperature tank: 40° C.
Mobile phase: tetrahydrofuran
Flow rate of mobile phase for sample: 1.0 mL/min
Flow rate of mobile phase for reference: 0.3 mL/min
Sample concentration: 0.1% by mass
Sample injection amount: 100 μL
Data collection time: 16 minutes to 46 minutes after injection of sample
Sampling pitch: 300 msec
The acid value of each resin was determined by neutralizing titration using an aqueous sodium hydroxide solution.

Specifically, by using potentiometry, an aqueous sodium hydroxide solution was titrated to a solution obtained by dissolving the resin in a solvent, and the amount (millimole) of an acid contained in 1 g of solid contents of the resin was calculated. Then, the obtained value was multiplied by 56.1 which is the molecular weight of KOH, thereby determining the acid value.

The C=C value of each resin was calculated from the proportion of the amount of GMA or MOI used in the amount of solid contents used, after confirming the finish of the reaction of GMA or MOI by $^1$H-NMR measurement.

Synthesis Example P-35: Synthesis of Resin PA-26

A macromonomer A-10 solution (120 g) having a concentration of 50%/o by mass (PGMEA: 60 g, macromonomer A-10 (60 g)), 2-methacryloyloyloxyethyl succinic methacrylate (140 g) (hereinafter, described as "HO-MS" as well, corresponding to a polymerizable monomer for obtaining the structural unit B), and 406.7 g of MFG were introduced into a three-neck flask having a volume of 1,000 mL, thereby obtaining a mixture. The mixture was stirred in a state where nitrogen was being blown thereinto. Then, while nitrogen was being allowed to flow in the flask, the mixture was heated to 75° C. Thereafter, dodecyl mercaptan (1.65 g) and 2,2'-azobis(methyl 2-methylpropionate) (0.83 g, hereinafter, described as "V-601" as well) were added in this order to the mixture, thereby initiating a polymerization reaction. The mixture was heated at 75° C. for 2 hours, and then V-601 (0.83 g) was further added to the mixture. After 2 hours, V-601 (0.83 g) was further added to the mixture. The reaction was continued for 2 hours, and the mixture was heated to 90° C. and stirred for 3 hours. By the above operation, the polymerization reaction was finished.

After the finish of the reaction, in the air, dimethyl dodecylamine (6.0 g) and TEMPO (2.46 g) were added thereto, and then glycidYl acrylate (43.2 g) was added thereto. In the air, the reaction was continued for 24 hours at 90° C., and the finish of the reaction was confirmed by measuring the acid value. PGMEA (497.7 g) was added to the obtained mixture, thereby obtaining a 20% by mass solution of the resin PA-26. The weight-average molecular weight of the obtained resin PA-26 was 16,000, and the acid value of the resin PA-26 was 70 mgKOH/mg.

Synthesis Examples P-36 to P-47, P-80, and P-81: Synthesis of Resins PA-27 to PA-38, PA-40, and PA-41

Resins PA-27 to PA-38, PA-40, and PA-41 were obtained according to the same procedure as in Synthesis Example P-35 (synthesis method of the resin PA-26), except that the amount of the macromonomer and the polymerizable monomer used was adjusted such that the content of the structural unit A (derived from the macromonomer) and the structural unit B (derived from the polymerizable monomer) in one molecule of the resin became the content described in Table 2-1, the amount of the polymerization initiator and the chain transfer agent used was adjusted such that the weight-average molecular weight of the resin became the weight-average molecular weight described in Table 2-1, and the amount of the compound added which contained an epoxy group and an ethylenically unsaturated group (compound used for introducing a curable group into the resin) was adjusted such that the C=C value of the resin became the value described in Table 2-1.

TABLE 4

| Table 2-1 | Resin | Constitution of polymer chain | | | | Characteristics of resin | | |
|---|---|---|---|---|---|---|---|---|
| | | Structural unit A | Structural unit B | | | | | |
| | | Macro-monomer | Content (% by mass) | Polymerizable monomer containing acid group | Content (% by mass) | Compound used for introducing curable group into resin | Weight-average molecular weight | Acid value (mgKOH/g) | C=C value (mmol/g) |
| Synthesis Example P-35 | PA-26 | A-10 | 30 | HO-MS | 70 | Glycidyl acrylate | 16,000 | 70 | 1.3 |
| Synthesis Example P-36 | PA-27 | A-10 | 30 | HO-MS | 70 | GMA | 16,000 | 70 | 1.2 |
| Synthesis Example P-37 | PA-28 | A-10 | 30 | HO-MS | 70 | L-1 | 16,000 | 70 | 1.8 |
| Synthesis Example P-38 | PA-29 | A-10 | 30 | HO-MS | 70 | L-2 | 16,000 | 70 | 1.3 |
| Synthesis Example P-39 | PA-30 | A-10 | 30 | HO-MS | 70 | L-3 | 16,000 | 70 | 1.1 |
| Synthesis Example P-40 | PA-31 | A-10 | 30 | M5300 | 70 | 4HBAGE | 16,000 | 70 | 0.7 |
| Synthesis Example P-41 | PA-32 | A-7 | 30 | M5300 | 70 | 4HBAGE | 15,000 | 70 | 0.7 |
| Synthesis Example P-42 | PA-33 | A-8 | 30 | M5300 | 70 | 4HBAGE | 14,500 | 70 | 0.7 |
| Synthesis Example P-43 | PA-34 | A-9 | 30 | M5300 | 70 | 4HBAGE | 13,000 | 70 | 0.7 |
| Synthesis Example P-44 | PA-35 | A-10 | 30 | M5300 | 70 | 4HBAGE | 14,000 | 70 | 0.7 |
| Synthesis Example P-45 | PA-36 | A-11 | 30 | M5300 | 70 | 4HBAGE | 9,000 | 70 | 0.7 |
| Synthesis Example P-46 | PA-37 | A-12 | 30 | M5300 | 70 | 4HBAGE | 18,000 | 70 | 0.7 |
| Synthesis Example P-47 | PA-38 | A-10 | 15 | M5300 | 85 | 4HBAGE | 12,000 | 70 | 1.1 |

TABLE 4-continued

| Table 2-1 | Resin | Structural unit A Macro-monomer | Content (% by mass) | Structural unit B Polymerizable monomer containing acid group | Content (% by mass) | Compound used for introducing curable group into resin | Characteristics of resin Weight-average molecular weight | Acid value (mgKOH/g) | C=C value (mmol/g) |
|---|---|---|---|---|---|---|---|---|---|
| Synthesis Example P-80 | PA-40 | A-7 | 15 | M5300 | 85 | 4HBAGE | 15,000 | 70 | 1.1 |
| Synthesis Example P-81 | PA-41 | A-7 | 15 | M5300 | 85 | GMA | 14,000 | 70 | 1.1 |

The abbreviation described in Table 2-1 means the following compound (the same is applied to the following tables).

4HBAGE: 4-hydroxybutyl acrylate glycidyl ether, manufactured by Nippon Kasei Chemical Co., Ltd Synthesis Example P-48: Synthesis of Resin PA-39

A macromonomer A-10 solution (120 g) having a concentration of 50% by mass (PGMEA: 60 g, macromonomer A-10 (60 g)), 2-methacryloyloxyethyl succinic methacrylate (140 g) (hereinafter, described as "HO-MS" as well, corresponding to a polymerizable monomer for obtaining the structural unit B), and 406.7 g of N,N-dimethylacetamide were introduced into a three-neck flask having a volume of 1,000 mL, thereby obtaining a mixture. The mixture was stirred in a state where nitrogen was being blown thereinto. Then, while nitrogen was being allowed to flow in the flask, the mixture was heated to 75° C. Thereafter, dodecyl mercaptan (1.65 g) and 2,2'-azobis(methyl 2-methylpropionate) (0.83 g, hereinafter, described as "V-601" as well) were added in this order to the mixture, thereby initiating a polymerization reaction. The mixture was heated at 75° C. for 2 hours, and then V-601 (0.83 g) was further added to the mixture. After 2 hours, V-601 (0.83 g) was further added to the mixture. The reaction was continued for 2 hours, and the mixture was heated to 90° C. and stirred for 3 hours. By the above operation, the polymerization reaction was finished.

After the finish of the reaction, in the air, TBAB (6.0 g) and TEMPO (2.46 g) were added thereto, and then OXE 10 (OSAKA ORGANIC CHEMICAL INDUSTRY LTD) (38.3 g) as an unsaturated compound containing an oxetane group were added thereto. In the air, the reaction was continued for 72 hours at 160° C., and the finish of the reaction was confirmed by measuring the acid value. By adding 400 g of butyl acetate and 400 g of 0.1 M aqueous hydrochloric acid to the obtained mixture, a liquid separation operation was performed, and an organic layer was collected. The obtained organic layer was washed twice with 400 g of water. While the organic layer was being concentrated using an evaporator, an appropriate amount of propylene glycol monomethyl ether acetate (PGMEA) was added thereto, thereby obtaining a 20% by mass solution of the resin PA-39. The weight-average molecular weight of the obtained resin PA-39 was 16,000, and the acid value of the resin PA-39 was 70 mgKOHImg.

Synthesis Example P-49: Synthesis of Resin PB-10

A macromonomer B-1 solution (340 g) having a concentration of 50% by mass (PGMEA: 170 g, macromonomer B-1 (170 g)), MMA (30.0 g), and PGMEA (296.7 g) were introduced into a three-neck flask having a volume of 1,000 mL, thereby obtaining a mixture. The mixture was stirred in a state where nitrogen was being blown thereinto. Then, while nitrogen was being allowed to flow in the flask, the mixture was heated to 75° C. Thereafter, dodecyl mercaptan (2.93 g) and V-601 (0.74 g) were added in this order to the mixture, thereby initiating a polymerization reaction. The mixture was heated at 75° C. for 2 hours, and then V-601 (0.74 g) was further added to the mixture. After 2 hours. V-601 (0.74 g) was further added to the mixture. The reaction was continued for 2 hours, and the mixture was heated to 90° C. and stirred for 3 hours. By the above operation, the polymerization reaction was finished.

After the finish of the reaction, the mixture was cooled to 60° C. Then, 0.16 g of NEOSTANN U-600 (manufactured by NITTO KASEI CO., LTD.) and TEMPO (0.16 g) were added thereto, and then 2-acryloyloxyethyl isocyanate (hereinafter, described as "AOI" as well, 10.1 g) was added dropwise thereto. After the finish of the dropwise addition, the reaction was continued for 2 hours in a nitrogen atmosphere, and then by $^1$H-nuclear magnetic resonance (NMR) measurement, the disappearance of the raw material AOI was confirmed. By adding an appropriate amount of PGMEA to the obtained mixture, a 20% by mass solution of the resin PB-10 was obtained. The weight-average molecular weight of the obtained resin PB-10 was 32,000, and the acid value of the resin PB-10 was 90 mgKOH/mg.

Synthesis Examples P-50 to P-51: Synthesis of Resins PB-1 and PB-12

Resins PB-11 and PB-12 were obtained according to the same procedure as in Synthesis Example P-49 (synthesis method of the resin PB-10), except that the amount of the macromonomer and the polymerizable monomer used was adjusted such that the content of the structural unit A (derived from the macromonomer) and the structural unit B (derived from the polymerizable monomer) in one molecule of the resin became the content described in Table 2-2, the amount of the polymerization initiator and the chain transfer agent used was adjusted such that the weight-average molecular weight of the resin became the weight-average molecular weight described in Table 2-2, and the amount of AOI added was adjusted such that the C=C value of the resin became the value described in Table 2-2.

TABLE 5

| Table 2-2 | Resin | Constitution of polymer chain | | | | Characteristics of resin | | |
|---|---|---|---|---|---|---|---|---|
| | | Structural unit A | Structural unit B | | | Weight- average molecular weight | Acid value (mgKOH/g) | C=C value (mmol/g) |
| | | Macro- monomer | Content (% by mass) | Polymerizable monomer containing acid group | Content (% by mass) | Compound used for introducing curable group into resin | | |
| Synthesis Example P-49 | PB-10 | B-1 | 85 | MAA | 15 | AOI | 32,000 | 90 | 0.35 |
| Synthesis Example P-50 | PB-11 | B-9 | 85 | MAA | 15 | AOI | 32,500 | 90 | 0.35 |
| Synthesis Example P-51 | PB-12 | B-10 | 85 | MAA | 15 | AOI | 25,000 | 90 | 0.35 |

Synthesis Example P-52: Synthesis of Resin PH-1

A macromonomer A-10 solution (120 g) having a concentration of 50% by mass (PGMEA: 60 g, macromonomer A-10 (60 g)), M5300 (140 g), and PGMEA (406.7 g) were introduced into a three-neck flask having a volume of 1,000 mL, thereby obtaining a mixture. The mixture was stirred in a state where nitrogen was being blown thereinto. Then, while nitrogen was being allowed to flow in the flask, the mixture was heated to 75° C. Thereafter, dodecyl mercaptan (1.65 g) and 2,2'-azobis(methyl 2-methylpropionate) (0.83 g, hereinafter, described as "V-601" as well) were added in this order to the mixture, thereby initiating a polymerization reaction. The mixture was heated at 75° C. for 2 hours, and then V-601 (0.83 g) was further added to the mixture. After 2 hours, V-601 (0.83 g) was further added to the mixture. The reaction was continued for 2 hours, and the mixture was heated to 90° C. and stirred for 3 hours. By the above operation, the polymerization reaction was finished.

After the finish of the reaction, in the air, dimethyl dodecylamine (6.0 g) and TEMPO (2.46 g) were added thereto, and then glycidyl methacrylate (15.7 g) was added thereto. In the air, the reaction was continued for 24 hours at 90° C., and the finish of the reaction was confirmed by measuring the acid value. The mixture was cooled to 60° C., AOI (15.6 g) was then further added to the obtained mixture, and the reaction was performed for 6 hours at 60° C. By $^1$H-NMR measurement, the disappearance of the raw material AOI was confirmed. By adding an appropriate amount of PGMEA to the obtained mixture, a 20% by mass solution of the resin PH-1 was obtained. The weight-average molecular weight of the obtained resin PH-1 was 25,000, the acid value of the resin PH-1 was 80 mgKOH/mg, and the C=C value of the resin PH-1 was 0.9 mmol/g.

Synthesis Example P-53: Synthesis of Resin PI-1

A macromonomer A-1 solution (60 g) having a concentration of 50% by mass (PGMEA: 30 g, macromonomer A-1 (30 g)), M5300 (70 g), and 203.4 g of N-ethylpyrrolidone were introduced into a three-neck flask having a volume of 5.000 mL, thereby obtaining a mixture. The mixture was stirred in a state where nitrogen was being blown thereinto. Then, while nitrogen was being allowed to flow in the flask, the mixture was heated to 75° C. Thereafter, 2,2'-azobis (methyl 2-methylpropionate) (0.42 g, hereinafter, described as "V-601" as well) was added to the mixture, thereby initiating a polymerization reaction. The mixture was heated at 75° C. for 2 hours, and then V-601 (0.42 g) was further added to the mixture. After 2 hours. V-601 (0.42 g) was further added to the mixture. The reaction was continued for 2 hours, and the mixture was heated to 90° C. and stirred for 3 hours. By the above operation, the polymerization reaction was finished. Subsequently, 287 g of N-ethylpyrrolidone, 0.73 g of TEMPO. L-6 (19.2 g) as a compound containing a dissociable group and an ethylenically unsaturated group (compound used for introducing a curable group to the resin), and potassium carbonate (fine powder grade, manufactured by NIPPON SODA CO., LTD., 48.3 g) were added thereto, and reacted for 2 hours at 80° C. By $^1$H-NMR measurement, the disappearance of the raw material L-6 was confirmed, and then the mixture was cooled to a temperature equal to or lower than 5° C. While the internal temperature of the flask was being kept at a temperature equal to or lower than 20° C., 1,200 mL of I N aqueous hydrochloric acid was added dropwise thereto. After the finish of the dropwise addition, 1,200 mL of butyl acetate was added thereto, and the mixture was stirred for 30 minutes at room temperature. Then, by performing a liquid separation operation, an organic layer was collected. The obtained organic layer was washed twice with 600 mL of water and concentrated to an appropriate amount, thereby obtaining a 20% by mass solution (butyl acetate solution) of the resin PI-1. The weight-average molecular weight of the obtained resin PI-1 was 18,000, the acid value of the resin PI-1 was 70 mgKOH/mg, and the C=C value of the resin PI-1 was 0.8 mmol/g.

Synthesis Examples P-54 to P-61: Synthesis of Resins PI-2 to PI-9

Resins PI-2 to PI-9 were obtained according to the same procedure as in Synthesis Example P-53 (synthesis method of the resin PI-1), except that the amount of the macromonomer and the polymerizable monomer used was adjusted such that the content of the structural unit A (derived from the macromonomer) and the structural unit B (derived from the polymerizable monomer) in one molecule of the resin became the content described in Table 2-3, the amount of the polymerization initiator and the chain transfer agent used was adjusted such that the weight-average molecular weight of the resin became the weight-average molecular weight described in Table 2-3, and the amount of the compound added which contained a dissociable group and an ethylenically unsaturated group was adjusted such that the C=C value of the resin became the value described in Table 2-3.

TABLE 6

| Table 2-3 | Resin | Constitution of polymer drain | | | | | Characteristics of resin | | |
|---|---|---|---|---|---|---|---|---|---|
| | | Structural unit A | | Structural unit B | | | | | |
| | | | | Polymerizable | | Compound used | | | |
| | | Macro-monomer | Content (% by mass) | monomer containing acid group | Content (% by mass) | for introducing curable group into resin | Weight-average molecular weight | Acid value (mgKOH/g) | C=C value (mmol/g) |
| Synthesis Example P-53 | PI-1 | A-1 | 30 | M5300 | 70 | L-6 | 18,000 | 70 | 0.8 |
| Synthesis Example P-54 | PI-2 | A-1 | 30 | M5300 | 70 | L-5 | 19,000 | 70 | 0.8 |
| Synthesis Example P-55 | PI-3 | A-1 | 30 | M5300 | 70 | L-7 | 18,000 | 70 | 0.8 |
| Synthesis Example P-56 | PI-4 | A-1 | 30 | M5300 | 70 | L-8 | 18,000 | 70 | 0.7 |
| Synthesis Example P-57 | PI-5 | A-1 | 30 | M5300 | 70 | p-Chloromethyl styrene | 18,000 | 70 | 0.8 |
| Synthesis Example P-58 | PI-6 | A-1 | 30 | M5300 | 70 | L-9 | 18,000 | 70 | 0.8 |
| Synthesis Example P-59 | PI-7 | A-7 | 30 | M5300 | 70 | L-6 | 14,000 | 70 | 0.8 |
| Synthesis Example P-60 | PI-8 | A-9 | 30 | M5300 | 70 | L-6 | 13,000 | 70 | 0.8 |
| Synthesis Example P-61 | PI-9 | A-10 | 30 | M5300 | 70 | L-6 | 15,000 | 70 | 0.8 |

Synthesis Example P-62: Synthesis of Resin PJ-1

A macromonomer A-1 solution (60 g) having a concentration of 50% by mass (PGMEA: 30 g, macromonomer A-1 (30 g)), CB-1 (70 g), and 203.4 g of butyl acetate were introduced into a three-neck flask having a volume of 3,000 mL, thereby obtaining a mixture. The mixture was stirred in a state where nitrogen was being blown thereinto. Then, while nitrogen was being allowed to flow in the flask, the mixture was heated to 75° C. Thereafter, dodecyl mercaptan (0.77 g) and 2,2'-azobis(methyl 2-methylpropionate) (0.39 g, hereinafter, described as "V-601" as well) were added to the mixture, thereby initiating a polymerization reaction. The mixture was heated at 75° C. for 2 hours, and then V-601 (0.39 g) was further added to the mixture. After 2 hours, V-601 (0.39 g) was further added to the mixture. The reaction was continued for 2 hours, and the mixture was heated to 90° C. and stirred for 3 hours. By the above operation, the polymerization reaction was finished. Subsequently, 0.84 g of TEMPO, 4-hydroxybutyl acrylate (13.3 g) as a compound (compound used for introducing a curable group to the resin) containing a hydroxy group and an ethylenically unsaturated group, triethylamine (9.4 g), and 1-ethyl-3-(3-dimethylaminopropyl)carbodiimide hydrochloric acid (17.7 g) were added thereto, and reacted for 12 hours at 60° C. By $^1$H-NMR measurement, the disappearance of the raw material 4-hydroxybutyl acrylate was confirmed, and then the mixture was cooled to room temperature, 0.1 N aqueous hydrochloric acid (200 mL) was added thereto, and the mixture was stirred for 30 minutes at room temperature. Thereafter, 200 mL of butyl acetate was added thereto, and by performing a liquid separation operation, an organic layer was collected. The obtained organic layer was washed twice with 600 mL of water, and then concentrated to an appropriate amount, thereby obtaining a 20% by mass solution (butyl acetate solution) of the resin PJ-1. The weight-average molecular weight of the obtained resin PJ-1 was 20.000, the acid value of the resin PJ-1 was 75 mgKOH/mg, and the C=C value of the resin PJ-1 was 0.8 mmol/g.

Synthesis Examples P-63 to P-65: Synthesis of Resins PJ-2 to PJ-4

Resins P-63 to P-65 and resins PJ-2 to PJ-4 were obtained according to the same procedure as in Synthesis Example P-62 (synthesis method of the resin PJ-1), except that the amount of the macromonomer and the polymerizable monomer used was adjusted such that the content of the structural unit A (derived from the macromonomer) and the structural unit B (derived from the polymerizable monomer) in one molecule of the resin became the content described in Table 2-4, the amount of the polymerization initiator and the chain transfer agent used was adjusted such that the weight-average molecular weight of the resin became the weight-average molecular weight described in Table 2-4, and the amount of the compound added which contained a hydroxy group and an ethylenically unsaturated group was adjusted such that the C=C value of the resin became the value described in Table 2-4.

TABLE 7

| Table 2-4 | Resin | Structural unit A Macro-monomer | Content (% by mass) | Structural unit B Polymerizable monomer containing acid group | Content (% by mass) | Compound used for introducing curable group into resin | Weight-average molecular weight | Acid value (mgKOH/g) | C=C value (mmol/g) |
|---|---|---|---|---|---|---|---|---|---|
| Synthesis Example P-62 | PJ-1 | A-1 | 30 | CB-1 | 70 | 4-Hydroxybutyl acrylate | 20,000 | 75 | 0.8 |
| Synthesis Example P-63 | PJ-2 | A-7 | 30 | CB-1 | 70 | 4-Hydroxybutyl acrylate | 16,000 | 75 | 0.8 |
| Synthesis Example P-64 | PJ-3 | A-9 | 30 | CB-1 | 70 | 4-Hydroxybutyl acrylate | 15,000 | 75 | 0.8 |
| Synthesis Example P-65 | PJ-4 | A-10 | 30 | CB-1 | 70 | 4-Hydroxybutyl acrylate | 17,000 | 75 | 0.8 |

Synthesis Example P-66: Synthesis of Resin PK-1

A macromonomer K-1 solution (140 g) having a concentration of 50% by mass (PGMEA: 70 g, macromonomer K-1 (70 g)), CB-1 (30 g), and 163.4 g of butyl acetate were introduced into a three-neck flask having a volume of 3,000 mL, thereby obtaining a mixture. The mixture was stirred in a state where nitrogen was being blown thereinto. Then, while nitrogen was being allowed to flow in the flask, the mixture was heated to 75° C. Thereafter, dodecyl mercaptan (0.77 g) and 2,2'-azobis(methyl 2-methylpropionate) (0.39 g, hereinafter, described as "V-601" as well) were added to the mixture, thereby initiating a polymerization reaction. The mixture was heated at 75° C. for 2 hours, and then V-601 (0.39 g) was further added to the mixture. After 2 hours, V-601 (0.39 g) was further added to the mixture. The reaction was continued for 2 hours, and the mixture was heated to 90° C. and stirred for 3 hours. By the above operation, the polymerization reaction was finished. Subsequently, 0.84 g of TEMPO and triethylamine (9.4 g) were added thereto, and reacted for 12 hours at 60° C. By $^1$H-NMR measurement, the disappearance of a propionyl chloride portion on a terminal of the macromonomer K-1 was confirmed, and then the mixture was cooled to room temperature. 0.1 N aqueous hydrochloric acid (200 mL) was added thereto, and the mixture was stirred for 30 minutes at room temperature. Thereafter, 200 mL of butyl acetate was added thereto, and then by performing a liquid separation operation, an organic layer was collected. The obtained organic layer was washed twice with 600 mL of water, and then concentrated to an appropriate amount, thereby obtaining a 20% by mass solution (butyl acetate solution) of the resin PK-1. The weight-average molecular weight of the obtained resin PK-1 was 30,000, the acid value of the resin PK-1 was 60 mgKOH/mg, and the C=C value of the resin PK-1 was 0.3 mmol/g.

Synthesis Examples P-67 to P-70: Synthesis of Resins PK-2 to PK-5

Resins P-67 to P-70 and resins PK-2 to PK-5 were obtained according to the same procedure as in Synthesis Example P-66 (synthesis method of the resin PK-1), except that the amount of the macromonomer and the polymerizable monomer used was adjusted such that the content of the structural unit A (derived from the macromonomer) and the structural unit B (derived from the polymerizable monomer) in one molecule of the resin became the content described in Table 2-5, and the amount of the polymerization initiator and the chain transfer agent used was adjusted such that the weight-average molecular weight of the resin became the weight-average molecular weight described in Table 2-5.

TABLE 8

| Table 2-5 | Resin | Structural unit A Macromonomer | Content (% by mass) | Structural unit B Polymerizable monomer containing acid group | Content (% by mass) | Weight-average molecular weight | Acid value (mgKOH/g) | C=C value (mmol/g) |
|---|---|---|---|---|---|---|---|---|
| Synthesis Example P-66 | PK-1 | K-1 | 70 | CB-1 | 30 | 30,000 | 60 | 0.3 |
| Synthesis Example P-67 | PK-2 | K-2 | 70 | CB-1 | 30 | 20,000 | 60 | 0.5 |
| Synthesis Example P-68 | PK-3 | K-2 | 70 | M5300 | 30 | 22,000 | 60 | 0.5 |
| Synthesis Example P-69 | PK-4 | K-2 | 70 | HO-MS | 30 | 18,000 | 75 | 0.5 |
| Synthesis Example P-70 | PK-5 | K-5 | 70 | CB-1 | 30 | 18,000 | 60 | 0.7 |

Synthesis Example P-71: Synthesis of Resin PL-1

A macromonomer A-1 solution (100 g) having a concentration of 50% by mass (PGMEA: 50 g, macromonomer A-1 (50 g)), HO-MS (25 g), L-12 (25 g), and 183.3 g of butyl acetate were introduced into a three-neck flask having a volume of 1,000 mL, thereby obtaining a mixture. The mixture was stirred in a state where nitrogen was being blown thereinto. Then, while nitrogen was being allowed to flow in the flask, the mixture was heated to 75° C. Thereafter, V-601 (1.08 g) was added to the mixture, thereby initiating a polymerization reaction. The mixture was heated at 75° C. for 2 hours, and then V-601 (1.08 g) was further added to the mixture. After 2 hours, V-601 (1.08 g) was further added to the mixture. The reaction was continued for 2 hours, and the mixture was heated to 90° C. and stirred for 3 hours. By the above operation, the polymerization reaction was finished. Subsequently, 1.06 g of TEMPO and triethylamine (10.4 g) were added thereto, and reacted for 12 hours at 60° C. By $^1$H-NMR measurement, the disappearance of a propionyl chloride portion on a terminal of L-12 was confirmed, and then the mixture was cooled to room temperature. 0.1 N aqueous hydrochloric acid (200 mL) was added thereto, and the mixture was stirred for 30 minutes at room temperature. Thereafter, 200 mL of butyl acetate was added thereto, and then by performing a liquid separation operation, an organic layer was collected. The obtained organic layer was washed twice with 600 mL of water, and then concentrated to an appropriate amount, thereby obtaining a 20% by mass solution (butyl acetate solution) of the resin PL-1. The weight-average molecular weight of the obtained resin PL-1 was 20,000, the acid value of the resin PL-1 was 65 mgKOH/mg, and the C=C value of the resin PL-1 was 1.1 mmol/g.

tural unit C in one molecule of the resin became the content described in Table 2-6, and the amount of the polymerization initiator used was adjusted such that the weight-average molecular weight of the resin became the weight-average molecular weight described in Table 2-6.

TABLE 9

| Table 2-6 | Resin | Constitution of polymer chain | | | | | | Characteristics of resin | | |
|---|---|---|---|---|---|---|---|---|---|---|
| | | Structural unit A | Structural unit B | | | Structural unit C | | Weight-average molecular weight | Acid value (mgKOH/g) | C=C value (mmol/g) |
| | | Macro-monomer | Content (% by mass) | Polymerizable monomer containing acid group | Content (% by mass) | Compound | Content (% by mass) | | | |
| Synthesis Example P-71 | PL-1 | A-1 | 50 | HO-MS | 25 | L-12 | 25 | 20,000 | 65 | 1.1 |
| Synthesis Example P-72 | PL-2 | A-7 | 50 | HO-MS | 25 | L-12 | 25 | 15,000 | 65 | 1.1 |
| Synthesis Example P-73 | PL-3 | A-9 | 50 | HO-MS | 25 | L-12 | 25 | 15,000 | 65 | 1.1 |
| Synthesis Example P-74 | PL-4 | A-10 | 50 | HO-MS | 25 | L-12 | 25 | 16,000 | 65 | 1.1 |
| Synthesis Example P-75 | PL-5 | A-7 | 50 | HO-MS | 25 | L-11 | 25 | 40,000 | 65 | 1.0 |

Synthesis Examples P-72 to P-75: Synthesis of Resins PL-2 to PL-5

Resins PL-2 to PL-5 were obtained according to the same procedure as in Synthesis Example P-71 (synthesis method of the resin PL-1), except that the amount of the macromonomer and the polymerizable monomer used was adjusted such that the content of the structural unit A (derived from the macromonomer), the structural unit B (derived from the polymerizable monomer), and the struc- Synthesis Example P-76: Synthesis of Resin PM-1

A macromonomer B-1 solution (140 g) having a concentration of 50% by mass (PGMEA: 70 g, macromonomer B-1 (70 g)), MAA (12 g), BnMA (18 g), and 163.3 g of butyl acetate were introduced into a three-neck flask having a volume of 1,000 mL, thereby obtaining a mixture. A macromonomer A-1 solution (100 g) having a concentration of 50% by mass (PGMEA: 50 g, macromonomer A-1 (50 g)), HO-MS (25 g), L-12 (25 g), and 183.3 g of butyl acetate were introduced into a three-neck flask having a volume of 1,000 mL, thereby obtaining a mixture. The mixture was stirred in a state where nitrogen was being blown thereinto. Then, while nitrogen was being allowed to flow in the flask, the mixture was heated to 75° C. Thereafter, dodecyl mercaptan (0.77 g) and V-601 (0.39 g) were added to the mixture, thereby initiating a polymerization reaction. The mixture was heated at 75° C. for 2 hours, and then V-601 (0.39 g) was further added to the mixture. After 2 hours, V-601 (0.39 g) was further added to the mixture. The reaction was continued for 2 hours, and the mixture was heated to 90° C. and stirred for 3 hours. By the above operation, the polymerization reaction was finished. Subsequently, 0.77 g of TEMPO and triethylamine (3.0 g) were added thereto, and acrylic acid chloride (2.7 g) was added dropwise thereto at room temperature. The mixture was reacted as it at room temperature for 12 hours. By $^1$H-NMR measurement, the disappearance of the acrylic acid chloride portion was confirmed, 200 mL of 0.1 N aqueous hydrochloric acid was then added thereto, and the mixture was stirred for 30 minutes at room temperature. Butyl acetate (200 mL) was added thereto, and then a liquid separation operation was performed, thereby collecting an organic layer. The obtained organic layer was washed twice with 300 mL of water, and then concentrated to an appropriate amount, thereby obtaining a 20% by mass solution of the resin PM-1. The weight-average molecular weight of the obtained resin PM-1 was 30,000, the acid value of the resin PM-1 was 75 mgKOH/mg, and the C=C value of the resin PM-1 was 0.3 mmol/g.

Synthesis Example P-77: Synthesis of Resin PN-1

M5300 (200 g) and 466.7 g of MFG were introduced into a three-neck flask having a volume of 2,000 mL, thereby obtaining a mixture. The mixture was stirred in a state where nitrogen was being blown thereinto. Then, while nitrogen was being allowed to flow in the flask, the mixture was heated to 75° C. Thereafter, dodecyl mercaptan (1.48 g) and 2,2'-azobis(methyl 2-methyl propionate) (0.67 g, hereinafter, described as "V-601" as well) were added in this order to the mixture, thereby initiating a polymerization reaction. The mixture was heated at 75° C. for 2 hours, and then V-601 (0.67 g) was further added to the mixture. After 2 hours, V-601 (0.67 g) was further added to the mixture. The reaction was continued for 2 hours, and then the mixture was heated to 90° C. and stirred for 3 hours. By the above operation, the polymerization reaction was finished.

After the finish of the reaction, in the air, dimethyl dodecylamine (6.0 g) and TEMPO (2.46 g) were added thereto, and then L-4 (190 g) was added thereto. In the air, the reaction was continued for 24 hours at 90° C., and then by measuring the acid value, the finish of the reaction was confirmed. By adding PGMEA (1,086 g) to the obtained mixture, a 20% by mass solution of the resin PN-1 was obtained. The weight-average molecular weight of the obtained resin PN-1 was 24,000, the acid value of the resin PN-1 was 70 mgKOHimg, and the C=C value of the resin PN-1 was 0.35 mmol/g.

Synthesis Example P-78: Synthesis of Resin PN-2

M5300 (200 g) and 466.7 g of MFG were introduced into a three-neck flask having a volume of 2,000 mL, thereby obtaining a mixture. The mixture was stirred in a state where nitrogen was being blown thereinto. Then, while nitrogen was being allowed to flow in the flask, the mixture was heated to 75° C. Thereafter, dodecyl mercaptan (1.48 g) and V-601 (0.67 g) were added in this order to the mixture, thereby initiating a polymerization reaction. The mixture was heated at 75° C. for 2 hours, and then V-601 (0.67 g) was further added to the mixture. After 2 hours, V-601 (0.67 g) was further added to the mixture. The reaction was continued for 2 hours, and the mixture was heated to 90° C. and stirred for 3 hours. By the above operation, the polymerization reaction was finished.

After the finish of the reaction, in the air, dimethyl dodecylamine (6.0 g) and TEMPO (2.46 g) were added thereto, and then A4HBAGE (manufactured by Nippon Kasei Chemical Co., Ltd) (64 g) was added thereto. In the air, the reaction was continued for 24 hours at 90° C., and then by measuring the acid value, the finish of the reaction was confirmed. By adding PGMEA (600 g) to the obtained mixture, a 20% by mass solution of the resin PN-2 was obtained. The weight-average molecular weight of the obtained resin PN-2 was 10,000, the acid value of the resin PN-2 was 70 mgKOH/mg, and the C=C value of the resin PN-2 was 1.2 mmol/g.

Synthesis Example P-79: Synthesis of Resin PO-1

M5300 (200 g) and 466.7 g of N,N-dimethylacetamide were introduced into a three-neck flask having a volume of 5,000 mL, thereby obtaining a mixture. The mixture was stirred in a state where nitrogen was being blown thereinto. Then, while nitrogen was being allowed to flow in the flask, the mixture was heated to 75° C. Thereafter, dodecyl mercaptan (1.48 g) and V-601 (0.67 g) were added in this order to the mixture, thereby initiating a polymerization reaction. The mixture was heated at 75° C. for 2 hours, and then V-601 (0.67 g) was further added to the mixture. After 2 hours, V-601 (0.67 g) was further added to the mixture. The reaction was continued for 2 hours, and then the mixture was heated to 90° C. and stirred for 3 hours. By the above operation, the polymerization reaction was finished.

After the finish of the reaction, 287 g of N,N-dimethylacetamide, 3.0 g of TEMPO, L-10 as a compound (compound used for introducing a curable group into the resin) containing a dissociable group and an ethylenically unsaturated group (105 g), and potassium carbonate (fine powder grade, manufactured by NIPPON SODA CO., LTD., 142 g) were added thereto, and reacted for 2 hours at 80° C. By $^1$H-NMR measurement, the disappearance of the raw material L-10 was confirmed, and then the mixture was cooled to a temperature equal to or lower than 5° C. While the internal temperature of the flask was being kept at a temperature equal to or lower than 20° C., 1,300 mL of 1 N aqueous hydrochloric acid was added dropwise thereto. After the finish of the dropwise addition, 1,200 mL of butyl acetate was added thereto, and the mixture was stirred for 30 minutes at room temperature. Then, by performing a liquid separation operation, an organic layer was collected. The obtained organic layer was washed twice with 600 mL of water and concentrated to an appropriate amount, thereby obtaining a 20% by mass solution (butyl acetate solution) of the resin PO-1. The weight-average molecular weight of the obtained resin PO-1 was 22,000, the acid value of the resin PO-1 was 90 mgKOH/mg, and the C=C value of the resin PI-1 was 0.5 mmoL/g.

Synthesis Example P-82: Synthesis of Resin PP-1

A macromonomer A-7 solution (155 g) having a concentration of 50% by mass (PGMEA: 77.5 g, macromonomer A-7 (77.5 g)), M5300 (137.5 g), 2-hydroxypropyl methacrylate (35.0 g), and PGMEA (506 g) were introduced into a three-neck flask having a volume of 3,000 mL, thereby obtaining a mixture. The mixture was stirred in a state where nitrogen was being blown thereinto. Then, while nitrogen was being allowed to flow in the flask, the mixture was heated to 75° C. Thereafter, dodecyl mercaptan (6.92 g) and V-601 (3.50 g) were added in this order to the mixture, thereby initiating a polymerization reaction. The mixture was heated at 75° C. for 2 hours, and then V-601 (3.50 g) was further added to the mixture. After 2 hours, V-601 (3.50 g) was further added to the mixture. The reaction was continued for 2 hours, and the mixture was heated to 90° C. and stirred for 3 hours. By the above operation, the polymerization reaction was finished.

After the finish of the reaction, the mixture was cooled to 60° C., and the blowing of nitrogen into the flask was stopped. Then, TEMPO (2.43 g) was added thereto, and then AOI (34.3 g) and NEOSTANN U-600 (manufactured by NITTO KASEI CO., LTD., 0.50 g) were added thereto. The reaction was continued for 12 hours, and then by $^1$H-nuclear magnetic resonance (NMR) measurement, the disappearance of the raw material AOI was confirmed. By adding PGMEA (576 g) to the obtained mixture, a 20% by mass solution of the resin PP-1 was obtained. The weight-average molecular weight of the obtained resin PP-1 was 12,000, and the acid value of the resin PP-1 was 85 mgKOH/mg.

Preparation Example 1: Preparation of Colorant Dispersion PD-1

Colorant: titanium black (TiON, average primary particle diameter: 20 nm): 45 parts by mass
Dispersant (resin PB-1) (solid contents: 20% by mass): 67.5 parts by mass (solid contents: 13.5 parts by mass)
Polymerization inhibitor (TEMPO): 0.1 parts by mass
Solvent: propylene glycol monomethyl ether acetate: 67.5 parts by mass
By mixing the above components together, a mixture was obtained.
Then, by using a beads mill (zirconia beads: 0.3 mm), the mixture was dispersed in a state of being kept at a liquid temperature of 23° C. thereby obtaining a colorant dispersion PD-1.

Preparation Examples 2 to 53 and Preparation Examples C1 to C4

Colorant dispersions PD-2 to PD-27 and PD-32 to PD-57 containing resins PA-1 to PA-25 to PB-1 to PB-9 were obtained by the same method as that in Preparation Example 1, except that the type of the resin, the type of the polymerization inhibitor, the content, and the liquid temperature of the colorant dispersion described in Table 3 were adopted.

[Evaluation of Temporal Stability]

The viscosity of each of the colorant dispersions was measured immediately after the colorant dispersions were prepared and after the colorant dispersions were left to stand for 3 days in a constant-temperature environment with a temperature of 45° C., and based on the change in viscosity, the temporal stability was evaluated. The evaluation was performed based on the following standards, and the results are shown in Table 3.

The viscosity change is a viscosity increase rate calculated by the following formula. "Viscosity of colorant dispersion" in the following formula is a value measured using an E-type viscometer (R85 model, manufactured by TOKI SANGYO CO., LTD.) based on the testing method described in Japanese Industrial Standards (JIS) K5101-6-2:2004.

Viscosity increase rate=[(viscosity of colorant dispersion after being left to stand for 3 days in a constant-temperature environment with a temperature of 45° C.−viscosity of colorant dispersion measured immediately after preparation of the colorant dispersion)/(viscosity of colorant dispersion measured immediately after preparation of the colorant dispersion)]×100 (Formula)

AA: The viscosity was not increased. Viscosity increase rate: equal to or higher than 0% and equal to or lower than 3%
A: The viscosity was slightly increased, but no problem occurred. Viscosity increase rate: higher than 3% and equal to or lower than 5%
B: The viscosity was increased to a certain extent, but no problem occurred. Viscosity increase rate: higher than 5% and equal to or lower than 10%
C: The viscosity was significantly increased. Viscosity increase rate: higher than 10%

TABLE 10

| Table 3-1 | Colorant dispersion | Resin | Polymerization inhibitor Type | Content (part by mass) | Liquid temperature of colorant dispersion | Temporal stability |
|---|---|---|---|---|---|---|
| Preparation Example 1 | PD-1 | PB-1 | TEMPO | 0.1 | 23° C. | AA |
| Preparation Example 2 | PD-2 | PB-2 | TEMPO | 0.1 | 23° C. | A |
| Preparation Example 3 | PD-3 | PB-3 | TEMPO | 0.1 | 23° C. | A |
| Preparation Example 4 | PD-4 | PB-4 | TEMPO | 0.1 | 23° C. | A |
| Preparation Example 5 | PD-5 | PB-5 | TEMPO | 0.1 | 23° C. | A |
| Preparation Example 6 | PD-6 | PB-7 | TEMPO | 0.1 | 23° C. | A |
| Preparation Example 7 | PD-7 | PB-8 | TEMPO | 0.1 | 23° C. | A |
| Preparation Example 8 | PD-8 | PA-1 | TEMPO | 0.1 | 23° C. | AA |
| Preparation Example 9 | PD-9 | PA-2 | TEMPO | 0.1 | 23° C. | A |
| Preparation Example 10 | PD-10 | PA-3 | TEMPO | 0.1 | 23° C. | A |
| Preparation Example 11 | PD-11 | PA-4 | TEMPO | 0.1 | 23° C. | A |
| Preparation Example 12 | PD-12 | PA-5 | TEMPO | 0.1 | 23° C. | A |
| Preparation Example 13 | PD-13 | PA-7 | TEMPO | 0.1 | 23° C. | A |
| Preparation Example 14 | PD-14 | PA-8 | TEMPO | 0.1 | 23° C. | A |
| Preparation Example 15 | PD-15 | PA-9 | TEMPO | 0.1 | 23° C. | A |
| Preparation Example 16 | PD-16 | PB-1 | TEMPO MEHQ | 0.05 0.05 | 23° C. | AA |
| Preparation Example 17 | PD-17 | PB-1 | TEMPO BHT | 0.05 0.05 | 23° C. | AA |

TABLE 10-continued

| Table 3-1 | Colorant dispersion | Resin | Polymerization inhibitor Type | Content (part by mass) | Liquid temperature of colorant dispersion | Temporal stability |
|---|---|---|---|---|---|---|
| Preparation Example 18 | PD-18 | PB-1 | TEMPO | 0.03 | 23° C. | B |
| Preparation Example 19 | PD-19 | PB-1 | TEMPO | 0.5 | 23° C. | B |
| Preparation Example 20 | PD-26 | PA-11 | TEMPO | 0.1 | 23° C. | B |
| Preparation Example 21 | PD-27 | PA-12 | TEMPO | 0.1 | 23° C. | B |
| Preparation Example 22 | PD-24 | PA-6 | TEMPO | 0.1 | 23° C. | B |
| Preparation Example 23 | PD-25 | PB-6 | TEMPO | 0.1 | 23° C. | B |
| Preparation Example 28 | PD-32 | PA-13 | TEMPO | 0.1 | 23° C. | AA |
| Preparation Example 29 | PD-33 | PA-14 | TEMPO | 0.1 | 23° C. | A |

TABLE 11

| Table 3-2 | Colorant dispersion | Resin | Polymerization inhibitor Type | Content (part by mass) | Liquid temperature of colorant dispersion | Temporal stability |
|---|---|---|---|---|---|---|
| Preparation Example 30 | PD-34 | PA-15 | TEMPO | 0.1 | 23° C. | A |
| Preparation Example 31 | PD-35 | PA-16 | TEMPO | 0.1 | 23° C. | A |
| Preparation Example 32 | PD-36 | PA-17 | TEMPO | 0.1 | 23° C. | A |
| Preparation Example 33 | PD-37 | PA-18 | TEMPO | 0.1 | 23° C. | A |
| Preparation Example 34 | PD-38 | PA-19 | TEMPO | 0.1 | 23° C. | A |
| Preparation Example 35 | PD-39 | PA-20 | TEMPO | 0.1 | 23° C. | A |
| Preparation Example 36 | PD-40 | PA-21 | TEMPO | 0.1 | 23° C. | A |
| Preparation Example 37 | PD-41 | PA-22 | TEMPO | 0.1 | 23° C. | A |
| Preparation Example 38 | PD-42 | PA-23 | TEMPO | 0.1 | 23° C. | A |
| Preparation Example 39 | PD-43 | PA-24 | TEMPO | 0.1 | 23° C. | AA |
| Preparation Example 40 | PD-44 | PA-25 | TEMPO | 0.1 | 23° C. | AA |
| Preparation Example 41 | PD-45 | PA-13 | MEHQ | 0.1 | 23° C. | A |
| Preparation Example 42 | PD-46 | PA-13 | BHT | 0.1 | 23° C. | A |
| Preparation Example 43 | PD-47 | PA-24 | TEMPO | 0.1 | 45° C. | AA |
| Preparation Example 44 | PD-48 | PB-1 | TEMPO | 0.1 | 45° C. | AA |
| Preparation Example 45 | PD-49 | PB-1 | TEMPO | 0.03 | 45° C. | A |
| Preparation Example 46 | PD-50 | PB-2 | TEMPO | 0.1 | 63° C. | B |
| Preparation Example 47 | PD-51 | PB-2 | TEMPO | 0.1 | 50° C. | AA |
| Preparation Example 48 | PD-52 | PB-2 | TEMPO | 0.1 | 45° C. | AA |
| Preparation Example 49 | PD-53 | PB-2 | TEMPO | 0.1 | 30° C. | AA |
| Preparation Example 50 | PD-54 | PB-2 | TEMPO | 0.1 | 10° C. | A |
| Preparation Example 51 | PD-55 | PB-2 | TEMPO | 0.1 | 5° C. | A |
| Preparation Example 52 | PD-56 | PB-2 | TEMPO | 0.1 | 2° C. | B |

TABLE 11-continued

| Table 3-2 | Colorant dispersion | Resin | Polymerization inhibitor Type | Content (part by mass) | Liquid temperature of colorant dispersion | Temporal stability |
|---|---|---|---|---|---|---|
| Preparation Example 53 | PD-57 | PB-2 | TEMPO | 0.1 | 55° C. | A |
| Preparation Example C1 | PD-20 | PA-1 | | | 23° C. | C |
| Preparation Example C2 | PD-21 | PB-1 | | | 23° C. | C |
| Preparation Example C3 | PD-22 | PA-10 | TEMPO | 0.1 | 23° C. | A |
| Preparation Example C4 | PD-23 | PB-9 | TEMPO | 0.1 | 23° C. | A |

The abbreviations in Table 3 means the following compounds

TEMPO: 2,2,6,6-tetramethylpiperidin-1-oxyl, corresponding to free radical-based polymerization inhibitor and hindered amine compound.

MEHQ: 4-methoxyphenol, corresponding to phenol-based polymerization inhibitor.

BHT: 2,6-di-tert-butyl-4-methylphenol, corresponding to phenol-based polymerization inhibitor.

As is evident from the results shown in Table 3, the colorant dispersions of Preparation Examples 1 to 23 and Preparation Examples 28 to 42 had temporal stability better than that of Preparation Examples C and C2. Presumably, this effect may be exhibited because the colorant dispersions contain a polymerization inhibitor.

The colorant dispersion of Preparation Example 1 had temporal stability better than that of the colorant dispersions of Preparation Examples 22 and 23. Presumably, this is because the resin contains a polymer chain derived from two or more kinds of cyclic compounds. That is, presumably, in the colorant dispersions of Preparation Examples 22 and 23 containing a resin containing a polymer chain derived from one kind of cyclic compound, the resin may be more easily crystallized. In contrast, presumably, in the colorant dispersion of Preparation Example 1 containing a resin containing a polymer chain derived from two or more kinds of cyclic compounds, the stereoregularity of the polymer chain of the resin may be lower, and crystallization may hardly occur, and hence the temporal stability may be further improved.

The colorant dispersions of Preparation Examples 16 and 17 had temporal stability better than that of the colorant dispersion of Preparation Example 1. Presumably, this is because the colorant dispersion contains two or more kinds of polymerization inhibitors.

The colorant dispersion of Preparation Example 28 had temporal stability better than that of colorant dispersions of Preparation Examples 41 and 42. Presumably, this effect may be exhibited because the colorant dispersion contains a free radical-based polymerization inhibitor (hindered amine compound: TEMPO).

The colorant dispersions of Preparation Examples 28, 39, and 40 had temporal stability better than that of the colorant dispersion of Preparation Example 29. Presumably, this is because the resin PA-13 contains the structural unit B represented by Formula (B1-2), and as a result, it is more difficult for the components of the colorant dispersion to be precipitated.

Furthermore, the colorant dispersion having a liquid temperature equal to or higher than 30° C. could shorten the time taken for the dispersion treatment by 30% compared to the colorant dispersion having a liquid temperature of 23° C.

Preparation Examples 54 to 100

Colorant dispersions PD-58 to PD-105 containing resins PA-26 to PA-39, PB-10 to PB-12, PH-1, PI-1 to PI-9, PJ-1 to PJ-4, PK-1 to PK-5, PL- to PL-5, PM-1, PN-1, PN-2, PO-1. PA-40 to PA-41, and PP-1 were obtained by the same method as that in Preparation Example 1, except that the resins shown in Table 3-1 were used. The temporal stability of the obtained colorant dispersions was evaluated by the aforementioned method, and the results are shown in Table 3-1.

TABLE 12

| Table 3-1 | Colorant dispersion | Resin | Polymerization inhibitor Type | Content (part by mass) | Liquid temperature of colorant dispersion | Temporal stability |
|---|---|---|---|---|---|---|
| Preparation Example 54 | PD-58 | PA-26 | TEMPO | 0.1 | 23° C. | B |
| Preparation Example 55 | PD-59 | PA-27 | TEMPO | 0.1 | 23° C. | B |
| Preparation Example 56 | PD-60 | PA-28 | TEMPO | 0.1 | 23° C. | B |
| Preparation Example 57 | PD-61 | PA-29 | TEMPO | 0.1 | 23° C. | B |
| Preparation Example 58 | PD-62 | PA-30 | TEMPO | 0.1 | 23° C. | B |
| Preparation Example 59 | PD-63 | PA-31 | TEMPO | 0.1 | 23° C. | B |

TABLE 12-continued

| Table 3-1 | Colorant dispersion | Resin | Polymerization inhibitor Type | Polymerization inhibitor Content (part by mass) | Liquid temperature of colorant dispersion | Temporal stability |
|---|---|---|---|---|---|---|
| Preparation Example 60 | PD-64 | PA-32 | TEMPO | 0.1 | 23° C. | B |
| Preparation Example 61 | PD-65 | PA-33 | TEMPO | 0.1 | 23° C. | B |
| Preparation Example 62 | PD-66 | PA-34 | TEMPO | 0.1 | 23° C. | B |
| Preparation Example 63 | PD-67 | PA-35 | TEMPO | 0.1 | 23° C. | B |
| Preparation Example 64 | PD-68 | PA-36 | TEMPO | 0.1 | 23° C. | A |
| Preparation Example 65 | PD-69 | PA-37 | TEMPO | 0.1 | 23° C. | A |
| Preparation Example 66 | PD-70 | PA-38 | TEMPO | 0.1 | 23° C. | B |
| Preparation Example 67 | PD-71 | PA-39 | TEMPO | 0.1 | 23° C. | B |
| Preparation Example 68 | PD-72 | PB-10 | TEMPO | 0.1 | 23° C. | AA |
| Preparation Example 69 | PD-73 | PB-11 | TEMPO | 0.1 | 23° C. | AA |
| Preparation Example 70 | PD-74 | PB-12 | TEMPO | 0.1 | 23° C. | A |
| Preparation Example 71 | PD-75 | PH-1 | TEMPO | 0.1 | 23° C. | B |
| Preparation Example 72 | PD-76 | PI-1 | TEMPO | 0.1 | 23° C. | AA |
| Preparation Example 73 | PD-77 | PI-2 | TEMPO | 0.1 | 23° C. | AA |
| Preparation Example 74 | PD-78 | PI-3 | TEMPO | 0.1 | 23° C. | AA |
| Preparation Example 75 | PD-79 | PI-4 | TEMPO | 0.1 | 23° C. | AA |
| Preparation Example 76 | PD-80 | PI-5 | TEMPO | 0.1 | 23° C. | AA |
| Preparation Example 77 | PD-81 | PI-6 | TEMPO | 0.1 | 23° C. | AA |
| Preparation Example 78 | PD-82 | PI-7 | TEMPO | 0.1 | 23° C. | B |
| Preparation Example 79 | PD-83 | PI-8 | TEMPO | 0.1 | 23° C. | B |
| Preparation Example 80 | PD-84 | PI-9 | TEMPO | 0.1 | 23° C. | B |
| Preparation Example 81 | PD-85 | PJ-1 | TEMPO | 0.1 | 23° C. | AA |
| Preparation Example 82 | PD-86 | PJ-2 | TEMPO | 0.1 | 23° C. | B |
| Preparation Example 83 | PD-87 | PJ-3 | TEMPO | 0.1 | 23° C. | B |
| Preparation Example 84 | PD-88 | PJ-4 | TEMPO | 0.1 | 23° C. | B |
| Preparation Example 85 | PD-89 | PK-1 | TEMPO | 0.1 | 23° C. | AA |
| Preparation Example 86 | PD-90 | PK-2 | TEMPO | 0.1 | 23° C. | B |
| Preparation Example 87 | PD-91 | PK-3 | TEMPO | 0.1 | 23° C. | B |
| Preparation Example 88 | PD-92 | PK-4 | TEMPO | 0.1 | 23° C. | B |
| Preparation Example 89 | PD-93 | PK-5 | TEMPO | 0.1 | 23° C. | A |
| Preparation Example 90 | PD-94 | PL-1 | TEMPO | 0.1 | 23° C. | AA |
| Preparation Example 91 | PD-95 | PL-2 | TEMPO | 0.1 | 23° C. | B |
| Preparation Example 92 | PD-96 | PL-3 | TEMPO | 0.1 | 23° C. | B |
| Preparation Example 93 | PD-97 | PL-4 | TEMPO | 0.1 | 23° C. | B |
| Preparation Example 94 | PD-98 | PL-5 | TEMPO | 0.1 | 23° C. | B |
| Preparation Example 95 | PD-99 | PM-1 | TEMPO | 0.1 | 23° C. | AA |
| Preparation Example 96 | PD-100 | PN-1 | TEMPO | 0.1 | 23° C. | B |

TABLE 12-continued

| Table 3-1 | Colorant dispersion | Resin | Polymerization inhibitor Type | Content (part by mass) | Liquid temperature of colorant dispersion | Temporal stability |
|---|---|---|---|---|---|---|
| Preparation Example 97 | PD-101 | PN-2 | TEMPO | 0.1 | 23° C. | B |
| Preparation Example 98 | PD-102 | PO-1 | TEMPO | 0.1 | 23° C. | B |
| Preparation Example 99 | PD-103 | PA-40 | TEMPO | 0.1 | 23° C. | B |
| Preparation Example 100 | PD-104 | PA-41 | TEMPO | 0.1 | 23° C. | B |
| Preparation Example 101 | PD-105 | PP-1 | TEMPO | 0.1 | 23° C. | B |

Example 1: Preparation of Curable Composition M-1

By using the colorant dispersion PD-1 prepared as above, components (components including the resin PB-1, titanium black, TEMPO, and the like) were mixed together according to the composition shown in Table 4-1, thereby obtaining a curable composition M-1. The solid contents thereof were adjusted using PGMEA such that the final solid contents became 32% by mass.

TABLE 13

Table 4-1 Curable composition M-1

| Component | | | Solid content (% by mass) |
|---|---|---|---|
| Colorant dispersion PD-1 | Resin containing curable group | Resin PB-1 | 17.4 |
| | Colorant | Titanium black (TiON) | 58.0 |
| | Polymerization inhibitor | TEMPO | 0.13 |
| Resin containing curable group | | Resin 1 | Balance |
| Polymerizable compound | | KAYARAD DPHA (manufactured by Nippon Kayaku Co., Ltd.) | 16.5 |
| Polymerization initiator | | Irgacure OXE02 (manufactured by BASF Japan Ltd.) | 4.8 |

"Resin 1" in the above table corresponds to a resin represented by the following formula ("resin containing a curable group"). In the following formula, the numerical value in the structural formula represents a molar ratio. Mw of the resin 1 is 11,000, the acid value of the resin 1 is 70 mgKOH/g, and the C=C value of the resin 1 is 1.1 mmol/g. The resin 1 was synthesized based on the method described in Example 7 in JP2004-300204A.

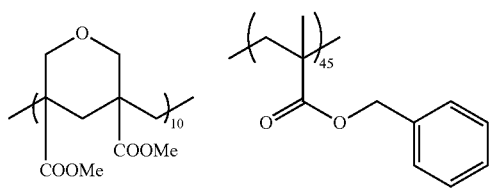

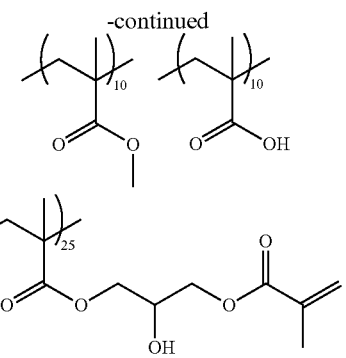

Example 2: Preparation of Curable Composition M-2

By the same method as that in Example 1, components were mixed together according to the composition shown in Table 4-2, thereby obtaining a curable composition M-2. The solid contents thereof were adjusted using PGMEA such that the final solid contents became 32% by mass.

TABLE 14

Table 4-2 Curable composition M-2

| Component | | | Solid contents (% by mass) |
|---|---|---|---|
| Colorant dispersion PD-1 | Resin containing curable group | Resin PB-1 | 19.5 |
| | Colorant | Titanium black (TiON) | 65.0 |
| | Polymerization inhibitor | TEMPO | 0.14 |
| Resin containing curable group | | Resin 1 | Balance |
| Polymerizable compound | | KAYARAD DPHA (manufactured by Nippon Kayaku Co., Ltd.) | 9.6 |
| Polymerization initiator | | Irgacure OXE02 (manufactured by BASF Japan Ltd.) | 3.8 |

Example 3: Preparation of Curable Composition M-3

By the same method as that in Example 1, components were mixed together according to the composition shown in Table 4-3, thereby obtaining a curable composition M-3. The solid contents thereof were adjusted using PGMEA such that the final solid contents became 32% by mass.

TABLE 15

Table 4-3 Curable composition M-3

| Component | | | Solid contents (% by mass) |
|---|---|---|---|
| Colorant dispersion PD-1 | Resin containing curable group | Resin PB-1 | 16.5 |
| | Colorant | Titanium black (TiON) | 55.0 |
| | Polymerization inhibitor | TEMPO | 0.12 |
| Resin containing curable group | | Resin 1 | Balance |
| Polymerizable compound | | KAYARAD DPHA (manufactured by Nippon Kayaku Co., Ltd.) | 16.5 |
| Polymerization initiator | | Irgacure OXE02 (manufactured by BASF Japan Ltd.) | 4.8 |

Example 4 to Example 19 and Example 32 to Example 57: Preparation of Curable Compositions M-4 to M-19 and Curable Compositions M-36 to M-61

Curable compositions M-2 to M-19 and M-36 to M-61 were prepared by the same method as that in Example 1, except that the type of the colorant dispersion was changed as described in Table 5-1.

Example 20: Preparation of Curable Composition M-20

By the same method as that in Example 1, components were mixed together according to the composition shown in Table 4-4, thereby obtaining a curable composition M-20. The solid contents thereof were adjusted using PGMEA such that the final solid contents became 32% by mass.

TABLE 16

Table 4-4 Curable composition M-20

| Component | | | Solid contents (% by mass) |
|---|---|---|---|
| Colorant dispersion PD-18 | Resin containing curable group | Resin PB-1 | 17.4 |
| | Colorant | Titanium black (TiON) | 58.0 |
| | Polymerization inhibitor | TEMPO | 0.04 |
| Resin containing curable group | | Resin 1 | Balance |
| Polymerizable compound | | KAYARAD DPHA (manufactured by Nippon Kayaku Co., Ltd.) | 16.5 |
| Polymerization initiator | | Irgacure OXE02 (manufactured by BASF Japan Ltd.) | 4.8 |

Example 21: Preparation of Curable Composition M-21

By the same method as that in Example 1, components were mixed together according to the composition shown in Table 4-5, thereby obtaining a curable composition M-21. The solid contents thereof were adjusted using PGMEA such that the final solid contents became 32% by mass.

TABLE 17

Table 4-5 Curable composition M-21

| Component | | | Solid contents (% by mass) |
|---|---|---|---|
| Colorant dispersion PD-19 | Resin containing curable group | Resin PB-1 | 17.4 |
| | Colorant | Titanium black (TiON) | 58.0 |
| | Polymerization inhibitor | TEMPO | 0.64 |
| Resin containing curable group | | Resin 1 | Balance |
| Polymerizable compound | | KAYARAD DPHA (manufactured by Nippon Kayaku Co., Ltd.) | 16.5 |
| Polymerization initiator | | Irgacure OXE02 (manufactured by BASF Japan Ltd.) | 4.8 |

Examples 22 and 23: Preparation of Curable Compositions M-28 and M-29

Curable compositions M-28 and M-29 were prepared by the same method as that in Example 1, except that the type of the colorant dispersion was changed as described in Table 5-1.

Examples 24 and 25: Preparation of Curable Compositions M-26 and M-27

Curable compositions M-26 and M-27 were prepared by the same method as that in Example 3, except that the type of the colorant dispersion was changed as described in Table 5-1.

Comparative Examples 1 to 4: Preparation of Curable Compositions M-22 to M-25

Curable compositions M-22 to M-25 were prepared by the same method as that in Example 1, except that the type of the colorant dispersion was changed as described in Table 5-2. That is, curable compositions M-22 and M-23 which did not contain a polymerization inhibitor and curable compositions M-24 and M-25 which did not contain a resin containing a curable group were prepared.

[Preparation (1) of Cured Film (Light Blocking Film)]

By using each of the curable compositions of Examples 1 to 25, Examples 32 to 57, and Comparative Examples 1 to 4, a pattern-like cured film (corresponding to light blocking film) was prepared by the following method.

[Curable Composition Layer-Forming Step]

By adjusting the coating rotation speed of a spin coater such that a dry film thickness became 1.8 μm, a silicon wafer was uniformly coated with each of the curable compositions, thereby forming a curable composition layer.

The silicon wafer was placed on a hot plate with a surface temperature of 120° C. such that the silicon wafer side (surface opposite to the curable composition layer) faced down, and the silicon wafer was heated for 120 seconds. The film thickness of the curable composition layer having undergone heating was 1.8 μm.

[Exposure Step]

Then, by using an i-line stepper. FPA-3000iS+ (manufactured by Canon Inc.), the curable composition layer was irradiated (exposed) in an exposure amount of 400 mJ/cm$^2$ (irradiation time: 0.5 seconds) through a mask comprising a 20 µm linear opening pattern (width: 20 µm, length: 4 mm), thereby obtaining a cured film.

[Heating Step]

Thereafter, the cured film was placed on a hot plate with a surface temperature of 100° C. such that the silicon wafer side faced down, and the cured film was heated for 120 seconds. The film thickness of the obtained cured film was 1.5 µm.

[Development Step]

Subsequently, by using a 0.3% by mass aqueous solution of tetramethylammonium hydroxide (TMAH), the cured film was subjected to puddle development at 23° C., thereby obtaining a pattern-like cured film.

The conditions of the puddle development were as below.

Developer, 0.3% by mass aqueous solution of tetramethylammonium hydroxide

Temperature: 23° C.

Time: 60 seconds

Number of times of development repeated: 5

Rinsing: the wafer was rinsed by means of spin shower and then washed with pure water.

[Post-Baking Step]

By using a clean oven CLH-21CDH (manufactured by Koyo Thermo Systems Co., Ltd.), the pattern-like cured film was heated for 300 seconds at 220° C.

Then, the obtained pattern-like cured film was placed on a hot plate with a surface temperature of 220° C. such that the silicon wafer side faced down, and the cured film was heated for 300 seconds.

[Evaluation 1: Patterning Properties]

The 20 µm linear pattern of the pattern-like cured film obtained as above was imaged using a scanning electron microscope, and LWR of the portion of the 20 µm linear pattern was measured, thereby evaluating the patterning properties. The evaluation was performed based on the following standards. The results are shown in Table 5. For practical use, patterning properties equal to or higher than "C" are preferable.

A: LWR was equal to or smaller than 1 µm.

B: LWR was greater than 1 µm and equal to or smaller than 2 µm.

C: LWR was greater than 2 µm and equal to or smaller than 3 µm.

D: LWR was greater than 3 µm.

[Evaluation 2: Light Blocking Properties]

A glass substrate was coated with each of the curable compositions such that the dry film thickness became 1.8 µm, thereby obtaining a curable composition layer.

By using V-7200F (manufactured by JASCO Corporation), the optical density (OD) of the obtained curable composition layer at a wavelength of 380 to 1,100 nm was calculated. From the values of OD calculated, a minimum OD in a range of a wavelength of 380 to 1,100 nm was extracted and evaluated based on the following standards. The results are shown in Table 5.

A: The minimum OD was equal to or higher than 3.2.

B: The minimum OD was equal to or higher than 3.0 and less than 3.2.

C: The minimum OD was less than 3.0.

TABLE 18

| Table 5-1 | Curable composition | Colorant dispersion | Resin | Content of colorant (% by mass) | D/P | Evaluation Patterning properties | Light blocking properties (OD) |
|---|---|---|---|---|---|---|---|
| Example 1 | M-1 | PD-1 | PB-1 | 58 | 0.3 | A | A |
| Example 2 | M-2 | PD-1 | PB-1 | 65 | 0.3 | A | A |
| Example 3 | M-3 | PD-1 | PB-1 | 55 | 0.3 | A | B |
| Example 4 | M-4 | PD-6 | PB-7 | 58 | 0.3 | C | A |
| Example 5 | M-5 | PD-8 | PA-1 | 58 | 0.3 | A | A |
| Example 6 | M-6 | PD-13 | PA-7 | 58 | 0.3 | B | A |
| Example 7 | M-7 | PD-14 | PA-8 | 58 | 0.3 | C | A |
| Example 8 | M-8 | PD-2 | PB-2 | 58 | 0.3 | B | A |
| Example 9 | M-9 | PD-3 | PB-3 | 58 | 0.3 | B | A |
| Example 10 | M-10 | PD-4 | PB-4 | 58 | 0.3 | B | A |
| Example 11 | M-11 | PD-5 | PB-5 | 58 | 0.3 | B | A |
| Example 12 | M-12 | PD-7 | PB-8 | 58 | 0.3 | B | A |
| Example 13 | M-13 | PD-9 | PA-2 | 58 | 0.3 | B | A |
| Example 14 | M-14 | PD-10 | PA-3 | 58 | 0.3 | B | A |
| Example 15 | M-15 | PD-11 | PA-4 | 58 | 0.3 | B | A |
| Example 16 | M-16 | PD-12 | PA-5 | 58 | 0.3 | B | A |
| Example 17 | M-17 | PD-15 | PA-9 | 58 | 0.3 | B | A |
| Example 18 | M-18 | PD-16 | PB-1 | 58 | 0.3 | A | A |
| Example 19 | M-19 | PD-17 | PB-1 | 58 | 0.3 | A | A |
| Example 20 | M-20 | PD-18 | PB-1 | 58 | 0.3 | C | A |
| Example 21 | M-21 | PD-19 | PB-1 | 58 | 0.3 | C | A |
| Example 22 | M-28 | PD-26 | PA-11 | 58 | 0.3 | C | A |
| Example 23 | M-29 | PD-27 | PA-12 | 58 | 0.3 | C | A |
| Example 24 | M-26 | PD-24 | PA-6 | 55 | 0.3 | C | B |
| Example 25 | M-27 | PD-25 | PB-6 | 55 | 0.3 | C | B |
| Example 32 | M-36 | PD-32 | PA-13 | 58 | 0.3 | A | A |

TABLE 19

| Table 5-2 | Curable composition | Colorant dispersion | Resin | Content of colorant (% by mass) | D/P | Evaluation Patterning properties | Light blocking properties (OD) |
|---|---|---|---|---|---|---|---|
| Example 33 | M-37 | PD-33 | PA-14 | 58 | 0.3 | B | A |
| Example 34 | M-38 | PD-34 | PA-15 | 58 | 0.3 | B | A |
| Example 35 | M-39 | PD-35 | PA-16 | 58 | 0.3 | B | A |
| Example 36 | M-40 | PD-36 | PA-17 | 58 | 0.3 | B | A |
| Example 37 | M-41 | PD-37 | PA-18 | 58 | 0.3 | B | A |
| Example 38 | M-42 | PD-38 | PA-19 | 58 | 0.3 | B | A |
| Example 39 | M-43 | PD-39 | PA-20 | 58 | 0.3 | B | A |
| Example 40 | M-44 | PD-40 | PA-21 | 58 | 0.3 | B | A |
| Example 41 | M-45 | PD-41 | PA-22 | 58 | 0.3 | B | A |
| Example 42 | M-46 | PD-42 | PA-23 | 58 | 0.3 | B | A |
| Example 43 | M-47 | PD-43 | PA-24 | 58 | 0.3 | A | A |
| Example 44 | M-48 | PD-44 | PA-25 | 58 | 0.3 | A | A |
| Example 45 | M-49 | PD-45 | PA-13 | 58 | 0.3 | B | A |
| Example 46 | M-50 | PD-46 | PA-13 | 58 | 0.3 | B | A |
| Example 47 | M-51 | PD-47 | PA-24 | 58 | 0.3 | A | A |
| Example 48 | M-52 | PD-48 | PB-1 | 58 | 0.3 | A | A |
| Example 49 | M-53 | PD-49 | PB-1 | 58 | 0.3 | A | A |
| Example 50 | M-54 | PD-50 | PB-2 | 58 | 0.3 | B | A |
| Example 51 | M-55 | PD-51 | PB-2 | 58 | 0.3 | B | A |
| Example 52 | M-56 | PD-52 | PB-2 | 58 | 0.3 | B | A |
| Example 53 | M-57 | PD-53 | PB-2 | 58 | 0.3 | B | A |
| Example 54 | M-58 | PD-54 | PB-2 | 58 | 0.3 | B | A |
| Example 55 | M-59 | PD-55 | PB-2 | 58 | 0.3 | B | A |
| Example 56 | M-60 | PD-56 | PB-2 | 58 | 0.3 | B | A |
| Example 57 | M-61 | PD-57 | PB-2 | 58 | 0.3 | B | A |
| Comparative Example 1 | M-22 | PD-20 | PA-1 | 58 | 0.3 | D | B |
| Comparative Example 2 | M-23 | PD-21 | PB-1 | 58 | 0.3 | D | C |
| Comparative Example 3 | M-24 | PD-22 | PA-10 | 58 | 0.3 | D | A |
| Comparative Example 4 | M-25 | PD-23 | PB-9 | 58 | 0.3 | D | A |

From the results described in Table 5, it was understood that the curable compositions of Examples 1 to 25 and 32 to 57 containing a resin containing a curable group, a colorant, a polymerization inhibitor, and a polymerization initiator had the effects of the present invention. In contrast, the curable compositions of Comparative Examples 1 to 4 did not have the effects of the present invention.

The curable composition of Example 1, in which the content of the ethylenically unsaturated group in the resin was 0.1 to 3.0 mmol/g, had patterning properties better than those of curable compositions of Example 22 and Example 23.

The curable composition of Example 3, in which the resin contained a structural unit containing a polymer chain and the polymer chain contained two or more kinds of structural units GF, had patterning properties better than those of the curable composition of Example 25.

The curable composition of Example 1, in which the content of the polymerization inhibitor in the curable composition was 0.05% to 0.5% by mass, had patterning properties better than those of the curable compositions of Example 20 and Example 21.

As is evident from the results described in Table 5, the effects of the present invention were better in the curable composition of Example 36 containing the resin containing a curable group which contained the structural unit B represented by Formula (B1-2), than in the curable composition of Example 33.

As is evident from the results described in Table 5, the curable composition of Example 32 containing TEMPO (free radical-based polymerization inhibitor) had patterning properties better than those of the curable compositions of Example 45 and Example 46.

Example 58 to Example 105: Preparation of Curable Compositions M-62 to M-109

Curable compositions M-62 to M-109 were prepared by the same method as that in Example 1, except that the type of the colorant dispersion was changed as described in Table 5-1.

By using the obtained curable compositions a cured film (light blocking film) was prepared by the same method as that described above, and the patterning properties thereof were evaluated. The results are shown in Table 5-1.

[Evaluation 3: Adhesiveness]

The adhesiveness of the curable compositions M-62 to M-109 was evaluated by the following method.

First, a silicon wafer was coated with CT-4000 (manufactured by FUJIFILM Electronic Materials Co., Ltd.) by a spin coating method such that the film thickness became 0.1 µm. Then, by using a hot plate, the wafer was heated for 1 hour at 220° C., thereby forming an underlayer. The silicon wafer with an underlayer was coated with each of the curable compositions M-62 to M-109 by a spin coating method, and then heated for 2 minutes at 100° C. by using a hot plate, thereby obtaining a curable composition layer having a film thickness described in the following table.

By using an i-line stepper, FPA-3000iS+ [manufactured by Canon Inc.], the curable composition layer was irradiated (exposed) in an exposure amount of 400 mJ/cm² (irradiation time: 0.5 seconds) through a mask comprising a 20 μm linear opening pattern (width: 20 μm, length: 4 mm).

By using a 0.3% by mass aqueous solution of tetramethylammonium hydroxide, the curable composition layer having undergone exposure was subjected to puddle development for 60 seconds at 23° C. Then, the wafer was rinsed with water by means of spin shower and then washed with pure water. Thereafter, the water droplets were shaken off by using high-pressure air, and the silicon wafer was left to dry naturally. Subsequently, by using a hot plate, post-baking was performed for 300 seconds at 220° C., thereby forming a pattern. The obtained pattern was observed using an optical microscope, and by counting the number of patterns firmly adhering to the wafer among all the patterns, the adhesiveness was evaluated. The evaluation was performed based on the following standards. The results are shown in Table 5-1.

AA: all the patterns firmly adhere to the wafer.

A: The proportion of the patterns firmly adhere to the wafer in all the patterns was equal to or higher than 95% and less than 100,%.

B: The proportion of the patterns firmly adhere to the wafer in all the patterns was equal to or higher than 90% and less than 95%.

C: The proportion of the patterns firmly adhere to the wafer in all the patterns was less than 90%.

[Evaluation 4: Developability]

The developed portion (portion of the substrate from which the curable composition layer was removed by development) of the pattern-like cured film prepared by the method described in the section of the adhesiveness testing was observed using a scanning electron microscope (SEM). Based on whether or not a residue was found to remain in the image, the developability was evaluated. The evaluation was performed based on the following standards. The results are shown in Table 5-1.

AA: no residue was observed.

A: substantially no residue was observed.

B: a small amount of residues were observed, but the level is unproblematic for practical use.

C: Residues remained.

TABLE 20

| Table 5-1-1 | Curable composition | Colorant dispersion | Resin | Content of colorant (% by mass) | D/P | Patterning properties | Adhesiveness | Developability |
|---|---|---|---|---|---|---|---|---|
| Example 58 | M-62 | PD-58 | PA-26 | 58 | 0.3 | B | A | AA |
| Example 59 | M-63 | PD-59 | PA-27 | 58 | 0.3 | B | B | AA |
| Example 60 | M-64 | PD-60 | PA-28 | 58 | 0.3 | B | A | AA |
| Example 61 | M-65 | PD-61 | PA-29 | 58 | 0.3 | B | A | AA |
| Example 62 | M-66 | PD-62 | PA-30 | 58 | 0.3 | B | A | AA |
| Example 63 | M-67 | PD-63 | PA-31 | 58 | 0.3 | B | A | AA |
| Example 64 | M-68 | PD-64 | PA-32 | 58 | 0.3 | C | A | B |
| Example 65 | M-69 | PD-65 | PA-33 | 58 | 0.3 | C | A | B |
| Example 66 | M-70 | PD-66 | PA-34 | 58 | 0.3 | B | A | A |
| Example 67 | M-71 | PD-67 | PA-35 | 58 | 0.3 | B | A | AA |
| Example 68 | M-72 | PD-68 | PA-36 | 58 | 0.3 | B | A | AA |
| Example 69 | M-73 | PD-69 | PA-37 | 58 | 0.3 | B | A | AA |
| Example 70 | M-74 | PD-70 | PA-38 | 58 | 0.3 | B | A | AA |
| Example 71 | M-75 | PD-71 | PA-39 | 58 | 0.3 | B | A | AA |
| Example 72 | M-76 | PD-72 | PB-10 | 58 | 0.3 | A | A | B |
| Example 73 | M-77 | PD-73 | PB-11 | 58 | 0.3 | A | A | B |
| Example 74 | M-78 | PD-74 | PB-12 | 58 | 0.3 | B | A | A |
| Example 75 | M-79 | PD-75 | PH-1 | 58 | 0.3 | B | A | AA |
| Example 76 | M-80 | PD-76 | PI-1 | 58 | 0.3 | A | A | B |
| Example 77 | M-81 | PD-77 | PI-2 | 58 | 0.3 | A | A | B |
| Example 78 | M-82 | PD-78 | PI-3 | 58 | 0.3 | A | B | B |
| Example 79 | M-83 | PD-79 | PI-4 | 58 | 0.3 | A | A | B |
| Example 80 | M-84 | PD-80 | PI-5 | 58 | 0.3 | A | A | B |
| Example 81 | M-85 | PD-81 | PI-6 | 58 | 0.3 | A | A | B |
| Example 82 | M-86 | PD-82 | PI-7 | 58 | 0.3 | C | A | B |
| Example 83 | M-87 | PD-83 | PI-8 | 58 | 0.3 | B | A | A |

TABLE 21

| Table 5-1-2 | Curable composition | Colorant dispersion | Resin | Content of colorant (% by mass) | D/P | Patterning properties | Adhesiveness | Developability |
|---|---|---|---|---|---|---|---|---|
| Example 84 | M-88 | PD-84 | PI-9 | 58 | 0.3 | B | A | AA |
| Example 85 | M-89 | PD-85 | PJ-1 | 58 | 0.3 | A | A | B |
| Example 86 | M-90 | PD-86 | PJ-2 | 58 | 0.3 | C | A | B |
| Example 87 | M-91 | PD-87 | PJ-3 | 58 | 0.3 | B | A | A |
| Example 88 | M-92 | PD-88 | PJ-4 | 58 | 0.3 | B | A | AA |
| Example 89 | M-93 | PD-89 | PK-1 | 58 | 0.3 | A | A | B |
| Example 90 | M-94 | PD-90 | PK-2 | 58 | 0.3 | C | A | B |
| Example 91 | M-95 | PD-91 | PK-3 | 58 | 0.3 | B | A | B |
| Example 92 | M-96 | PD-92 | PK-4 | 58 | 0.3 | C | A | B |

TABLE 21-continued

| Table 5-1-2 | Curable composition | Colorant dispersion | Resin | Content of colorant (% by mass) | D/P | Patterning properties | Adhesiveness | Developability |
|---|---|---|---|---|---|---|---|---|
| Example 93 | M-97 | PD-93 | PK-5 | 58 | 0.3 | B | A | A |
| Example 94 | M-98 | PD-94 | PL-1 | 58 | 0.3 | A | A | B |
| Example 95 | M-99 | PD-95 | PL-2 | 58 | 0.3 | C | A | B |
| Example 96 | M-100 | PD-96 | PL-3 | 58 | 0.3 | B | A | A |
| Example 97 | M-101 | PD-97 | PL-4 | 58 | 0.3 | B | A | AA |
| Example 98 | M-102 | PD-98 | PL-5 | 58 | 0.3 | C | B | B |
| Example 99 | M-103 | PD-99 | PM-1 | 58 | 0.3 | A | A | B |
| Example 100 | M-104 | PD-100 | PN-1 | 58 | 0.3 | A | A | B |
| Example 101 | M-105 | PD-101 | PN-2 | 58 | 0.3 | B | A | B |
| Example 102 | M-106 | PD-102 | PO-1 | 58 | 0.3 | C | A | B |
| Example 103 | M-107 | PD-103 | PA-40 | 58 | 0.3 | C | A | B |
| Example 104 | M-108 | PD-104 | PA-41 | 58 | 0.3 | C | B | B |
| Example 105 | M-109 | PD-105 | PP-1 | 58 | 0.3 | C | A | B |
| Comparative Example 3 | M-24 | PD-22 | PA-10 | 58 | 0.3 | D | C | B |
| Comparative Example 4 | M-25 | PD-23 | PB-9 | 58 | 0.3 | D | C | B |

As is evident from the results shown in Table 5-1, the curable compositions of Examples 58 to 105 had adhesiveness better than that of Comparative Examples 3 and 4 which did not have a curable group. Furthermore, Examples 58, 60, and 63 having an acryloyloxy group, Example 61 having an acrylamide group, and Example 62 having a styryl group had adhesiveness better than that of Example 59 having a methacryloxy group.

The curable compositions of Examples 66 to 69 in which the resin contained the structural unit A represented by Formula A0 had developability better than that of the curable compositions of Examples 64 and 65.

The curable compositions of Examples 67 to 69, in which the resin contained the structural unit A represented by Formula A0 and $Z^5$ was an alkyl group or an aryl group that may contain a substituent having 6 or more carbon atoms, had developability better than that of the curable composition of Example 66 in which $Z^5$ was a methyl group.

The curable composition of Example 91, in which the structural unit B of the resin was represented by B1-2, each of Lc and Le was an alkylene group, and Ld was an ester group, had patterning properties better than those of the curable compositions of Example 90 and Example 92.

Example 1a: Preparation of Color Filter

An 8-inch glass wafer, on which hexamethyldisilazane had been sprayed in advance, was coated with the following resin composition R-1 for red (R) (corresponding to a curable composition) such that the dry film thickness became 1.0 µm, thereby forming a photocurable red resin composition layer. Then, the glass wafer was placed on a hot plate with a temperature of 100° C., and the red resin composition layer was heated for 180 seconds (pre-baking). Thereafter, by using an i-line stepper exposure machine FPA-3000i5+ (manufactured by Canon Inc.), the red resin composition layer was subjected to exposure through a 1.0 µm×1.0 µm diamond pattern mask at a wavelength of 365 nm. Subsequently, the glass wafer was placed on a horizontally rotating table of a spin shower development machine (DW-30 model, manufactured by Chemitronics, Co., Ltd.) and subjected to puddle development for 180 seconds at 23° C. by using a 40% diluted solution of CD-2000 (manufactured by FUJIFILM Electronic Materials Co., Ltd.), thereby forming a red colored pattern (corresponding to a cured film) on the glass wafer. The glass wafer on which the red colored pattern was formed was fixed to the horizontally rotating table by a vacuum chuck method. The glass wafer was rotated at a rotation speed of 50 rotation per minute (rpm) by a rotation device, and in this state, pure water was supplied in the form of shower from a spray nozzle from above the rotation center such that the red colored pattern was rinsed. Then, the red colored pattern was spray-dried. The entirety of the glass wafer comprising the red colored pattern was then additionally subjected to exposure by using an ultraviolet photoresist curing device (MMA-802-HC-552: manufactured by USHIO, INC.), thereby forming a red colored pattern on the glass wafer. Furthermore, in the same manner as that described above, a color filter was prepared which had a green (G) colored pattern using the following resin composition G-1 for green (G) and a blue (B) colored pattern using the following resin composition B-1 for blue (B). The prepared color filter was a high-quality color filter having excellent patterning properties.

<Preparation of Resin Composition R-1 for Red (R), Resin Composition G-1 for Green (G), and Resin Composition B-1 for Blue (B)>

A resin composition R-1 for red (R), a resin composition G-1 for green (G), and a resin composition B-1 for blue (B) were prepared in the same manner as that used for preparing the curable composition M-1, except that the following pigments were used instead of titanium black.

Pigment for red (R): C. I. Pigment Red 254
Pigment for green (G): 70/30 [mass ratio] mixture of C. I. Pigment Green 36/C. I. Pigment Yellow 219
Pigment for blue (B): 70/30 [mass ratio] mixture of C. I. Pigment Blue 15:6/C. I. Pigment Violet 23

Example 1a-2: Preparation of Color Filter-2

A color filter was prepared in the same manner as in Example 1a, except that instead of the resin composition R-1 for red (R), the resin composition G-1 for green (G), and the resin composition B-1 for blue (B), a resin composition R-2 for red (R), a resin composition G-2 for green (G), and a resin composition B-2 for blue (B) shown below were used. The prepared color filter was a high-quality color filter having excellent patterning properties similarly to Example 1a.

<Preparation of Resin Composition R-2 for Red (R), Resin Composition G-2 for Green (G), and Resin Composition B-2 for Blue (B)>

The resin composition R-2 for red (R), the resin composition G-2 for green (G), and the resin composition B-2 for blue (B) were prepared in the same manner as that used for preparing the curable composition M-1, except that the following pigments were used instead of titanium black.

Pigment for red (R): 70/30 (mass ratio) mixture of C. I. Pigment Red 254/C. I. Pigment Yellow 139

Pigment for green (G): 60/40 (mass ratio) mixture of C. I. Pigment Green 36/C. I. Pigment Yellow 150

Pigment for blue (B): 80/20 (mass ratio) mixture of C. I. Pigment Blue 15:6/C. I. Pigment Violet 23

Example 1b: Preparation of Solid-State Imaging Element

On a silicon wafer, a pattern-like light blocking film (black matrix) was formed in the same manner as in Example 1. In the exposure step, a photo mask having a 0.1 mm×0.1 mm alignment pattern was used.

Then, on the light blocking film, by using a curable composition for lens (composition obtained by adding 1% by mass of an aryl sulfonium salt derivative (SP-172 manufactured by ADEKA CORPORATION) to an alicyclic epoxy resin (EHPE-3150 manufactured by Daicel Corporation)), a curable resin layer was formed. By using a quartz mold having a lens shape, the shape was transferred to the curable resin layer, and the curable resin layer was cured using a high-pressure mercury lamp in an exposure amount of 400 mJ/cm², thereby preparing a wafer level lens array having a plurality of wafer level lenses.

The prepared wafer level lens array was cut, and a lens module was prepared using the obtained wafer level lenses. Then, an imaging element and a sensor substrate were mounted on the lens module, thereby preparing a solid-state imaging element. The obtained solid-state imaging element had high resolution and excellent color separability.

Example 1c: Preparation of Infrared Sensor

By using five kinds of pigments shown below instead of titanium black, colorant dispersions were obtained in the same manner as that used for preparing PD-8. The colorant dispersions obtained as above were mixed together, and other components were added thereto such that the composition shown in Table 16 was established, thereby obtaining a curable composition IR.

Pyrrolopyrrole pigment: the following structure (synthesized by the method described in JP2009-263614A) (infrared absorber having maximal absorption in range of wavelength of 800 to 900 nm)

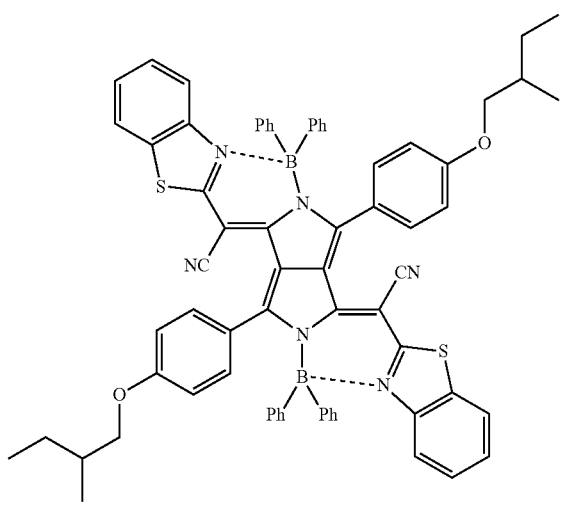

PR254: Pigment Red 254
PB15:6: Pigment Blue 15:6
PY 139: Pigment Yellow 139
PV23: Pigment Violet 23

TABLE 22

Table 16 Curable composition IR

| | Component | Content (% by mass) |
|---|---|---|
| Colorant dispersion | Pyrrolopyrrole pigment dispersion | 22.7 |
| | PR 254 dispersion | 11.3 |
| | PB15:6 dispersion | 22.7 |
| | PY139 dispersion | 10.3 |
| | PV23 dispersion | 6.9 |
| Resin containing curable group | Resin 1 | Balance |
| Polymerizable compound | KAYARAD DPHA (manufactured by Nippon Kayaku Co., Ltd.) | 1.4 |
| Polymerization initiator | Irgacure OXE02 (manufactured by BASF Japan Ltd.) | 0.9 |
| Organic solvent | PGMEA | 19.9 |

A silicon wafer was coated with the curable composition IR by using a spin coater such that the dry film thickness became 1.5 μm, thereby forming a curable composition layer IR. The silicon wafer was placed on a hot plate with a temperature of 100° C. and the curable composition layer IR was heated for 120 seconds (pre-baking).

Then, by using an i-line stepper exposure device FPA-3000i5+(manufactured by Canon Inc.) and a photo mask by which a 1.4 μm×1.4 μm square pixel pattern is formed, an exposure amount optimal for resolving the square pixel pattern was determined by increasing the exposure amount to 50 to 750 mJ/cm² by 50 mJ/cm², and exposure was performed in the optimal exposure amount.

Thereafter, the silicon wafer comprising the curable composition layer IR having undergone exposure was placed on a horizontally rotating table of a spin shower development machine, and puddle development was performed for 60 seconds at 23° C. by using CD-2060 (aqueous solution of tetramethylammonium hydroxide, manufactured by FUJIFILM Electronic Materials Co., Ltd.), thereby forming a colored pattern (corresponding to a cured film) on the silicon wafer.

The silicon wafer on which the colored pattern was formed was rinsed with pure water and then spray-dried. Furthermore, the silicon wafer was placed on a hot plate with a temperature of 200° C., and the colored pattern was heated for 300 seconds (post-baking). In this way, as a color filter for an infrared sensor, a silicon wafer including a high-resolution colored pattern was obtained.

The obtained color filter was incorporated into the solid-state imaging element according to a known method (corresponding to an infrared sensor). In an environment with low illuminance (0.001 Lux), the obtained solid-state imaging element was irradiated with light from a near-infrared light emitting diode (LED) light source having an emission wavelength of 940 nm such that an image was captured, and the image performance was evaluated by comparison. In a state where a small amount of noise resulting from visible rays occurred, the color filter transmitted infrared having an emission wavelength of 940 nm, and the spectral recognition of the color filter was excellent.

Example 1d: Curable Composition Containing White Pigment

By using a titanium oxide pigment instead of titanium black, a colorant dispersion was prepared (the composition of the colorant dispersion is as follows. Titanium oxide: 38.5 parts by mass, PA-1: 11.5 parts by mass, TEMPO: 0.1 parts by mass, PGMEA: balance). By using the obtained colorant dispersion, components were mixed together such that the composition described in Table 16-2 was established, thereby obtaining a curable composition

TABLE 23

Table 16-2 Curable composition W

| | Component | Content (% by mass) |
|---|---|---|
| Colorant dispersion | | 52.0 |
| Resin containing curable group | Resin 1 | Balance |
| Polymerizable compound | KAYARAD DPHA (manufactured by Nippon Kayaku Co., Ltd.) | 9.3 |
| Polymerization initiator | Irgacure OXE02 (manufactured by BASF Japan Ltd.) | 2.8 |
| Organic solvent | PGMEA | 23.9 |

The patterning properties of the curable composition W were evaluated. As a result, it was understood that the curable composition W also had excellent patterning properties.

Preparation Example 24: Preparation of Colorant Dispersion PD-28

A colorant dispersion was prepared by the same method as that in Preparation Example 1, except that the content of the polymerization inhibitor (TEMPO) was changed to 0.01 parts by mass, and the temporal stability thereof was evaluated. The temporal stability (evaluated as C) was about the same as that of Preparation Example C2.

Example 26: Preparation of Curable Composition M-30

A curable composition was prepared by the same method as that in Example 1, except that the colorant dispersion PD-28 was used instead of the colorant dispersion PD-1, and the patterning properties thereof were evaluated. As a result, the patterning properties of the curable composition M-30 were evaluated as C.

Preparation Example 25: Preparation of Colorant Dispersion PD-29

Temporal stability was evaluated by the same method as that in Preparation Example 1, except that the content of the polymerization inhibitor (TEMPO) was changed to 2.0 parts by mass. As a result, the temporal stability was excellent (evaluated as AA) as in Preparation Example 1.

Example 27: Preparation of Curable Composition M-31

A curable composition was prepared by the same method as that in Example 1, except that the colorant dispersion PD-29 was used instead of the colorant dispersion PD-1, and the patterning properties thereof were evaluated. As a result, the patterning properties of the curable composition was evaluated as B. Presumably, this is because curing was inhibited by the polymerization initiator.

Preparation Example 26: Preparation of Colorant Dispersion PD-30

Colorant: titanium black (TiON, average primary particle diameter: 20 nm): 45 parts by mass Dispersant (resin PB-1) (solid content: 20% by mass): 20 parts by mass (solid contents: 4 parts by mass)

Polymerization inhibitor: 0.1 parts by mass

Solvent: PGMEA

By mixing together the above components, a mixture was obtained.

Then, by using a beads mill (zirconia beads: 0.3 mm), the mixture was dispersed, thereby obtaining a colorant dispersion PD-30.

The temporal stability of the colorant dispersion PD-30 was evaluated by the same method as that in Preparation Example 1. As a result, the temporal stability was evaluated as C.

Example 28: Preparation of Curable Composition M-32

Colorant dispersion PD-30, resin PB-1: 5.2% by mass

Titanium black (TiON): 58% by mass

TEMPO: 0.12% by mass

Resin containing curable group, resin 1: balance

Polymerizable compound KAYARAD DPHA: 0.2% by mass

Polymerization initiator Irgacure OXE02: 2.8% by mass

The above components were mixed together by the same method as that in Example 1, thereby preparing a curable composition M-32 (D/P: 0.089). By using the prepared curable composition M-32, the patterning properties and the light blocking properties were evaluated by the same method as that in Example 1. As a result, the patterning properties were evaluated as C, and the light blocking properties were evaluated as B.

Preparation Example 27: Preparation of Colorant Dispersion PD-31

Colorant: titanium black (TiON, average primary particle diameter: 20 nm): 45 parts by mass Dispersant (resin PB-1) (solid contents: 20% by mass): 135 parts by mass (solid contents: 27.0 parts by mass)

Polymerization inhibitor: 0.15 parts by mass

Solvent: PGMEA

By mixing together the above components, a mixture was obtained.

Then, by using a beads mill (zirconia beads: 0.3 mm), the mixture was dispersed, thereby obtaining a colorant dispersion PD-31.

The temporal stability of the colorant dispersion PD-31 was evaluated by the same method as that in Preparation Example 1. As a result, the temporal stability was evaluated as B.

Example 29: Preparation of Curable Composition M-33

Colorant dispersion PD-31, resin PB-1: 34.8% by mass

Titanium black (liON): 58% by mass

TEMPO: 0.19% by mass

Resin containing curable group, resin 1: balance

Polymerizable compound KAYARAD DPHA: 2.2% by mass

Polymerization initiator Irgacure OXE02: 3.8% by mass

The above components were mixed together by the same method as that in Example 1, thereby preparing a curable composition M-33 (D/P: 0.6). By using the prepared curable composition M-33, the patterning properties and the light blocking properties were evaluated by the same method as that in Example 1. As a result, the patterning properties were evaluated as C, and the light blocking properties were evaluated as C.

The curable composition of Example 1 in which D/P was within a range of 0.1 to 0.5 formed a cured film having patterning properties and light blocking properties better than those of the curable compositions of Example 28 and Example 29.

Example 30: Preparation of Curable Composition M-34

Colorant dispersion PD-1, resin PB-1: 17.4% by mass

Titanium black (TiON): 58% by mass

TEMPO: 0.13% by mass

Resin containing curable group, resin 1: balance

Polymerizable compound KAYARAD DPHA: 16.5% by mass

Polymerization initiator Irgacure OXE02: 1.4% by mass

The above components were mixed together by the same method as that in Example 1, thereby preparing a curable composition M-34 (content of polymerization initiator/content of resin=0.08). By using the prepared curable composition M-34, the patterning properties and the light blocking properties were evaluated by the same method as that in Example 1. As a result, the patterning properties were evaluated as C, and the light blocking properties were evaluated as B.

Example 31: Preparation of Curable Composition M-35

Colorant dispersion PD-1, resin PB-1: 13.5% by mass

Titanium black (TiON): 45% by mass

TEMPO: 0.1% by mass

Resin containing curable group, resin 1: balance

Polymerizable compound KAYARAD DPHA: 7.5% by mass

Polymerization initiator Irgacure OXE02: 29.7% by mass

The above components were mixed together by the same method as that in Example 1, thereby preparing a curable composition M-35 (content of polymerization initiator/content of resin=2.2). By using the prepared curable composition M-35, the patterning properties and the light blocking properties were evaluated by the same method as that in Example 1. As a result, the patterning properties were evaluated as B, and the light blocking properties were evaluated as C.

The curable composition of Example 1 in which polymerization initiator/resin was within a range of 0.1 to 2.0 formed a cured film having patterning properties and light blocking properties better than those of the curable compositions of Example 30 and Example 31.

Example 1-A: Preparation (2) of Cured Film (Light Blocking Film)

By using the curable composition of Example 1, a light blocking film was prepared by the same method as that described in [preparation (1) of cured film (light blocking film)], except that the film thickness of the curable composition layer having undergone heating in [Curable composition layer-forming step] was set to be 1.0 μm. The prepared light blocking film was heated for 1 hour in an oven with a temperature of 220° C., thereby performing a post-baking step. Then, the patterning properties thereof were evaluated by the same method as that described above. The results are shown in Table 6.

Example 1-B: Preparation (3) of Cured Film (Light Blocking Film)

A light blocking film was prepared by the same method as that described in [preparation (1) of cured film (light blocking film)], except that, in Example 1-B, the film thickness of the curable composition layer having undergone heating in [Curable composition layer-forming step] was set to be 3.0 μm. The patterning properties of the prepared light blocking film were evaluated by the same method as that described above. The results are shown in Table 6.

TABLE 24

Table 6

| | Resin | Curable composition | Patterning properties |
|---|---|---|---|
| Example 1-A | PB-1 | M-1 | A |
| Example 1-B | PB-1 | M-1 | A |

From the results shown in Table 6, it was understood that in a case where the film thickness of the curable composition layer having undergone a heating treatment is within a range of 1.0 to 3.0 μm, excellent patterning properties is obtained.

Preparation Example 1-C: Preparation of Colorant Dispersion PD-1-C

A colorant dispersion PD-1-C was obtained in the same manner as in Preparation Example 1, except that titanium nitride (TiN) was used instead of titanium black (TiON).

The temporal stability of the colorant dispersion was evaluated by the same method as that described above. The results are shown in Table 7.

Example 1-C: Preparation of Curable Composition M-1-C

A curable composition M-1-C was obtained in the same manner as in Example 1, except that the colorant dispersion PD-1-C was used instead of the colorant dispersion PD-1.

The light blocking properties and the patterning properties of the curable composition M-1-C were evaluated by the same method as that described above. The results are shown in Table 7.

TABLE 25

| Table 7 | Resin | Colorant dispersion | Curable composition | Temporal stability | Light blocking properties | Patterning properties |
|---|---|---|---|---|---|---|
| Preparation Example 1-C | PB-1 | PD-1-C | — | AA | — | — |
| Example 1-C | PB-1 | PD-1-C | M-1-C | — | A | A |
| Preparation Example 1 | PB-1 | PD-1 | — | AA | — | — |
| Example 1 | PB-1 | PD-1 | M-1 | — | A | A |

From the results shown in Table 7, it was understood that Preparation Example 1-C and Example 1-C in which titanium nitride was used as a colorant had excellent temporal stability, excellent light blocking properties, and excellent patterning properties similarly to Preparation Example 1 and Example 1.

Preparation Example 1-D: Preparation of Colorant Dispersion PD-1-D

A colorant dispersion PD-1-D was obtained in the same manner as in Preparation Example 1, except that niobium nitride was used instead of titanium black.

The temporal stability of the colorant dispersion was evaluated by the same method as that described above. The results are shown in Table 8.

Example 1-D: Preparation of Curable Composition M-1-D

A curable composition M-1-D was obtained in the same manner as in Example 1, except that the colorant dispersion PD-1-D was used instead of the colorant dispersion PD-1.

The light blocking properties and the patterning properties of the curable composition M-1-D were evaluated by the same method as that described above. The results are shown in Table 8.

TABLE 26

| Table 8 | Resin | Colorant dispersion | Curable composition | Temporal stability | Light blocking properties | Patterning properties |
|---|---|---|---|---|---|---|
| Preparation Example 1-D | PB-1 | PD-1-D | — | AA | — | — |
| Example 1-D | PB-1 | PD-1-D | M-1-D | — | A | A |
| Preparation Example 1 | PB-1 | PD-1 | — | AA | — | — |
| Example 1 | PB-1 | PD-1 | M-1 | — | A | A |

From the results shown in Table 8, it was understood that Preparation Example 1-D and Example 1-D in which niobium nitride was used as a colorant also had excellent temporal stability, excellent light blocking properties, and excellent patterning properties similarly to Preparation Example 1 and Example 1.

Preparation Example 1-E: Preparation of Colorant Dispersion PD-1-E

A colorant dispersion PD-1-E was obtained in the same manner as in Preparation Example 1, except that niobium oxynitride was used instead of titanium black.

The temporal stability of the colorant dispersion was evaluated by the same method as that described above. The results are shown in Table 9.

Example 1-E: Preparation of Curable Composition M-1-E

A curable composition M-1-E was obtained in the same manner as in Example 1, except that the colorant dispersion PD-1-E was used instead of the colorant dispersion PD-1.

The light blocking properties and the patterning properties of the curable composition M-1-E were evaluated by the same method as that described above. The results are shown in Table 9.

TABLE 27

| Table 9 | Resin | Colorant dispersion | Curable composition | Temporal stability | Light blocking properties | Patterning properties |
|---|---|---|---|---|---|---|
| Preparation Example 1-E | PB-1 | PD-1-E | — | AA | — | — |
| Example 1-E | PB-1 | PD-1-E | M-1-E | — | A | A |
| Preparation Example 1 | PB-1 | PD-1 | — | AA | — | — |
| Example 1 | PB-1 | PD-1 | M-1 | — | A | A |

From the results shown in Table 9, it was understood that Preparation Example 1-E and Example 1-E in which niobium oxynitride was used as a colorant had excellent temporal stability, excellent light blocking properties, and excellent patterning properties similarly to Preparation Example 1 and Example 1.

Preparation Example 1-F: Preparation of Colorant Dispersion PD-1-F

A colorant dispersion PD-1-F was obtained in the same manner as in Preparation Example 1, except that zirconium nitride was used instead of titanium black.

The temporal stability of the colorant dispersion was evaluated by the same method as that described above. The results are shown in Table 10.

Example 1-F: Preparation of Curable Composition M-1-F

A curable composition M-1-F was obtained in the same manner as in Example 1, except that the colorant dispersion PD-1-F was used instead of the colorant dispersion PD-1.

The light blocking properties and the patterning properties of the curable composition M-1-F were evaluated by the same method as that described above. The results are shown in Table 10.

TABLE 28

| Table 10 | Resin | Colorant dispersion | Curable composition | Temporal stability | Light blocking properties | Patterning properties |
|---|---|---|---|---|---|---|
| Preparation Example 1-F | PB-1 | PD-1-F | — | AA | — | — |
| Example 1-F | PB-1 | PD-1-F | M-1-F | — | A | A |
| Preparation Example 1 | PB-1 | PD-1 | — | AA | — | — |
| Example 1 | PB-1 | PD-1 | M-1 | — | A | A |

From the results shown in Table 10, it was understood that Preparation Example 1-F and Example 1-F in which zirconium nitride was used as a colorant had excellent temporal stability, excellent light blocking properties, and excellent patterning properties similarly to Preparation Example 1 and Example 1.

Preparation Example 1-G: Preparation of Colorant Dispersion PD-1-G

A colorant dispersion PD-1-G was obtained in the same manner as in Preparation Example 1, except that zirconium oxynitride was used instead of titanium black.

The temporal stability of the colorant dispersion was evaluated by the same method as that described above. The results are shown in Table 11.

Example 1-G: Preparation of Curable Composition M-1-G

A curable composition M-1-G was obtained in the same manner as in Example 1, except that the colorant dispersion PD-1-G was used instead of the colorant dispersion PD-1.

The light blocking properties and the patterning properties of the curable composition M-1-G were evaluated by the same method as that described above. The results are shown in Table 11.

TABLE 29

| Table 11 | Resin | Colorant dispersion | Curable composition | Temporal stability | Light blocking properties | Patterning properties |
|---|---|---|---|---|---|---|
| Preparation Example 1-G | PB-1 | PD-1-G | — | AA | — | — |
| Example 1-G | PB-1 | PD-1-G | M-1-G | — | A | A |
| Preparation Example 1 | PB-1 | PD-1 | — | AA | — | — |
| Example 1 | PB-1 | PD-1 | M-1 | — | A | A |

From the results shown in Table 11, it was understood that Preparation Example 1-G and Example 1-G in which zirconium oxynitride was used as a colorant had excellent temporal stability, excellent light blocking properties, and excellent patterning properties similarly to Preparation Example 1 and Example 1.

Example 1-H

A curable composition M-1-H was prepared by the same method as that in Example 1, except that KAYARAD DPHA (dipentaerythritol hexaacrylate, manufactured by Nippon Kayaku Co., Ltd.) (10.0 parts by mass) and PET-30 (pentaerythritol triacrylate, manufactured by Nippon Kayaku Co., Ltd.) (8.5 parts by mass) were used as polymerizable compounds.

By using the obtained curable composition M-1-H, the light blocking properties and the patterning properties of the cured film were evaluated by the same method as that in preparation (2) of cured film (light blocking film). The film thickness of the curable composition layer having undergone a heating treatment in [curable composition layer-forming step] was 1.8 μm. The results are shown in Table 12.

TABLE 30

| Table 12 | | | | | |
|---|---|---|---|---|---|
| | Resin | Colorant dispersion | Curable composition | Light blocking properties | Patterning properties |
| Example 1-H | PB-1 | PD-1 | M-1-H | A | A |
| Example 1 | PB-1 | PD-1 | M-1 | A | A |

From the results shown in Table 12, it was understood that Example 1-H, in which KAYARAD DPHA (dipentaerythritol hexaacrylate, manufactured by Nippon Kayaku Co., Ltd.) (10.0 parts by mass) and PET-30 (pentaerythritol triacrylate, manufactured by Nippon Kayaku Co., Ltd.) (8.5 parts by mass) were used as polymerizable compounds, had excellent light blocking properties and excellent patterning properties similarly to Example 1.

Example 1-I

A curable composition M-1-I was prepared by the same method as that in Example 1, except that a compound represented by the following formula was used as a polymerization initiator.

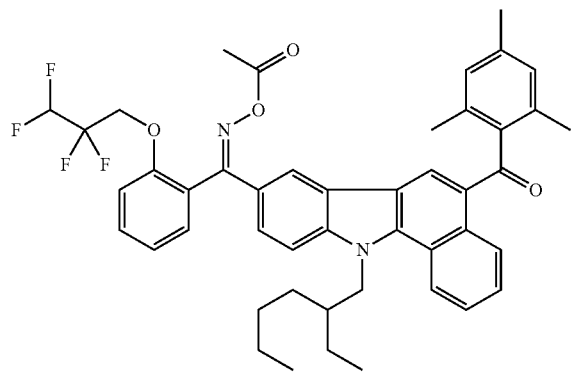 [SMILES: CCCCC(CC)Cn1c2ccc(/C(=N\OC(C)=O)c3ccccc3OCC(F)(F)C(F)F)cc2c2cc(C(=O)c3c(C)cc(C)cc3C)c3ccccc3c21]

By using the obtained curable composition M-1-I, the light blocking properties and the patterning properties of the cured film were evaluated by the same method as that in preparation (2) of cured film (light blocking film). The film thickness of the curable composition layer having undergone a heating treatment in [curable composition layer-forming step] was 1.8 μm. The results are shown in Table 13.

TABLE 31

Table 13

| | Resin | Colorant dispersion | Curable composition | Light blocking properties | Patterning properties |
|---|---|---|---|---|---|
| Example 1-I | PB-1 | PD-1 | M-1-I | A | A |
| Example 1 | PB-1 | PD-1 | M-1 | A | A |

From the results shown in Table 13, it was understood that Example 1-I, in which the compound represented by the above formula was used as a polymerization initiator, had excellent light blocking properties and excellent patterning properties similarly to Example 1.

Example 1-J

A curable composition M-1-J was prepared by the same method as that in Example 1, except that ADEKA ARKLS NCI-831 (manufactured by ADEKA CORPORATION) was used as a polymerization initiator.

By using the obtained curable composition M-1-J, the light blocking properties and the patterning properties of the cured film were evaluated by the same method as that in preparation (2) of cured film (light blocking film). The film thickness of the curable composition layer having undergone a heating treatment in [curable composition layer-forming step] was 1.8 µm. The results are shown in Table 14.

TABLE 32

Table 14

| | Resin | Colorant dispersion | Curable composition | Light blocking properties | Patterning properties |
|---|---|---|---|---|---|
| Example 1-J | PB-1 | PD-1 | M-1-J | A | A |
| Example 1 | PB-1 | PD-1 | M-1 | A | A |

From the results shown in Table 14, it was understood that Example 1-J, in which ADEKA ARKLS NCI-831 (manufactured by ADEKA CORPORATION) was used as a polymerization initiator, had excellent light blocking properties and excellent patterning properties similarly to Example 1.

Example 1-K

A curable composition M-1-K was prepared by the same method as that in Example 1, except that a compound represented by the following formula was used as a polymerization initiator.

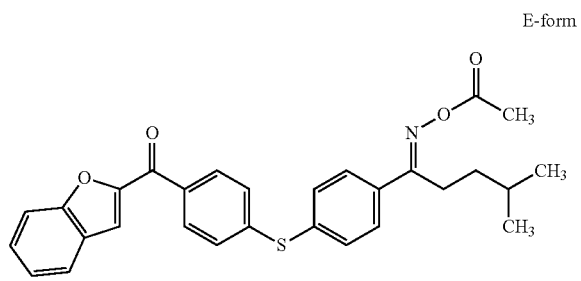 [SMILES: CC(=O)O/N=C(\CCC(C)C)c1ccc(Sc2ccc(C(=O)c3cc4ccccc4o3)cc2)cc1]

E-form

By using the obtained curable composition M-1-K the light blocking properties and the patterning properties of the cured film were evaluated by the same method as that in preparation (2) of cured film (light blocking film). The film thickness of the curable composition layer having undergone a heating treatment in [curable composition layer-forming step] was 1.8 µm. The results are shown in Table 15.

TABLE 33

Table 15

| | Resin | Colorant dispersion | Curable composition | Light blocking properties | Patterning properties |
|---|---|---|---|---|---|
| Example 1-K | PB-1 | PD-1 | M-1-K | A | A |
| Example 1 | PB-1 | PD-1 | M-1 | A | A |

From the results shown in Table 15, it was understood that Example 1-K, the compound represented by the above formula was used as a polymerization initiator, had excellent light blocking properties and excellent patterning properties similarly to Example 1.

Preparation Example 1-L: Preparation of Colorant Dispersion PD-1-L

A colorant dispersion PD-1-L was obtained in the same manner as in Preparation Example 1, except that titanium black and carbon black (trade name: "COLOR BLACK S170", manufactured by Degussa AG, average primary particle diameter: 17 nm, BET specific surface area: 200 $m^2/g$, carbon black manufactured by gas black method) were used instead of titanium black, and mass ratio of solid contents thereof was set to be 7:3.

The temporal stability of the colorant dispersion was evaluated by the same method as that described above. As a result, the same effects as those in Example 1 were obtained.

Example 1-L: Preparation of Curable Composition M-1-L

A curable composition M-1- was obtained in the same manner as in Example 1, except that the colorant dispersion PD-1-L was used instead of the colorant dispersion PD-1.

The light blocking properties and the patterning properties of the curable composition M-1-L were evaluated by the same method as that described above. As a result, the same effects as those in Example 1 were obtained.

From the above results, it was understood that even in a case where carbon black is used in combination as a colorant, a colorant dispersion having excellent temporal stability is obtained, and a curable composition which makes it possible to obtain a cured film having excellent light blocking properties and excellent patterning properties is obtained.

A colorant dispersion was created in the same manner as in Example 1, except that the polymerization inhibitor was changed to N-nitrosophenyl hydroxyl amine aluminum salt (manufactured by Wako Pure Chemical Industries, Ltd., corresponding to a free radical-based polymerization inhibitor) from TEMPO. Furthermore, a curable composition M-1-M was obtained.

The light blocking properties and the patterning properties of the curable composition M-1-M were evaluated by the same method as that described above. As a result, the same effects as those in Example 1 were obtained.

A colorant dispersion was created in the same manner as in Example 1, except that the polymerization inhibitor was changed to a mixture of 4-hydroxy-2,2,6,6-tetramethylpiperidin-1-oxyl (H-TEMPO) and 4-oxo-2,2,6,6-tetramethylpiperidin-1-oxyl (OXO-TEMPO) (1:1 in terms of mass ratio, both the H-TEMPO and OXO-TEMPO are free radical-based polymerization inhibitors, corresponding to hindered amine compound) from TEMPO. Furthermore, a curable composition M-1-N was obtained.

The light blocking properties and the patterning properties of the curable composition M-1-N were evaluated by the same method as that described above. As a result, the same effects as those in Example 1 were obtained. In addition, the colorant dispersion used for creating the curable composition M-1-N was left to stand for 3 days in a constant-temperature environment with a temperature of 45° C. and for 14 days in the same environment, and then compared with the colorant dispersion used in Example 1 in terms of the viscosity change. As a result, after the curable composition M-1-N was left to stand for 3 days, no difference was found between the compositions, but after the composition M-1-N was left to stand for 14 days, it was found that the change in viscosity is smaller in the composition M-1-N.

Preparation Example 1-M: Preparation of Colorant Dispersion PD-1-M

A colorant dispersion PD-1-M was obtained in the same manner as in Preparation Example 1, except that the solvent was changed to cyclopentanone from PGMEA.

The temporal stability of the colorant dispersion PD-1-M was evaluated by the same method as that in Preparation Example 1. As a result, the temporal stability was evaluated as AA.

Example 1-M: Preparation of Curable Composition M-1-M

A curable composition M-1-M was obtained in the same manner as in Example 1, except that the colorant dispersion PD-1-M was used instead of the colorant dispersion PD-1.

The light blocking properties and the patterning properties of the curable composition M-1-M were evaluated by the same method as that described above. As a result, the same effects as those in Example 1 were obtained.

Example 104-O1

A curable composition M-108-O1 was prepared by the same method as that in Example 104, except that KAYARAD DPHA (8.25% by mass, solid contents) and OGSOL EA-0300 (manufactured by Osaka Gas Chemicals Co., Ltd., 8.25% by mass, solid contents) were used instead of 16.5% by mass (solid contents) of KAYARAD DPHA. The makeup of the curable composition M-108-O1 is shown in the following Table 4-1 (Table 4-1-1).

TABLE 34

Table 4-1-1 Curable composition M-108-01

| Component | | | Solid contents (% by mass) |
|---|---|---|---|
| Colorant dispersion PD-104 | Resin containing curable group | Resin PA-41 | 17.4 |

TABLE 34-continued

Table 4-1-1 Curable composition M-108-01

| | Component | | Solid contents (% by mass) |
|---|---|---|---|
| | Colorant | Titanium black (TiON) | 58.0 |
| | Polymerization inhibitor | TEMPO | 0.13 |
| Resin containing curable group | | Resin 1 | Balance |
| Polymerizable compound | | KAYARAD DPHA (manufactured by Nippon Kayaku Co., Ltd.) | 8.25 |
| Polymerizable compound | | OGSOL EA-0300 (manufactured by Osaka Gas Chemicals Co., Ltd.) | 8.25 |
| Polymerization initiator | | Irgacure OXE02 (manufactured by BASF Japan Ltd.) | 4.8 |

Example 104-O21

A curable composition M-108-O2 was prepared by the same method as that in Example 104, except that 16.5% by mass (solid contents) of OGSOL EA-0300 was used instead of 16.5% by mass (solid contents) of KAYARAD DPHA. The makeup of the curable composition M-108-O2 is shown in the following Table 4-1 (Table 4-1-2).

TABLE 35

Table 4-1-2 Curable composition M-108-02

| | Component | | Solid contents (% by mass) |
|---|---|---|---|
| Colorant dispersion PD-104 | Resin containing curable group | Resin PA-41 | 17.4 |
| | Colorant | Titanium black (TiON) | 58.0 |
| | Polymerization inhibitor | TEMPO | 0.13 |
| Resin containing curable group | | Resin 1 | Balance |
| Polymerizable compound | | OGSOL EA-0300 (manufactured by Osaka Gas Chemicals Co., Ltd.) | 16.5 |
| Polymerization initiator | | Irgacure OXE02 (manufactured by BASF Japan Ltd.) | 4.8 |

Example 104-O3

A curable composition M-108-03 was prepared by the same method as that in Example 104, except that KAYARAD DPHA (8.25% by mass, solid contents) and GSOL EA-0200 (manufactured by Osaka Gas Chemicals Co., Ltd., 8.25% by mass, solid contents) were used instead of 16.5% by mass (solid contents). The makeup of the curable composition M-108-O3 is shown in the following Table 4-1 (Table 4-1-3).

TABLE 36

Table 4-1-3 Curable composition M-108-03

| Component | | | Solid contents (% by mass) |
|---|---|---|---|
| Colorant dispersion PD-104 | Resin containing curable group | Resin PA-41 | 17.4 |
| | Colorant | Titanium black (TiON) | 58.0 |
| | Polymerization inhibitor | TEMPO | 0.13 |
| Resin containing curable group | | Resin 1 | Balance |
| Polymerizable compound | | KAYARAD DPHA (manufactured by Nippon Kayaku Co., Ltd.) | 8.25 |
| Polymerizable compound | | OGSOL EA-0200 (manufactured by Osaka Gas Chemicals Co., Ltd.) | 8.25 |
| Polymerization initiator | | Irgacure OXE02 (manufactured by BASF Japan Ltd.) | 4.8 |

Example 104-O4

A curable composition M-108-O4 was prepared by the same method as that in Example 104, except that 16.5% by mass (solid contents) of OGSOL EA-0200 was used instead of 16.5% by mass (solid contents) of KAYARAD DPHA. The makeup of the curable composition M-108-O4 is shown in the following Table 4-1 (Table 4-1-4).

TABLE 37

Table 4-1-4 Curable composition M-108-04

| Component | | | Solid contents (% by mass) |
|---|---|---|---|
| Colorant dispersion PD-104 | Resin containing curable group | Resin PA-41 | 17.4 |
| | Colorant | Titanium black (TiON) | 58.0 |
| | Polymerization inhibitor | TEMPO | 0.13 |
| Resin containing curable group | | Resin 1 | Balance |
| Polymerizable compound | | OGSOL EA-0200 (manufactured by Osaka Gas Chemicals Co., Ltd.) | 16.5 |
| Polymerization initiator | | Irgacure OXE02 (manufactured by BASF Japan Ltd.) | 4.8 |

The patterning properties, the adhesiveness, and the developability of the curable compositions M-104-O1 to M-104-O4 were evaluated by the same method as that described above. The results are shown in Table 17. From the results shown in Table 17, it was understood that the curable composition of Example 104-O1, which contained a polymerizable compound containing a cardo-skeleton, had the effects of the present invention that were better than those of the curable composition of Example 104.

Furthermore, the curable composition of Example 104-O2, which contained a polymerizable compound containing a cardo-skeleton but did not contain a polymerizable compound not containing a cardo-skeleton, had developability better than that of the curable composition of curable composition of Example 104-O1.

TABLE 38

| Table 17 | Resin | Colorant dispersion | Curable composition | Patterning properties | Adhesiveness | Developability |
|---|---|---|---|---|---|---|
| Example 104 | PA-41 | PD-104 | M-108 | C | B | B |
| Example 104-O1 | PA-41 | PD-104-O1 | M-108-O1 | A | A | A |
| Example 104-O2 | PA-41 | PD-104-O2 | M-108-O2 | A | B | AA |
| Example 104-O3 | PA-41 | PD-104-O3 | M-108-O3 | B | A | B |
| Example 104-O4 | PA-41 | PD-104-O4 | M-108-O4 | B | B | A |

Examples 106 and 107

A curable composition M-110 was prepared in the same manner as in Example 103, except that a copolymer (Mw: 10,000, acid value: 70 mgKOH/g) of M5300/benzyl methactrylate (40/60 (% by mass)) was used instead of the resin 1.

Furthermore, a curable composition M-111 was prepared in the same manner as in Example 103, except that the resin PN-2 was used instead of the resin 1. The makeup of each of M-110 and M-111 is shown in Table 18-1 and Table 18-2.

The patterning properties, the adhesiveness, and the developability of the above curable compositions were evaluated by the same method as that described above. The results are shown in Table 19.

As a result, the curable composition of Example 107, in which a resin containing a curable group was used in combination (the specific resin and the curable resin 2), exhibited better adhesiveness with respect to a substrate compared to the curable composition of Example 106.

TABLE 39

Table 18-1 Curable composition M-110

| Component | | | Solid contents (% by mass) |
|---|---|---|---|
| Colorant dispersion PD-103 | Resin containing curable group | Resin PA-40 | 17.9 |
| | Colorant | Titanium black (TiON) | 58.0 |
| | Polymerization inhibitor | TEMPO | 0.10 |
| Another resin (alkali-soluble resin not containing curable group) | | 40/60 (% by mass) copolymer of M5300/benzyl methacrylate Mw10000, acid value 70 mgKOH/g | 9.0 |
| Polymerizable compound | | KAYARAD DPHA (manufactured by Nippon Kayaku Co., Ltd.) | 9.0 |
| Polymerization initiator | | Irgacure OXE02 (manufactured by BASF Japan Ltd.) | 6.0 |

TABLE 40

Table 18-2 Curable composition M-111

| Component | | | Solid contents (% by mass) |
|---|---|---|---|
| Colorant dispersion PD-103 | Resin containing curable group | Resin PA-40 | 17.9 |
| | Colorant | Titanium black (TiON) | 58.0 |
| | Polymerization inhibitor | TEMPO | 0.10 |
| Resin containing curable group | | PN-2 Mw10,000, acid value 70 mgKOH/g, C=C value 1.2 mmol/g | 9.0 |
| Polymerizable compound | | KAYARAD DPHA (manufactured by Nippon Kayaku Co., Ltd.) | 9.0 |
| Polymerization initiator | | Irgacure OXE02 (manufactured by BASF Japan Ltd) | 6.0 |

TABLE 41

| Table 19 | Resin | Colorant dispersion | Curable composition | Patterning properties | Adhesiveness | Developability |
|---|---|---|---|---|---|---|
| Example 106 | PA-40 | PD-110 | M-110 | C | A | B |
| Example 107 | PA-40 | PD-111 | M-111 | C | AA | B |

Examples 58cr to 101cr

Colored curable compositions for preparing a color filter were prepared in the same manner as in Examples 58 to 107 and 104-O1 to O4, except that each of the following pigments was used instead of titanium black.

<Pigment>

Pigment for red (R): Red 1 and Red 2 described below
(Red 1) 80/20 [mass ratio] mixture of C. I. Pigment Red 254/C. I. Pigment Yellow 139
(Red 2) 80/20 [mass ratio] mixture of C. I. Pigment Red 264/C. I. Pigment Yellow 139

Pigment for green (G): Green 1 and Green 2 described below (Green 1) 80/20 [mass ratio] mixture of C. I. Pigment Green 58/C. I. Pigment Yellow 185
(Green 2) 80/20 [mass ratio] mixture of C. I. Pigment Green 36/C. I. Pigment Yellow 219

Pigment for blue (B): Blue 1 shown below
(Blue 1) pigment for blue (B): 80/20 [mass ratio] mixture of C. I. Pigment Blue 15:6/C. I. Pigment Violet 23

By using each of the above pigments, colored curable compositions were prepared.

That is, by the same method as that used for preparing the curable composition of Example 58, a colored curable composition was prepared in which Red 1 was used instead of titanium black; a colored curable composition was prepared in which Red 2 was used instead of titanium black; a colored curable composition was prepared in which Green 1 was used instead of titanium black; a colored curable composition was prepared in which Green 2 was used instead of titanium black: and a colored curable composition was prepared in which Blue 1 was used instead of titanium black. The patterning properties, the adhesiveness, and the developability of the colored curable compositions were evaluated by the same method as that described above. The results were the same as the results obtained in Example 58.

The colored curable compositions, in which each of the above pigments was used instead of titanium black used in Example 59 to Example 101, were evaluated in the manner described above. The evaluation results of the colored curable compositions were the same as the evaluation results of the curable compositions of Example 59 to Example 101.

EXPLANATION OF REFERENCES

100: solid-state imaging device
101: solid-state imaging element
102: imaging portion
103: cover glass
104: spacer
105: laminated substrate
106: chip substrate
107: circuit substrate
108: electrode pad
109: external connection terminal
110: penetration electrode
111: lens layer
112: lens material
113: support
114, 115: light blocking film
201: light-receiving element
202: color filter
203: microlens
204: substrate
205b: blue pixel
205r: red pixel
205g: green pixel
205bm: black matrix
206: p-well layer
207: reading gate portion
208: vertical electric charge transfer path
209: element separation region
210: gate insulating film
211: vertical electric charge transfer electrode
212: light blocking film
213, 214: insulating film
215: planarization film
300: infrared sensor
310: solid-state imaging element
311: infrared absorption filter
312: color filter
313: infrared transmission filter
314: resin film
315: microlens
316: planarization film

What is claimed is:

1. A curable composition comprising:
a resin containing a curable group;
a colorant;
a polymerization inhibitor; and
a polymerization initiator,
  wherein the resin contains a structural unit A containing a polymer chain and a structural unit B containing an acidic group,
the polymer chain contains a structural unit GF, and
the structural unit GF is selected from the group consisting of a structural unit formed of an oxyalkylene carbonyl group and a structural unit formed of an oxyalkylene group.

2. The curable composition according to claim 1,
wherein the resin contains an ethylenically unsaturated group,
a content of the ethylenically unsaturated group in the resin is 0.1 to 3.0 mmol/g, and
the ethylenically unsaturated group is a (meth)acryloyl group or a styryl group.

3. The curable composition according to claim 1,
wherein the polymer chain contains two or more kinds of the structural units GF.

4. The curable composition according to claim 1,
wherein the resin further contains at least one kind of structural unit selected from the group consisting of Formula A1 and Formula B1,

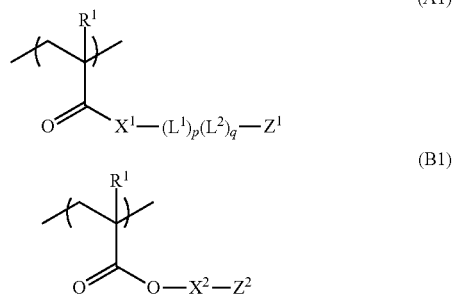

in Formula A1, $R^1$ represents a hydrogen atom or an alkyl group, $X^1$ represents a single bond or a divalent linking group, $L^1$ and $L^2$ represent the structural units GF that may be the same as or different from each other, p and q each represent an integer equal to or greater than 1, and $Z^1$ represents a group containing the curable group,
in Formula B1, $R^1$ represents a hydrogen atom or an alkyl group, $X^2$ represents a single bond or a divalent linking group, and $Z^2$ represents a group containing the curable group.

5. The curable composition according to claim 1,
wherein the resin further contains at least one kind of structural unit selected from the group consisting of Formula A1 and Formula B2,

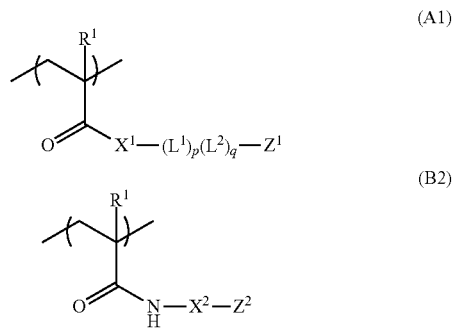

in Formula A1, $R^1$ represents a hydrogen atom or an alkyl group, $X^1$ represents a single bond or a divalent linking group, $L^1$ and $L^2$ represent the structural units GF that may be the same as or different from each other, p and q each represent an integer equal to or greater than 1, and $Z^1$ represents a group containing the curable group,
in Formula B2, $R^1$ represents a hydrogen atom or an alkyl group, $X^2$ represents a single bond or a divalent linking group, and $Z^2$ represents a group containing the curable group.

6. The curable composition according to claim 1,
wherein the structural unit A is represented by Formula A0,

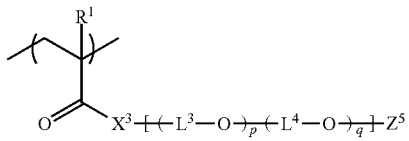

(A0)

in Formula A0, $R^1$ represents a hydrogen atom or an alkyl group, $X^3$ represents a single bond or a divalent linking group, p represents an integer equal to or greater than 1, q represents 0 or an integer equal to or greater than 1, $L^3$ and $L^4$ each independently represent a linear or branched cyclic alkyl group having 2 to 6 carbon atoms, and $Z^5$ represents a hydrogen atom or a monovalent organic group.

7. The curable composition according to claim 1,
wherein a mass ratio of an amount of the resin contained in the curable composition to an amount of the colorant contained in the curable composition is 0.1 to 0.5.

8. The curable composition according to claim 1,
wherein the colorant contains a black pigment; and
a content of the black pigment with respect to a total solid content of the curable composition is equal to or greater than 50% by mass.

9. The curable composition according to claim 8,
wherein the black pigment contains at least one kind of compound selected from the group consisting of titanium oxynitride, titanium nitride, niobium oxynitride, niobium nitride, zirconium oxynitride, and zirconium nitride.

10. The curable composition according to claim 1,
wherein the polymerization initiator contains a photopolymerization initiator, and
a mass ratio of an amount of the photopolymerization initiator contained in the curable composition to an amount of the resin contained in the curable composition is 0.1 to 2.0.

11. The curable composition according to claim 1,
wherein the polymerization inhibitor is a free radical-based polymerization inhibitor.

12. The curable composition according to claim 11,
wherein the free radical-based polymerization inhibitor is a hindered amine compound.

13. The curable composition according to claim 1, comprising:
two or more kinds of the polymerization inhibitors.

14. The curable composition according to claim 1,
wherein a total content of the polymerization inhibitors in the curable composition is 0.05% to 0.5% by mass.

15. The curable composition according to claim 1,
wherein in a cured film obtained by curing the curable composition, an optical density per film thickness of 1.0 μm is equal to or higher than 3.0 in a wavelength range of 400 to 1,100 nm.

16. The curable composition according to claim 1, further comprising:
a polymerizable compound containing a cardo-skeleton.

17. A manufacturing method of the curable composition according to claim 1, comprising:
a colorant dispersing step of mixing together the resin containing a curable group, the colorant, and the polymerization inhibitor so as to obtain a colorant dispersion; and
a mixing step of mixing together the colorant dispersion and the polymerization initiator so as to obtain the curable composition.

18. A cured film obtained by curing the curable composition according to claim 1.

19. A color filter comprising:
the cured film according to claim 18.

20. A solid-state imaging element comprising:
the cured film according to claim 18.

21. A solid-state imaging device comprising;
the solid-state imaging element according to claim 20.

22. An infrared sensor comprising:
the cured film according to claim 18.

23. A manufacturing method of a cured film, comprising:
a curable composition layer-forming step of forming a curable composition layer by using the curable composition according to claim 1;
an exposure step of performing exposure by irradiating the curable composition layer with actinic rays or radiation; and
a development step of developing the curable composition layer having undergone exposure so as to form a cured film.

24. The manufacturing method of a cured film according to claim 23, further comprising:
a heating step of heating the curable composition layer having undergone exposure between the exposure step and the development step.

* * * * *